(12) United States Patent  
Tsuchimoto et al.

(10) Patent No.: US 12,081,881 B2  
(45) Date of Patent: Sep. 3, 2024

(54) SENSOR AND CONTROL METHOD

(71) Applicant: SONY SEMICONDUCTOR SOLUTIONS CORPORATION, Kanagawa (JP)

(72) Inventors: Koya Tsuchimoto, Kanagawa (JP); Hayato Wakabayashi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/295,280

(22) PCT Filed: Nov. 14, 2019

(86) PCT No.: PCT/JP2019/044629  
§ 371 (c)(1),  
(2) Date: May 19, 2021

(87) PCT Pub. No.: WO2020/110743  
PCT Pub. Date: Jun. 4, 2020

(65) Prior Publication Data  
US 2024/0015412 A1   Jan. 11, 2024

(30) Foreign Application Priority Data  
Nov. 28, 2018   (JP) .................. 2018-221958

(51) Int. Cl.  
*H04N 25/47*  (2023.01)  
*H01L 27/146*  (2006.01)  
*H04N 25/78*  (2023.01)

(52) U.S. Cl.  
CPC ............. *H04N 25/47* (2023.01); *H04N 25/78* (2023.01); *H01L 27/14621* (2013.01); *H01L 27/14625* (2013.01)

(58) Field of Classification Search  
CPC .. H04N 25/47; H04N 25/78; H01L 27/14621; H01L 27/14625  
See application file for complete search history.

(56) References Cited

U.S. PATENT DOCUMENTS

2009/0310001 A1* 12/2009 Masuyama ............ H04N 25/75  
                                                           348/300  
2014/0354823 A1   12/2014 Kitchens et al.  
(Continued)

FOREIGN PATENT DOCUMENTS

| CN | 103676974 A | 3/2014 |
| CN | 105247445 A | 1/2016 |

(Continued)

OTHER PUBLICATIONS

International Search Report and Written Opinion of PCT Application No. PCT/JP2019/044629, issued on Feb. 18, 2020, 09 pages of ISRWO.

*Primary Examiner* — Sinh Tran  
*Assistant Examiner* — Zhenzhen Wu  
(74) *Attorney, Agent, or Firm* — CHIP LAW GROUP

(57) ABSTRACT

The present technology relates to a sensor and a control method that can flexibly detect an event that is a change in electric signals of pixels.

The sensor includes pixels that receive light and that perform photoelectric conversion to generate electric signals, and an event detecting unit that detects an event that is a change in the electric signals of the pixels. The sensor adjusts, for each of the pixels, a gain of the event detecting unit. The present technology can be applied to, for example, a sensor that detects an event that is a change in electric signals of pixels.

13 Claims, 45 Drawing Sheets

(56) References Cited

U.S. PATENT DOCUMENTS

| | | |
|---|---|---|
| 2016/0150165 A1 | 5/2016 | Grauer |
| 2016/0163752 A1* | 6/2016 | Sambongi ......... H01L 27/14643 |
| | | 348/222.1 |
| 2016/0187196 A1* | 6/2016 | Kim .......................... G01J 1/44 |
| | | 250/206.1 |
| 2018/0213170 A1 | 7/2018 | Segawa |
| 2019/0268532 A1 | 8/2019 | Iinuma |
| 2019/0273884 A1* | 9/2019 | Finateu ................. H04N 25/77 |
| 2019/0289230 A1* | 9/2019 | Berner .................. H04N 25/77 |
| 2020/0084403 A1* | 3/2020 | Suh ....................... H04N 25/47 |

FOREIGN PATENT DOCUMENTS

| | | |
|---|---|---|
| CN | 107957395 A | 4/2018 |
| CN | 108574809 A | 9/2018 |
| CN | 109328457 A | 2/2019 |
| EP | 3313064 A1 | 4/2018 |
| JP | 2009145307 A | 7/2009 |
| JP | 2010093744 A | 4/2010 |
| JP | 2010151702 A | 7/2010 |
| JP | 2016-534324 A | 11/2016 |
| JP | 2017-535999 A | 11/2017 |
| JP | 2018-022935 A | 2/2018 |
| KR | 20120069694 A | 6/2012 |
| KR | 10-2016-0015302 A | 2/2016 |
| KR | 10-2019-0029615 A | 3/2019 |
| WO | 2018/073379 A1 | 4/2018 |

\* cited by examiner

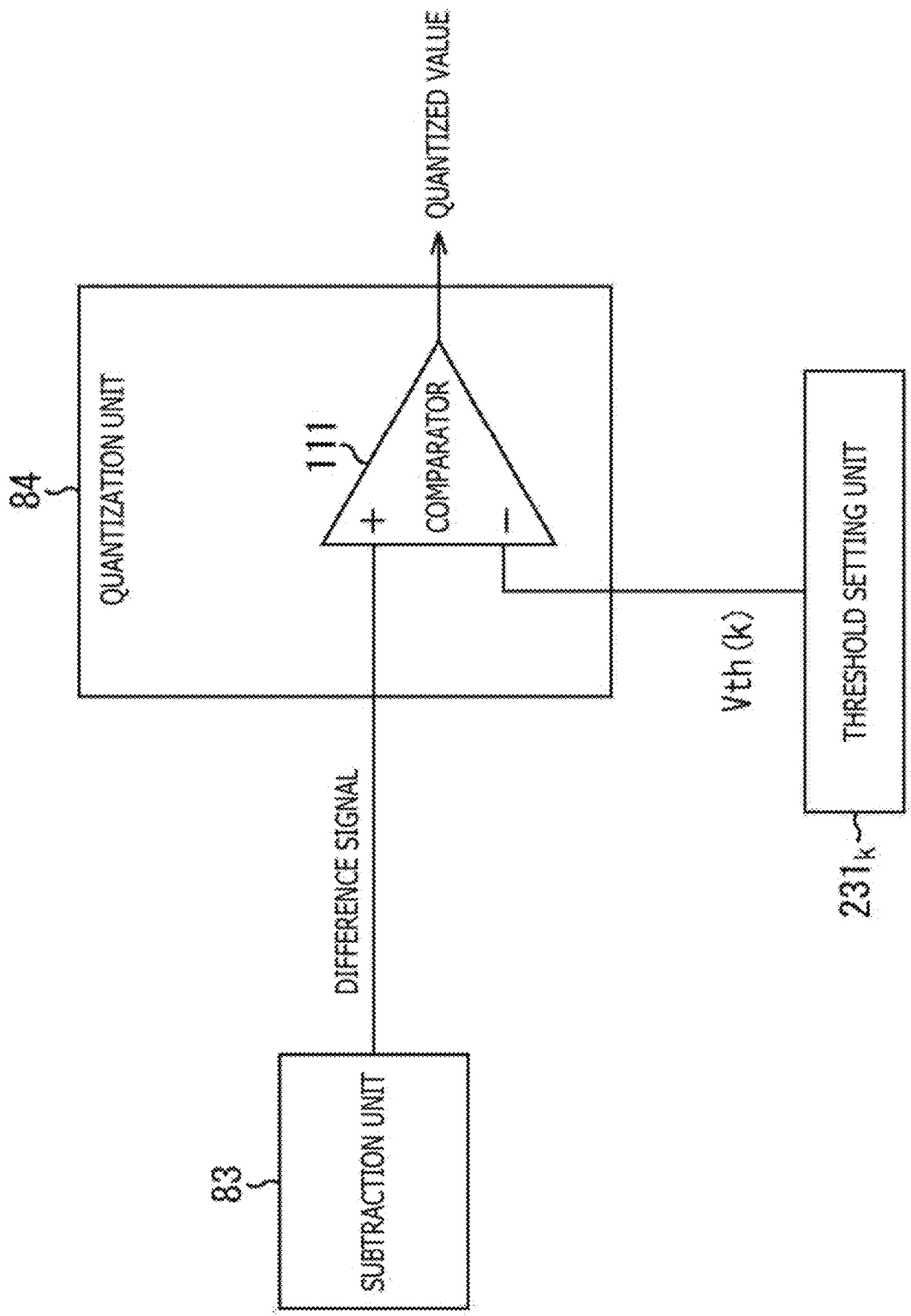

SENSOR AND CONTROL METHOD

CROSS REFERENCE TO RELATED APPLICATIONS

This application is a U.S. National Phase of International Patent Application No. PCT/JP2019/044629 filed on Nov. 14, 2019, which claims priority benefit of Japanese Patent Application No. JP 2018-221958 filed in the Japan Patent Office on Nov. 28, 2018. Each of the above-referenced applications is hereby incorporated herein by reference in its entirety.

TECHNICAL FIELD

The present technology relates to a sensor and a control method, and particularly, to a sensor and a control method that can flexibly detect an event that is a change in electric signals of pixels, for example.

BACKGROUND ART

There is proposed an image sensor that handles a luminance change of a pixel as an event and that outputs event data indicating the occurrence of the event in a case where the event occurs (for example, see PTL 1).

Here, an image sensor that performs imaging in synchronization with a vertical sync signal and that outputs frame data in a raster scan format can be referred to as a synchronous image sensor. On the other hand, an image sensor that outputs event data can be referred to as an asynchronous image sensor, because the image sensor reads, as needed, the pixels in which the event data is generated. The asynchronous image sensor is called, for example, a DVS (Dynamic Vision Sensor).

CITATION LIST

Patent Literature

[PTL 1]
JP 2017-535999T

SUMMARY

Technical Problem

Flexible detection of an event is requested for the DVS.
The present technology has been made in view of such circumstances and can flexibly detect an event.

Solution to Problem

The present technology provides a sensor including pixels that receive light and that perform photoelectric conversion to generate electric signals, an event detecting unit that detects an event that is a change in the electric signals of the pixels, and a gain adjustment mechanism that adjusts, for each of the pixels transmitted by the transmission mechanism, a gain of the event detecting unit.

The present technology provides a control method including a step of adjusting, for each of pixels, a gain of an event detecting unit of a sensor, the sensor including the pixels that receive light and that perform photoelectric conversion to generate electric signals, and the event detecting unit that detects an event that is a change in the electric signals of the pixels.

In the sensor and the control method of the present technology, an event that is a change in electric signals of pixels that receive light and that perform photoelectric conversion to generate the electric signals, is detected by the event detecting unit. The gain of the event detecting unit is adjusted for each of the pixels.

The sensor may be an independent apparatus or may be an internal block included in one apparatus. In addition, the sensor may be provided as a module or a semiconductor chip.

BRIEF DESCRIPTION OF DRAWINGS

FIG. 16 is a block diagram depicting a configuration example of the quantization unit 84.

DESCRIPTION OF EMBODIMENT

Hereinafter, although an embodiment of the present technology will be described, a sensor chip as an asynchronous image sensor to which the present technology can be applied will be described as a preliminary stage of the embodiment.

<Sensor Chip to which Present Technology can be Applied>

Figure 1:
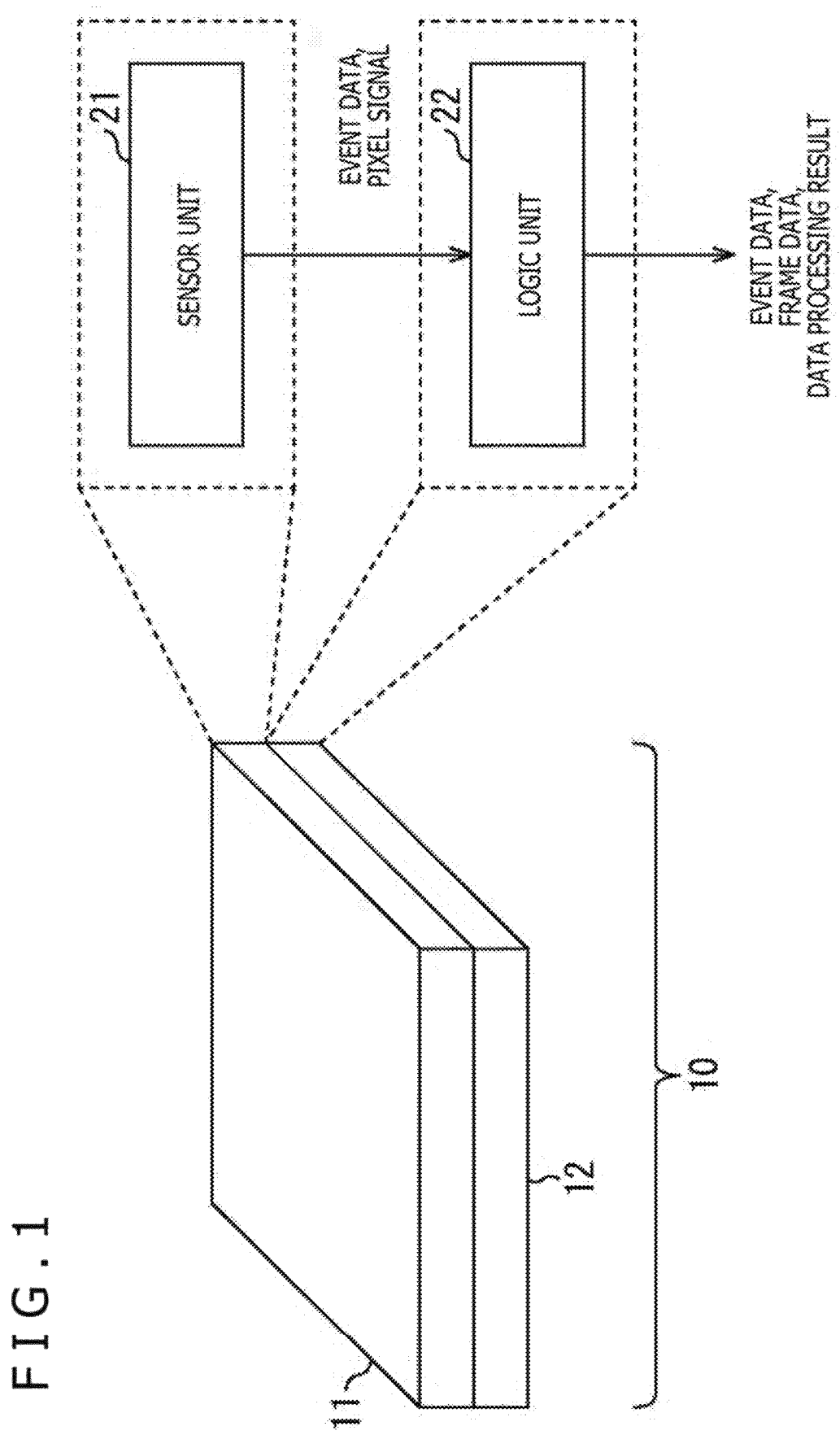
FIG. 1 is a diagram depicting a configuration example of a sensor chip to which the present technology can be applied.

FIG. 1 is a diagram depicting a configuration example of a sensor chip to which the present technology can be applied.

A sensor chip 10 is a semiconductor chip with one chip and includes a sensor die (substrate) 11 and a logic die 12 as a plurality of dies (substrates) laminated with each other. Incidentally, the sensor chip 10 can include one die or can include three or more dies laminated with one another.

In the sensor chip 10 of FIG. 1, the sensor die 11 includes a sensor unit 21 (circuit as a sensor unit 21), and the logic die 12 includes a logic unit 22. Incidentally, part of the sensor unit 21 can be included in the logic die 12. In addition, part of the logic unit 22 can be included in the sensor die 11.

The sensor unit 21 includes pixels that perform photoelectric conversion of incident light to generate electric signals. Then, the sensor unit 21 generates, for an event detecting unit 52 (FIG. 3), event data indicating an occurrence of an event that is a change in the electric signals of the pixels. The sensor unit 21 supplies the event data to the logic unit 22. That is, the sensor unit 21 performs imaging such that the pixels perform photoelectric conversion of the incident light to generate electric signals, and outputs the electric signals. The sensor unit 21 not only generates the event data indicating an occurrence of an event that is a change in the electric signals of the pixels, but also outputs imaging data (pixel signals) from a pixel signal generating unit 53 (FIG. 3) to the logic unit 22.

Here, a synchronous image sensor is an image sensor that performs imaging in synchronization with a vertical sync signal and that outputs frame data in a raster scan format. Since the sensor unit 21 does not operate in synchronization with the vertical sync signal in outputting the event data, it can be stated that the sensor unit 21 is asynchronous (asynchronous image sensor) in contrast to the synchronous image sensor.

Incidentally, as described above, the sensor unit 21 can generate and output the frame data in addition to the event data, similarly to the synchronous image sensor. Further, the sensor unit 21 can output, along with the event data, the electric signal of the pixel with an occurrence of an event, as a pixel signal that is a pixel value of the pixel of the frame data.

The logic unit 22 controls the sensor unit 21 as necessary. In addition, the logic unit 22 executes various kinds of data processing, such as data processing of generating frame data and image processing for the frame data generated according to the imaging data from the sensor unit 21 or the event data from the sensor unit 21, according to the event data from the sensor unit 21. The logic unit 22 outputs data processing results obtained by executing various kinds of data processing for the event data, the frame data, and the imaging data.

<Configuration Example of Sensor Unit 21>

Figure 2:
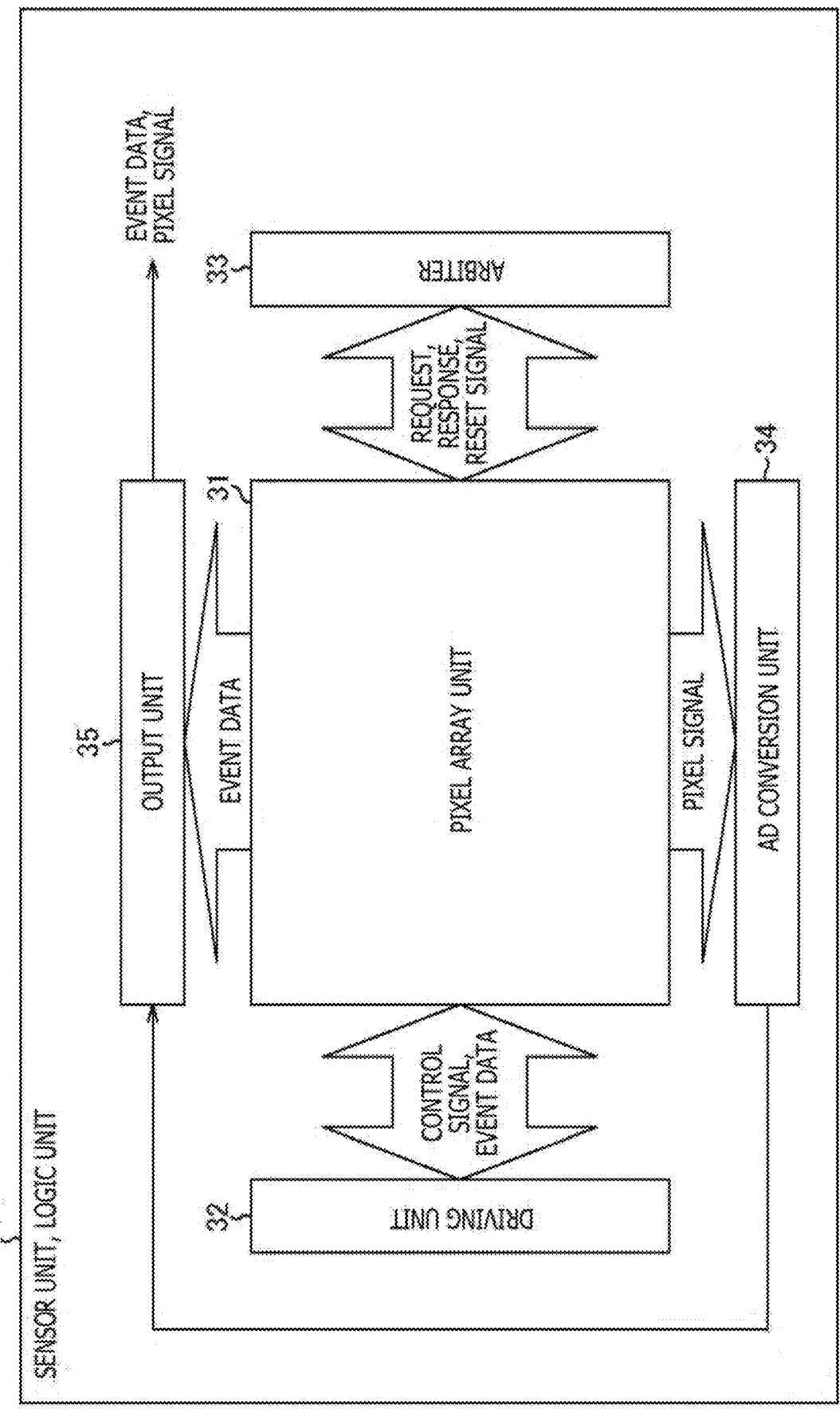
FIG. 2 is a block diagram depicting a configuration example of a sensor unit 21 and a logic unit 22.

FIG. 2 is a block diagram depicting a configuration example of the sensor unit 21 in FIG. 1.

The sensor unit 21 includes a pixel array unit 31, a driving unit 32, an arbiter 33, an AD (Analog to Digital) conversion unit 34, and an output unit 35.

The pixel array unit 31 includes a plurality of pixels 51 (FIG. 3) arranged in a two-dimensional grid. In a case where there is a change exceeding a predetermined threshold (including, as necessary, a change equal to or greater than a threshold) in a photocurrent as an electric signal generated by the photoelectric conversion of the pixel 51, the pixel array unit 31 detects the change in the photocurrent as an event. In a case where the pixel array unit 31 detects an event, the pixel array unit 31 outputs, to the arbiter 33, a request for outputting event data indicating the occurrence of the event. Further, in a case where the pixel array unit 31 receives, from the arbiter 33, a response indicating permission for outputting the event data, the pixel array unit 31 outputs the event data to the driving unit 32 and the output unit 35. Further, the pixel array unit 31 outputs, as a pixel signal, the electric signal of the pixel 51 with the detected event to the AD conversion unit 34 via the pixel signal generating unit 53.

The driving unit 32 supplies a control signal to the pixel array unit 31 to drive the pixel array unit 31. For example, the driving unit 32 drives the pixel 51 in which the event data is output from the pixel array unit 31, to supply (output) the pixel signal of the pixel 51 to the AD conversion unit 34.

The arbiter 33 sets a request for outputting the event data from the pixel array unit 31 and returns, to the pixel array unit 31, a response indicating permission or no permission for outputting the event data and a reset signal for resetting the event detection.

The AD conversion unit 34 includes, for example, a single-slope ADC (AD Converter) (not illustrated) in, for example, each column of pixel blocks 41 (FIG. 3) described later. In the AD conversion unit 34, the ADC of each column performs AD conversion of the pixel signals of the pixels 51 in the pixel blocks 41 of the column and supplies the pixel signals to the output unit 35. Incidentally, the AD conversion unit 34 can also perform CDS (Correlated Double Sampling) along with the AD conversion of the pixel signals.

The output unit 35 applies necessary processing to the pixel signals from the AD conversion unit 34 and the event data from the pixel array unit 31 and outputs the pixel signals and the event data from the logic unit 22.

Here, since the change in the photocurrent generated by the pixel 51 can also be perceived as a light amount change of the light entering the pixel 51, it can also be stated that the event is a light amount change of the pixel 51 (light amount change exceeding the threshold).

The event data indicating the occurrence of the event includes at least position information (coordinates or the like) indicating the position of the pixel block where there is a light amount change as an event. Additionally, the event data can include the polarity (positive or negative) of the light amount change.

As for the series of event data output from the pixel array unit 31 at the timing of the occurrence of the event, it can be stated that the event data implicitly includes time information indicating the time (relative time) of the occurrence of the event as long as the intervals between the event data at the time of the occurrence of the event are maintained. However, when the intervals between the event data at the time of the occurrence of the event are not maintained anymore due to, for example, storage of the event data in a memory, the time information implicitly included in the event data is lost. Therefore, before there is a situation where the intervals between the event data at the time of the occurrence of the event are not maintained anymore, the output unit 35 includes, in the event data, time information, such as a time stamp, indicating the time (relative time) of the occurrence of the event. The process of including the time information in the event data can be executed by any block other than the output unit 35 before the time information implicitly included in the event data is lost.

<Configuration Example of Pixel Array Unit 31>

Figure 3:
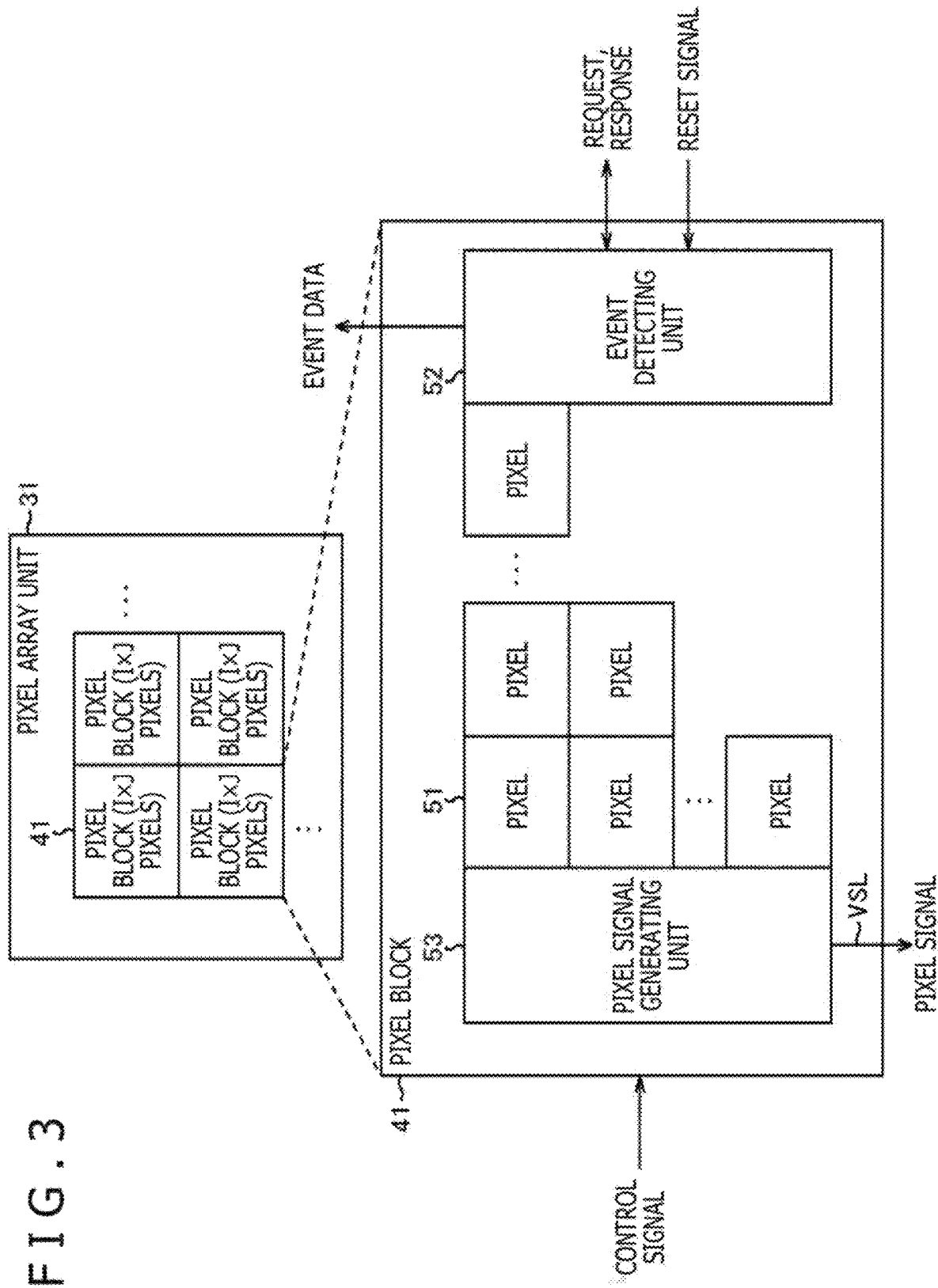
FIG. 3 is a block diagram depicting a configuration example of a pixel array unit 31.

FIG. 3 is a block diagram depicting a configuration example of the pixel array unit 31 in FIG. 2.

The pixel array unit 31 includes plural pixel blocks 41. Each of the pixel block 41 includes one or more I×J pixels 51 arranged in I rows×J columns (I and J are integers), the event detecting unit 52, and the pixel signal generating unit 53. The one or more pixels 51 in the pixel block 41 share the event detecting unit 52 and the pixel signal generating unit 53. In addition, a VSL (Vertical Signal Line) for connecting the pixel blocks 41 and the ADC of the AD conversion unit 34 is wired to each column of the pixel blocks 41.

The pixel 51 receives incident light from a subject and performs photoelectric conversion to generate a photocurrent as an electric signal. The pixel 51 supplies the photocurrent to the event detecting unit 52 according to the control of the driving unit 32.

The event detecting unit 52 detects, as an event, a change in the photocurrent from each pixel 51 exceeding a predetermined threshold according to the control of the driving unit 32. In a case where the event detecting unit 52 detects an event, the event detecting unit 52 supplies, to the arbiter 33 (FIG. 2), a request for outputting event data indicating the occurrence of the event. Further, once the event detecting unit 52 receives, from the arbiter 33, a response for permitting the output of the event data in response to the request, the event detecting unit 52 outputs the event data to the driving unit 32 and the output unit 35.

In the case where the event is detected by the event detecting unit 52, the pixel signal generating unit 53 generates, as a pixel signal, a photoelectrically converted voltage of the pixel 51 according to the control of the driving unit 32 and supplies the pixel signal to the AD conversion unit 34 via the VSL.

Here, the detection of the change in the photocurrent exceeding the predetermined threshold as an event can be perceived at the same time as detection of an event that there is no change in the photocurrent exceeding the predetermined threshold. The pixel signal generating unit 53 can generate the pixel signal in the case of the detection of the event that there is no change in the photocurrent exceeding the predetermined threshold, in addition to the case of the detection of the event that there is a change in the photocurrent exceeding the predetermined threshold.

<Configuration Example of Pixel Block 41>

Figure 4:
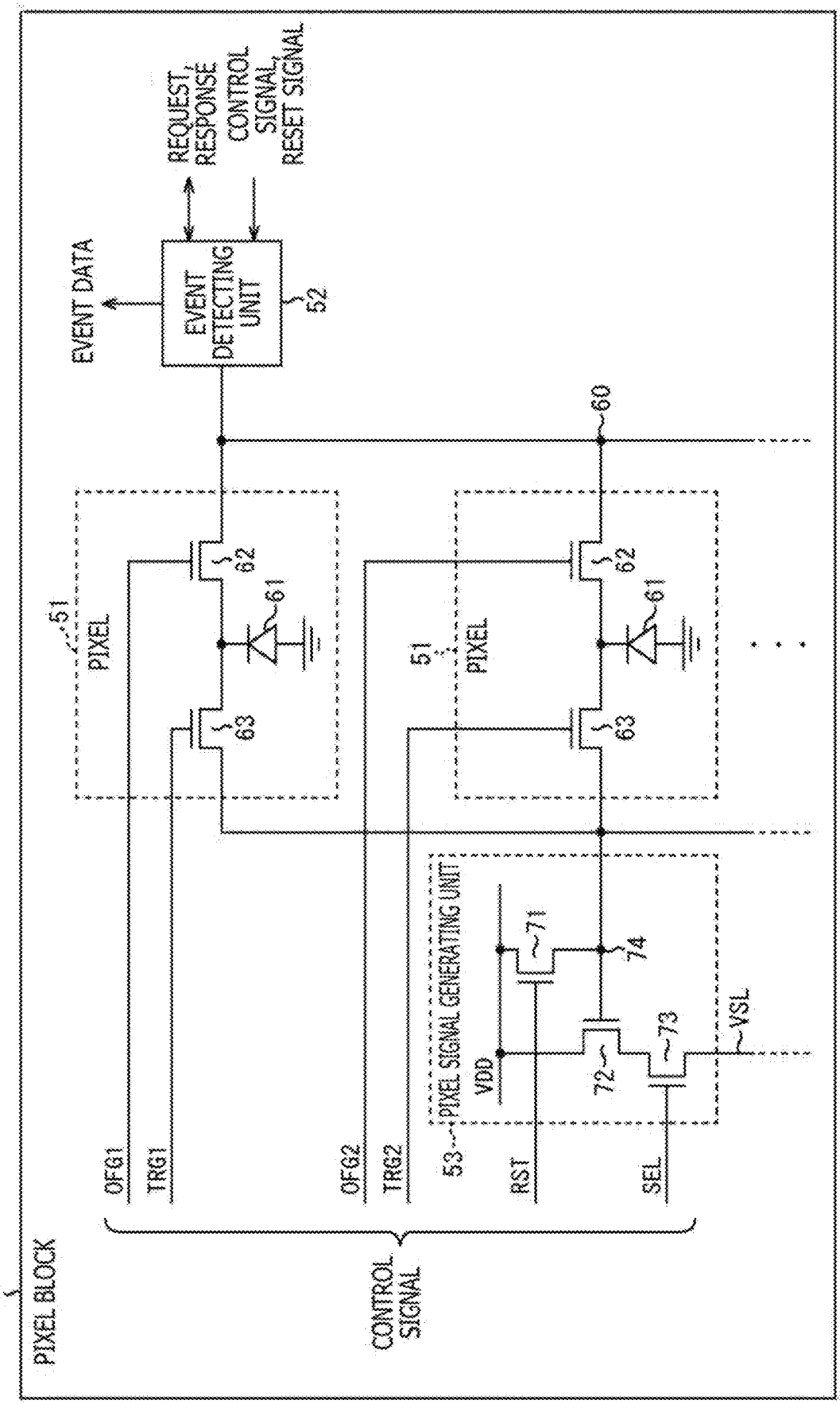
FIG. 4 is a circuit diagram depicting a configuration example of a pixel block 41.

FIG. 4 is a circuit diagram depicting a configuration example of the pixel block 41.

The pixel block 41 includes the pixels 51, the event detecting unit 52, and the pixel signal generating unit 53 as described in FIG. 3.

The pixel 51 includes a photoelectric conversion element 61 and transfer transistors 62 and 63.

The photoelectric conversion element 61 includes, for example, a PD (Photodiode). The photoelectric conversion element 61 receives incident light and performs photoelectric conversion to generate charge.

The transfer transistor 62 includes, for example, an N (Negative) type MOS (Metal-Oxide-Semiconductor) FET (Field Effect Transistor). The transfer transistor 62 included in an nth pixel 51 of the I×J pixels 51 included in the pixel block 41 is turned on/off according to a control signal ORGn supplied from the driving unit 32 (FIG. 2). As the transfer transistor 62 is turned on, the charge generated by the photoelectric conversion element 61 is transferred (supplied) as a photocurrent to the event detecting unit 52.

The transfer transistor 63 includes, for example, an N-type MOS (NMOS) FET. The transfer transistor 63 included in an nth pixel 51 of the I×J pixels 51 included in the pixel block 41 is turned on/off according to a control signal (transfer signal) TRGn supplied from the driving unit 32. As the transfer transistor 63 is turned on, the charge generated by the photoelectric conversion element 61 is transferred to an FD 74 of the pixel signal generating unit 53.

The I×J pixels 51 included in the pixel block 41 are connected to the event detecting unit 52 included in the pixel block 41 via nodes 60. Therefore, the photocurrents generated by the pixels 51 (the photoelectric conversion elements 61 of the pixels 51) are supplied to the event detecting unit 52 via the nodes 60. As a result, the sum of the photocurrents of all of the pixels 51 in the pixel block 41 is supplied to the event detecting unit 52. Therefore, the event detecting unit 52 detects, as an event, a change in the sum of the photocurrents supplied from the I×J pixels 51 included in the pixel block 41.

The pixel signal generating unit 53 includes a reset transistor 71, an amplification transistor 72, a selection transistor 73, and the FD (Floating Diffusion) 74.

The reset transistor 71, the amplification transistor 72, and the selection transistor 73 include, for example, N-type MOS FETs.

The reset transistor 71 is turned on/off according to a control signal RST supplied from the driving unit 32 (FIG. 2). As the reset transistor 71 is turned on, the FD 74 is connected to a power source VDD, and the charge accumulated in the FD 74 is discharged to the power source VDD. As a result, the FD 74 is reset.

The gate of the amplification transistor 72 is connected to the FD 74, the drain is connected to the power source VDD, and the source is connected to the VSL via the selection transistor 73. The amplification transistor 72 is a source follower and outputs, to the VSL via the selection transistor 73, a voltage (electric signal) corresponding to the voltage of the FD 74 supplied to the gate.

The selection transistor 73 is turned on/off according to a control signal SEL supplied from the driving unit 32. As the selection transistor 73 is turned on, the voltage corresponding to the voltage of the FD 74 from the amplification transistor 72 is output to the VSL.

The FD 74 accumulates the charge transferred from the photoelectric conversion element 61 of the pixel 51 via the transfer transistor 63 and converts the charge into a voltage.

For the pixel 51 and the pixel signal generating unit 53 configured in this way, the driving unit 32 uses a control signal OFGn to turn on the transfer transistor 62 to supply, to the event detecting unit 52, the photocurrent based on the charge generated by the photoelectric conversion element 61 of the pixel 51. As a result, a current of the sum of the photocurrents of all of the pixels 51 in the pixel block 41 is supplied to the event detecting unit 52.

In the pixel block 41, once the event detecting unit 52 detects a change in the photocurrent (sum of photocurrents) as an event, the driving unit 32 turns off the transfer transistors 62 of all of the pixels 51 in the pixel block 41 to stop the supply of the photocurrent to the event detecting unit 52. Further, after detecting the event, the driving unit 32 uses the control signal (selection signal) SEL to select a row of the pixels 51 and then resets the photoelectric conversion elements 61 to start the exposure. The driving unit 32 uses the transfer signals TRGn after the completion of the exposure to sequentially turn on the transfer transistors 63 of the pixels 51 in the pixel block 41 with the detected event to transfer the charge generated by the photoelectric conversion elements 61 to the FD 74. The charge transferred from the pixels 51 (the photoelectric conversion elements 61 of the pixels 51) is accumulated in the FD 74. The voltage corresponding to the charge accumulated in the FD 74 is output as a pixel signal of the pixels 51 to the VSL via the amplification transistor 72 and the selection transistor 73.

In this way, the pixel signals of the pixels 51 in only the pixel block 41 with the detected event are sequentially output to the VSL in the sensor unit 21 (FIG. 2). The pixel signals output to the VSL are supplied to the AD conversion 'unit 34, and AD conversion is applied.

Here, for the pixels 51 in the pixel block 41, the transfer transistors 63 can be turned on at the same time, instead of sequentially turning on the transfer transistors 63. In this case, the sum of the pixel signals of all of the pixels 51 in the pixel block 41 can be output.

In a case where the pixel block 41 includes a plurality of pixels 51 in the pixel array unit 31 of FIG. 3, the plurality of pixels 51 shares the event detecting unit 52 and the pixel signal generating unit 53. As a result, compared to a case of disposing one event detecting unit 52 and one pixel signal generating unit 53 for one pixel 51, the numbers of event detecting units 52 and the pixel signal generating units 53 can be reduced, and the scale of the pixel array unit 31 can be suppressed.

Incidentally, the pixel block 41 can include one pixel 51 instead of a plurality of pixels 51.

Further, the event detecting unit 52 can be disposed for each pixel 51 in the pixel block 41. While the event is detected on the basis of pixel blocks 41 in the case where a plurality of pixels 51 in the pixel block 41 shares the event detecting unit 52, the event can be detected on the basis of pixels 51 in the case where the event detecting unit 52 is disposed for each pixel 51.

Further, in a case where the pixel signal does not have to be output, the pixel block 41 may not include the pixel signal generating unit 53. In a case where the pixel block 41 does include the pixel signal generating unit 53, the sensor unit 21 may not include the AD conversion unit 34 and the transfer transistor 63. In this case, the scale of the pixel array unit 31 can be suppressed.

<Configuration Example of Event Detecting Unit 52>

Figure 5:
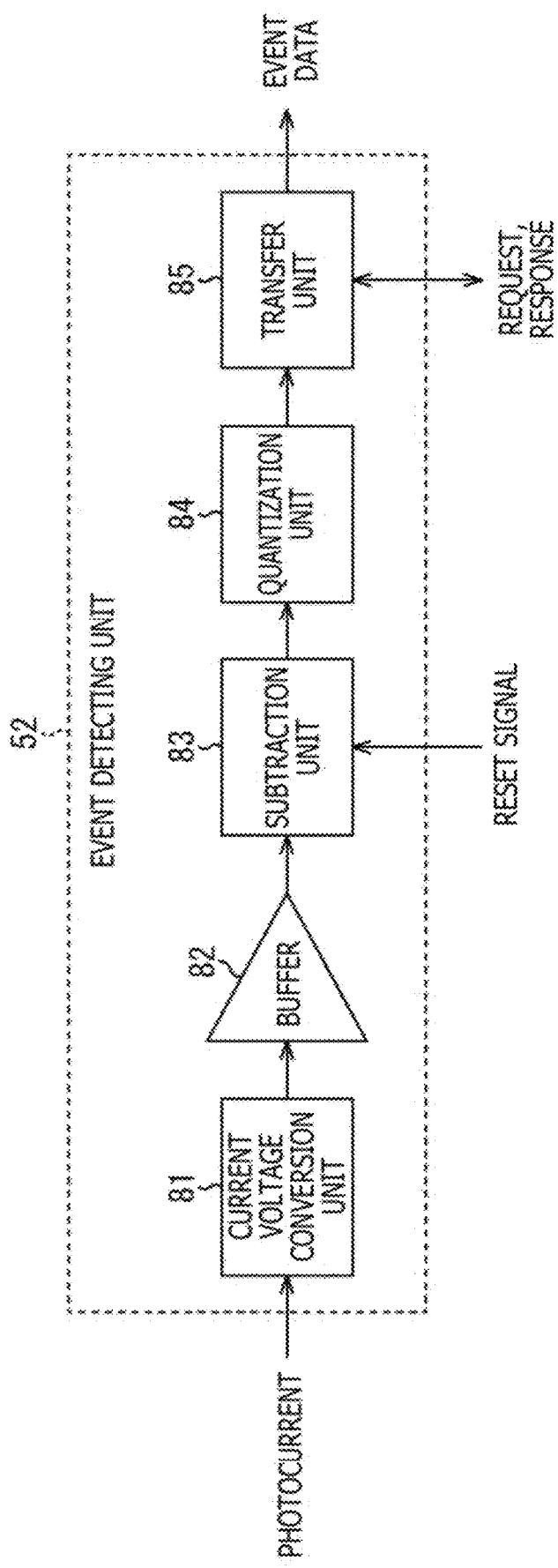
FIG. 5 is a block diagram depicting a configuration example of an event detecting unit 52.

FIG. 5 is a block diagram depicting a configuration example of the event detecting unit 52 in FIG. 3.

The event detecting unit 52 includes a current voltage conversion unit 81, a buffer 82, a subtraction unit 83, a quantization unit 84, and a transfer unit 85.

The current voltage conversion unit 81 converts the photocurrent (sum of photocurrents) from the pixels 51 into a voltage (hereinafter, also referred to as a photovoltage) corresponding to a logarithm of the photocurrent and supplies the photovoltage to the buffer 82.

The buffer 82 buffers the photovoltage from the current voltage conversion unit 81 and supplies the photovoltage to the subtraction unit 83.

The subtraction unit 83 calculates a difference between the current photovoltage and a photovoltage at a timing slightly different from the current time and supplies a difference signal corresponding to the difference to the quantization unit 84.

The quantization unit 84 quantizes the difference signal from the subtraction unit 83 into a digital signal and supplies a quantized value of the difference signal to the transfer unit 85.

The transfer unit 85 transfers (outputs) event data to the output unit 35 according to the quantized value of the difference signal from the quantization unit 84. That is, the transfer unit 85 supplies a request for outputting the event data to the arbiter 33. Further, once the transfer unit 85 receives, from the arbiter 33, a response for permitting the output of the event data in response to the request, the transfer unit 85 outputs the event data to the output unit 35.

<Configuration Example of Current Voltage Conversion Unit 81>

Figure 6:
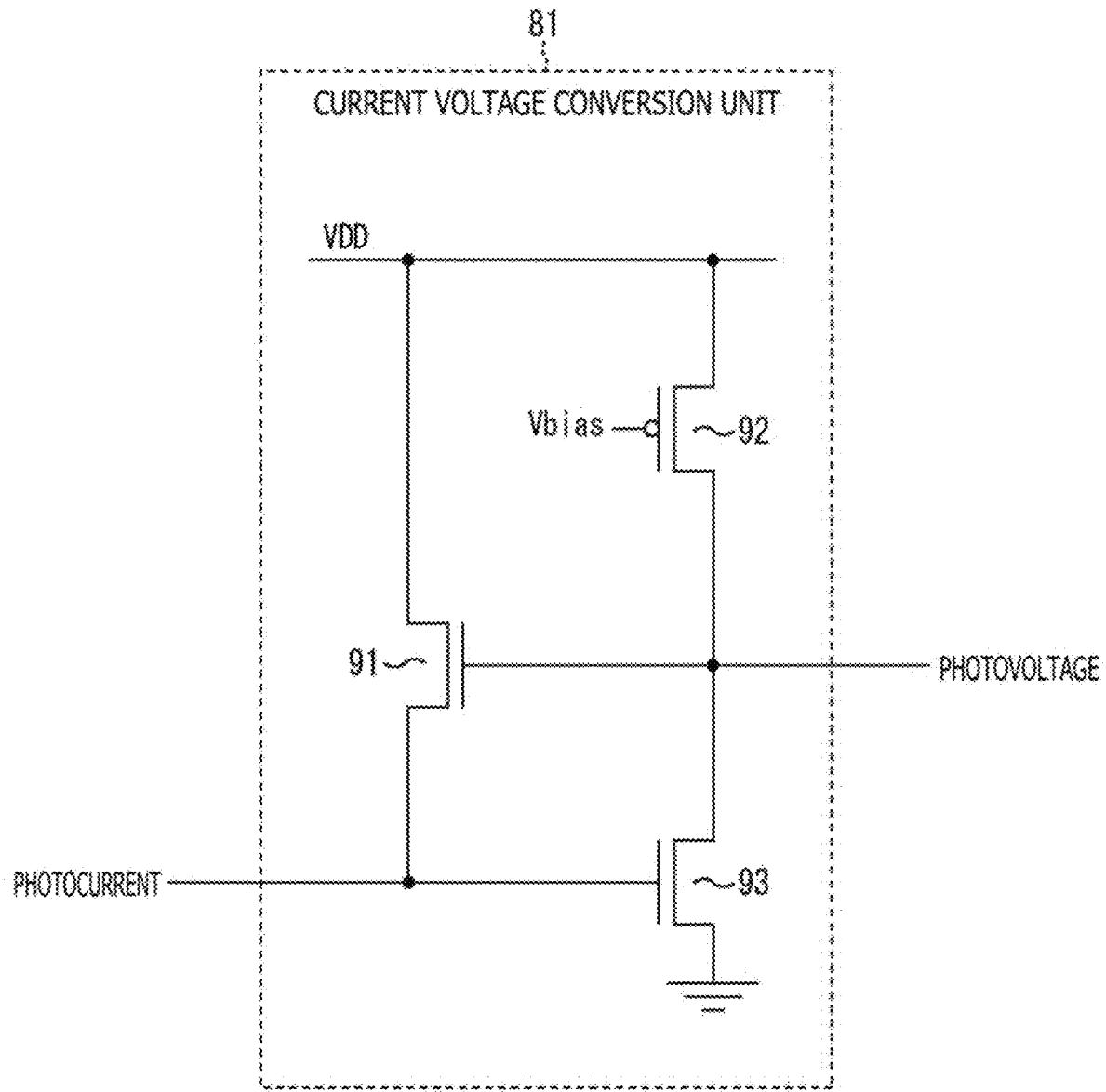
FIG. 6 is a circuit diagram depicting a configuration example of a current voltage conversion unit 81.

FIG. 6 is a circuit diagram depicting a configuration example of the current voltage conversion unit 81 in FIG. 5.

The current voltage conversion unit 81 includes transistors 91 to 93. The transistors 91 and 93 can be, for example, N-type MOS FETs, and the transistor 92 can be, for example, a P-type MOS (PMOS) FET.

The source of the transistor 91 is connected to the gate of the transistor 93, and the photocurrent from the pixels 51 is supplied to the connection point of the source of the transistor 91 and the gate of the transistor 93. The drain of the transistor 91 is connected to the power source VDD, and the gate of the transistor 91 is connected to the drain of the transistor 93.

The source of the transistor 92 is connected to the power source VDD, and the drain of the transistor 92 is connected to the connection point of the gate of the transistor 91 and the drain of the transistor 93. A predetermined bias voltage Vbias is applied to the gate of the transistor 92.

The source of the transistor 93 is grounded.

In the current voltage conversion unit 81, the drain of the transistor 91 is connected to the power source VDD side, and the transistor 91 is a source follower. The transistor 91 as a source follower and the transistor 93 with the gate connected to the source of the transistor 91 convert the photocurrent from the pixels 51 into a photovoltage corresponding to the logarithm of the photocurrent.

The photovoltage is supplied from the connection point of the gate of the transistor 91 and the drain of the transistor 93 to the buffer 82 (FIG. 5).

<Configuration Example of Subtraction Unit 83 and Quantization Unit 84>

Figure 7:
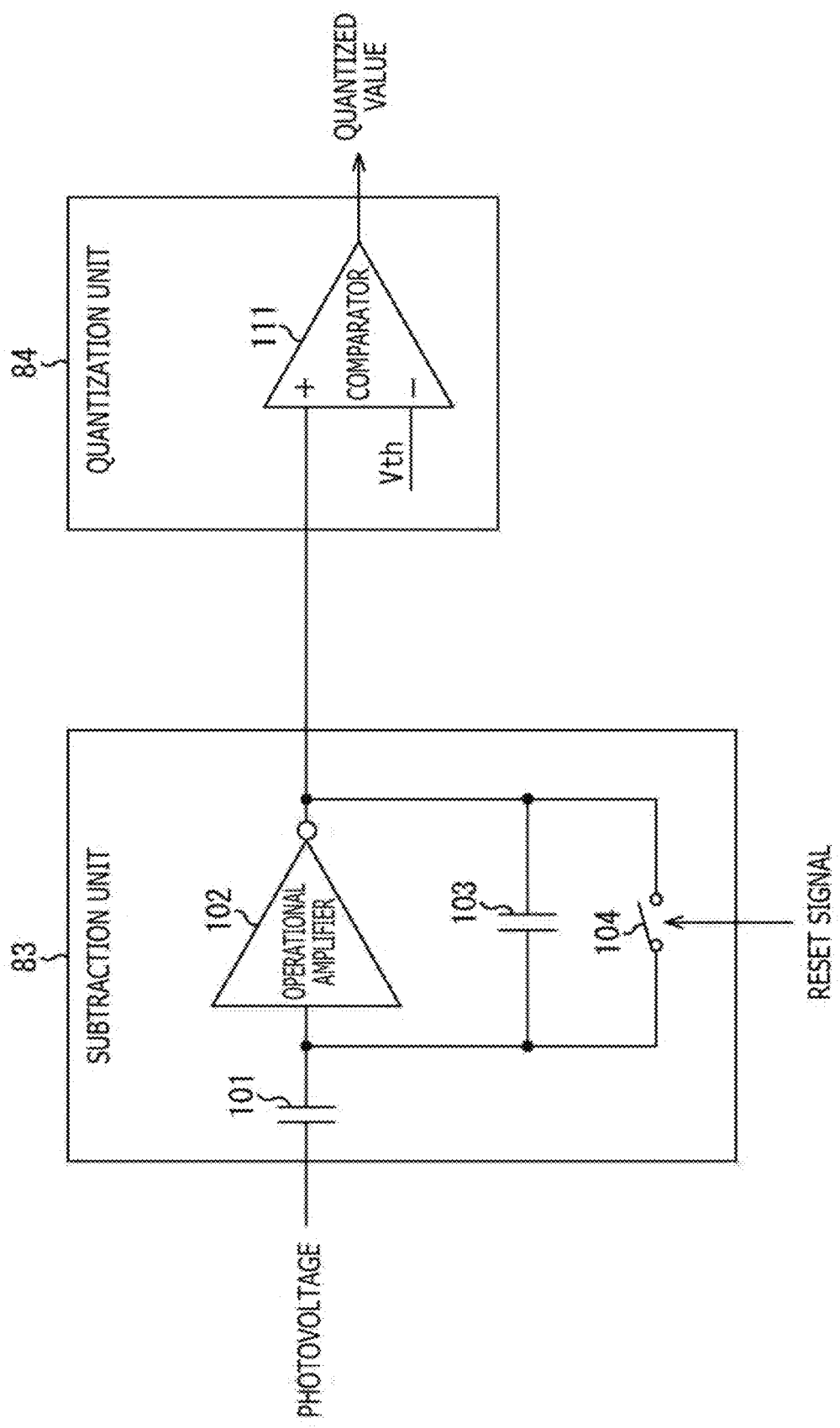
FIG. 7 is a circuit diagram depicting a configuration example of a subtraction unit 83 and a quantization unit 84.

FIG. 7 is a circuit diagram depicting a configuration example of the subtraction unit 83 and the quantization unit 84 in FIG. 5.

The subtraction unit 83 includes a capacitor 101, an operational amplifier 102, a capacitor 103, and a switch 104. The quantization unit 84 includes a comparator 111.

One end of the capacitor 101 is connected to the output terminal of the buffer 82 (FIG. 5), and the other end is connected to the input terminal of the operational amplifier 102. Therefore, the photovoltage is input to the input terminal of the operational amplifier 102 via the capacitor 101.

The output terminal of the operational amplifier 102 is connected to the non-inverting input terminal (+) of the comparator 111.

One end of the capacitor 103 is connected to the input terminal of the operational amplifier 102, and the other end is connected to the output terminal of the operational amplifier 102.

The switch 104 is connected to the capacitor 103 to turn on/off the connections at both ends of the capacitor 103. The switch 104 is turned on/off after the event detection or the like according to the reset signal from the arbiter 33 to thereby turn on/off the connections at both ends of the capacitor 103.

The photovoltage on the buffer 82 (FIG. 5) side of the capacitor 101 when the switch 104 is turned on will be referred to as Vinit, and the capacitance (electrostatic capacitance) of the capacitor 101 will be referred to as C1. The input terminal of the operational amplifier 102 is a virtual ground, and charge Qinit accumulated in the capacitor 101 in a case where the switch 104 is turned on is represented by Equation (1).

$$Q\text{init} = C1 \times V\text{init} \quad (1)$$

Further, in the case where the switch 104 is turned on, both ends of the capacitor 103 are short-circuited, and the charge accumulated in the capacitor 103 is zero.

The photovoltage on the buffer 82 (FIG. 5) side of the capacitor 101 in a case where the switch 104 is subsequently turned off will be referred to as Vafter, and charge Qafter accumulated in the capacitor 101 in the case where the switch 104 is turned off is represented by Equation (2).

$$Q\text{after} = C1 \times V\text{after} \quad (2)$$

The capacitance of the capacitor 103 will be referred to as C2, and the output voltage of the operational amplifier 102 will be referred to as Vout. Charge Q2 accumulated in the capacitor 103 is represented by Equation (3).

$$Q2 = -C2 \times V\text{out} \quad (3)$$

The total amount of charge that is the sum of the charge of the capacitor 101 and the charge of the capacitor 103 does not change before and after the switch 104 is turned off, and Equation (4) is established.

$$Q\text{init} = Q\text{after} + Q2 \quad (4)$$

Equation (5) is obtained by assigning Equations (1) to (3) to Equation (4).

$$V\text{out} = -(C1/C2) \times (V\text{after} - V\text{init}) \quad (5)$$

According to Equation (5), the subtraction unit 83 performs subtraction of the photovoltages Vafter and Vinit, that is, calculates the difference signal Vout corresponding to the difference Vafter−Vinit between the photovoltages Vafter and Vinit. According to Equation (5), the gain of the subtraction of the subtraction unit 83 is C1/C2. It is usually desirable to maximize the gain, and therefore, it is preferable to design large C1 and small C2. On the other hand, if C2 is too small, kTC noise increases, and the noise characteristics may be deteriorated. Therefore, the reduction in the capacitance of C2 is limited to a range that can tolerate the noise. In addition, the event detecting unit 52 including the subtraction unit 83 is provided for each pixel block 41, and therefore, there are restrictions on the capacitances C1 and C2 in terms of area. These are taken into account to determine the values of the capacitances C1 and C2.

The comparator 111 compares the difference signal from the subtraction unit 83 and a predetermined threshold (voltage) Vth applied to the inverting input terminal (−). The comparator 111 outputs, as a quantized value of the difference signal, an H (High) level or an L (Low) level indicating the comparison result of the difference signal and the threshold Vth to the transfer unit 85, for example.

In a case where it is recognized that a light amount change as an event has occurred according to the quantized value of the difference signal from the quantization unit 84, that is, in a case where the difference signal (Vout) is larger (or smaller) than the threshold Vth, the transfer unit outputs event data (for example, H level) indicating the occurrence of the event to the output unit 35. For example, the transfer unit 85 outputs the quantized value of the difference signal from the quantization unit 84 as event data to the output unit 35.

The output unit 35 includes, in the event data from the transfer unit 85 and outputs the event data, position information of the pixel 51 with the occurrence of the event indicated in the event data (the pixel block 41 including the pixel 51), time information indicating the time of the occurrent of the event, and, as necessary, the polarity of the light amount change as an event.

The data format of the event data including the position information of the pixel 51 with the occurrence of the event, the time information indicating the time of the occurrence of the event, and the polarity of the light amount change as an event can be, for example, a data format called AER (Address Event Representation).

Incidentally, a gain A of the entire event detecting unit 52 is represented by the following equation, where the gain of the current voltage conversion unit 81 is $CG_{log}$, the gain of the buffer 82 is 1, and the gain of the quantization unit 84 is G.

$$A = CG_{log} C1/C2(\Sigma i_{photo\_n}) \quad (6)$$

Here, $i_{photo\_n}$ represents the photocurrent of an nth pixel 51 of the I×J pixels 51 included in the pixel block 41. In Equation (6), Σ represents the summation obtained by changing n to integers from 1 to I×J.

Incidentally, the pixel 51 can be provided with, for example, an optical filter, such as a color filter, that passes predetermined light to allow the pixel 51 to receive any light as incident light. For example, in a case where the pixel 51 receives visible light as incident light, the event data indicates an occurrence of a change in the pixel value in an image with a subject that can be visually recognized. Further, in a case where, for example, the pixel 51 receives infrared rays, millimeter waves, or the like for distance measurement as incident light, the event data indicates an occurrence of a change in the distance to the subject. Further, in a case where, for example, the pixel 51 receives infrared rays for measuring the temperature as incident light, the event data indicates an occurrence of a change in the temperature of the subject. It is assumed in the present embodiment that the pixel 51 receive visible light as incident light.

Figure 8:
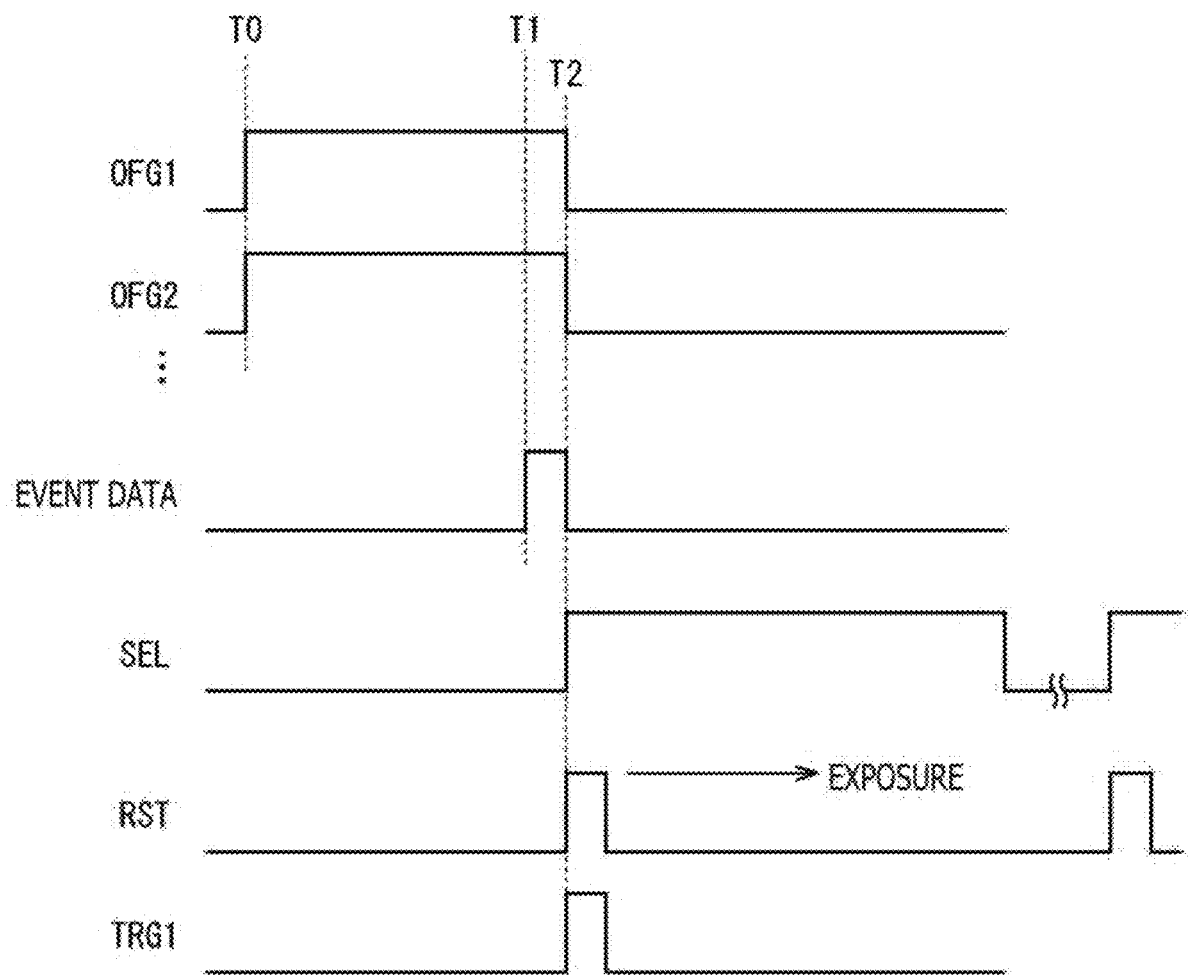
FIG. 8 is a timing chart describing an example of an operation of the sensor unit 21.

FIG. 8 is a timing chart describing an example of an operation of the sensor unit 21 in FIG. 2.

At timing T0, the driving unit 32 switches all of the control signals OFGn from the L level to the H level to turn on the transfer transistors 62 of all of the pixels 51 in the pixel block 41. As a result, the sum of the photocurrents of all of the pixels 51 in the pixel block 41 is supplied to the event detecting unit 52. In this case, all of the transfer signals TRGn are in the L level, and the transfer transistors 63 of all of the pixels 51 are turned off.

When the event detecting unit 52 detects an event at, for example, timing T1, the event detecting unit 52 outputs event data in the H level according to the detection of the event.

The driving unit 32 switches all of the control signals OFGn to the L level at timing T2 according to the event data in the H level, to stop the supply of photocurrent from the pixels 51 to the event detecting unit 52. In addition, the driving unit 32 switches the control signal SEL to the H level, switches the control signal RST and the transfer signal TRGn to the H level for a certain period, and discharges the charge of the photoelectric conversion element 61 to the power source VDD to reset the pixel 51. The driving unit 32 switches the control signal RST to the H level after the end of the exposure time to reset the FD 74. The pixel signal generating unit 53 outputs, as a reset level, the pixel signal corresponding to the voltage of the FD 74 at the time of the reset of the FD 74, and the AD conversion unit 34 performs AD conversion of the reset level.

After the AD conversion of the reset level, the driving unit 32 switches the transfer signal TRG1 to the H level for a certain period to transfer, to the FD 74, the charge generated by the photoelectric conversion of the first pixel 51 (the photoelectric conversion element 61 of the pixel 51) in the pixel block 41 with the detected event. The pixel signal generating unit 53 outputs, as a signal level, the pixel signal corresponding to the voltage of the FD 74 to which the charge has been transferred from the pixel 51, and the AD conversion unit 34 performs AD conversion of the signal level.

The AD conversion unit 34 outputs, to the output unit 35, the difference between the signal level and the reset level after the AD conversion as a pixel signal that is a pixel value of the image (frame data).

Here, the process of determining the difference between the signal level and the reset level as a pixel signal that is a pixel value of the image is called CDS. The CDS can be performed after the AD conversion of the signal level and the reset level and can also be performed at the same time as the AD conversion of the signal level and the reset level by using the AD conversion result of the reset level as an initial value to perform AD conversion of the signal level in a case where the AD conversion unit 34 performs single-slope AD conversion.

After the AD conversion of the pixel signal of the first pixel 51 in the pixel block 41, the driving unit 32 switches the transfer signal TRG2 to the H level for a certain period to output the pixel signal of the second pixel 51 in the pixel block 41 with the detected event.

Similar operations follow in the sensor unit 21, and the pixel signals of the pixels 51 in the pixel block 41 with the detected event are sequentially output.

Once the pixel signal of the pixel 51 with the detected event in the pixel block 41 is output, the driving unit 32 switches the control signal OFGn to the H level to turn on the transfer transistor 62 of the pixel 51 in the pixel block 41, and similar operations are repeated.

<Generation of Frame Data Corresponding to Event Data>

Figure 9:
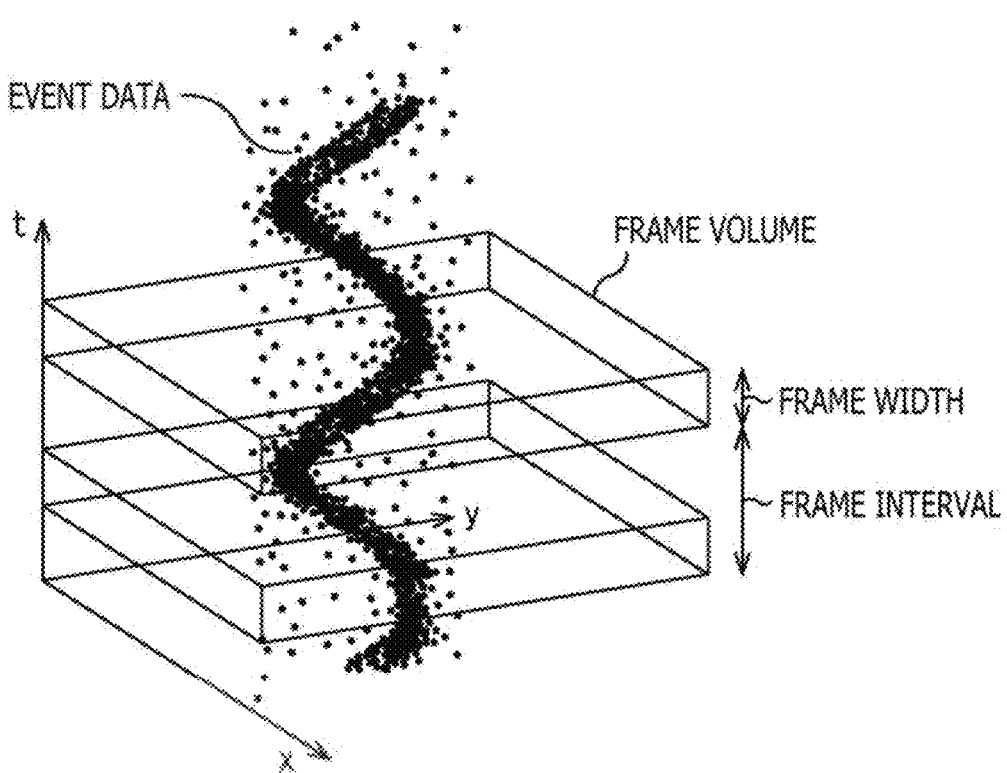
FIG. 9 is a diagram describing an example of a method of generating frame data according to event data.

FIG. 9 is a diagram describing an example of a method of generating frame data according to the event data.

The logic unit 22 sets a frame interval and a frame width according to, for example, a command or the like from the outside. Here, the frame interval denotes an interval of frames of the frame data generated according to the event data. The frame width denotes a time width of the event data used to generate the frame data of one frame. The frame interval and the frame with set by the logic unit 22 will also be referred to as a set frame interval and a set frame width, respectively.

The logic unit 22 generates frame data, which is image data in a frame format, according to the set frame interval, the set frame width, and the event data from the sensor unit 21 to thereby convert the event data into the frame data.

That is, the logic unit 22 generates, at each set frame interval, the frame data according to the event data in the set frame width from the top of the set frame interval.

Now, it is assumed that the event data includes time information (hereinafter, also referred to as a time of event) ti indicating the time of the occurrence of the event and includes coordinates (x, y) as position information (hereinafter, also referred to as a position of event) of the pixel 51 with the occurrence of the event (the pixel block 41 including the pixel 51).

In FIG. 9, points as event data are plotted at the time of event t included in the event data and at the positions of event (coordinates of events) (x, y) in a three-dimensional space (time and space) including an x-axis, a y-axis, and a time axis t.

That is, assuming that a position on the three-dimensional space (x, y, t) represented by the time of event t and the position of event (x, y) included in the event data is called a time and space position of event, the event data is plotted as points at the time and space positions of event (x, y, t) in FIG. 9.

The logic unit 22 uses, for example, predetermined time, such as time instructed from the outside to generate frame data and time at which the power source of the sensor chip 10 is turned on, as generation start time for starting to generate the frame data and starts to generate the frame data according to the event data.

Now, a rectangular solid with a thickness (height) of the set frame width in the time axis t direction at each set frame interval from the generation start time will be referred to as a frame volume. The sizes of the frame volume in the x-axis direction and the y-axis direction are equal to, for example, the numbers of pixel blocks 41 or pixels 51 in the x-axis direction and the y-axis direction.

The logic unit 22 generates, at each set frame interval, frame data of one frame according to the event data (using the event data) in the frame volume with the set frame width from the top of the set frame interval.

The frame data can be generated by, for example, setting the pixel (pixel value of the pixel) of the frame at the position of event (x, y) included in the event data to white and setting the pixels at other positions of the frame to a predetermined color, such as gray.

Additionally, in the case where the event data includes the polarity of the light amount change as an event, the polarity included in the event data can be taken into account to generate the frame data. For example, the pixel can be set to white in a case where the polarity is positive, and the pixel can be set to black in a case where the polarity is negative.

Further, in the case where the pixel signal of the pixel 51 is output along with the output of the event data as described in FIGS. 3 and 4, the pixel signal of the pixel 51 can be used according to the event data to generate the frame data. That is, in the frame, the pixel (in the block corresponding to the pixel block 41) at the position of event (x, y) included in the event data can be set to the pixel signal of the pixel 51 at the position (x, y), and the pixels at other positions can be set to a predetermined color, such as gray, to generate the frame data.

Incidentally, there is a case in which the frame volume includes a plurality of pieces of event data at the same position of event (x, y), although the time of event t of is different. In this case, for example, the event data at the newest or oldest time of event t can be prioritized. Further, in the case where the event data includes the polarity, the polarities of the plurality of pieces of event data at the same position of event (x, y), at a different time of event t, can be added, and the pixel value corresponding to the added value obtained by the addition can be set for the pixel at the position of event (x, y).

Here, in a case where the frame width and the frame interval are the same, the frame volumes are in contact with each other without gaps. Further, in a case where the frame interval is larger than the frame width, the frame volumes are arranged at intervals. In a case where the frame width is larger than the frame interval, the frame volumes are arranged to partially overlap with each other.

<Sensor Chip According to Present Technology>

Figure 10:
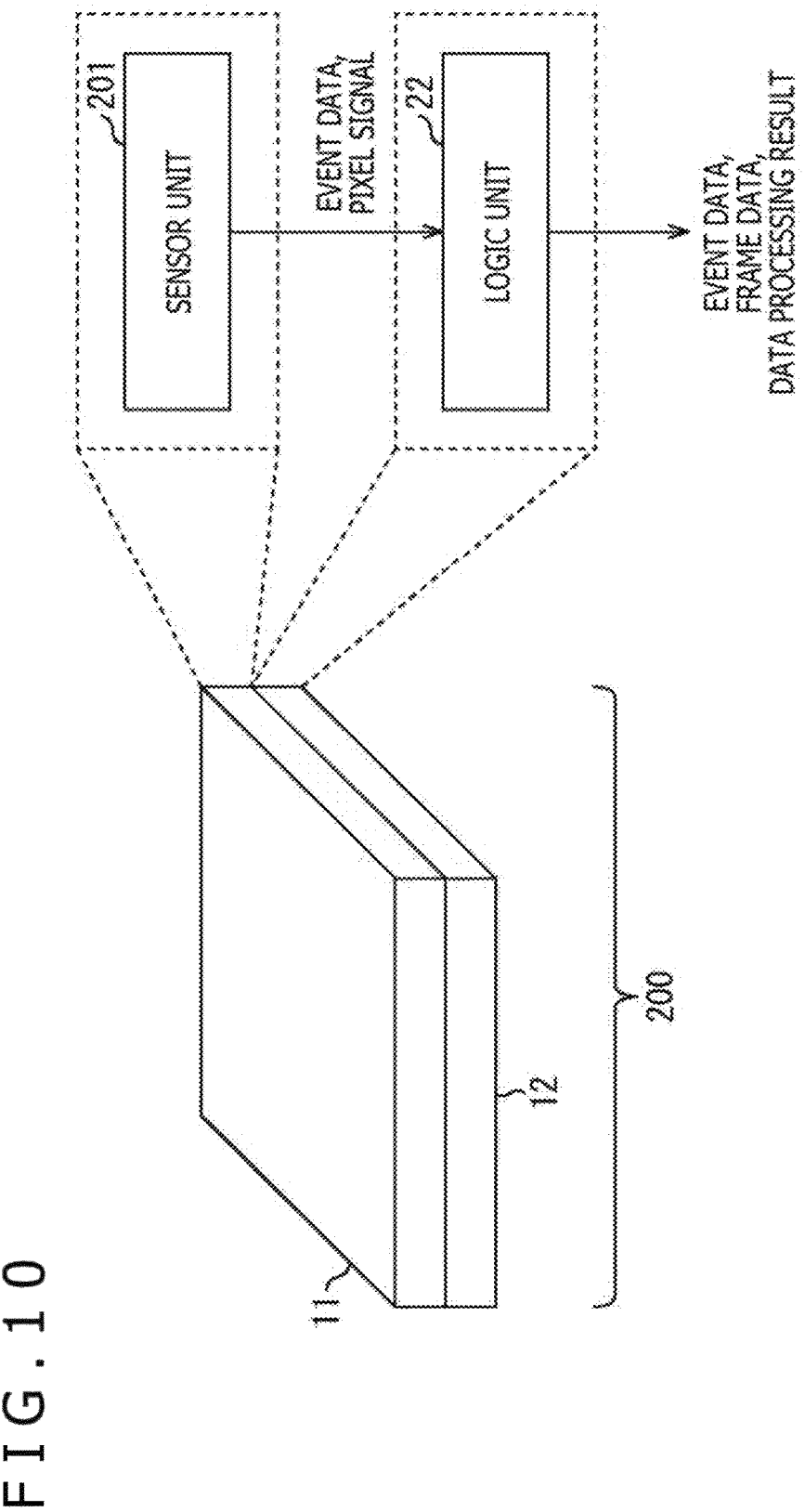
FIG. 10 is a diagram depicting a configuration example of an embodiment of the sensor chip according to the present technology.

FIG. 10 is a diagram depicting a configuration example of an embodiment of a sensor chip according to the present technology.

Incidentally, in FIG. 10, the same reference signs are provided to the parts corresponding to the sensor chip 10 of FIG. 1, and the description will be appropriately skipped.

Similar to the sensor chip 10 of FIG. 1, a sensor chip 200 of FIG. 10 is an asynchronous sensor (image sensor), and the sensor chip 200 includes the sensor die 11 and the logic die 12 laminated with each other. Further, the sensor die 11 includes a sensor unit 201, and the logic die 12 includes the logic unit 22.

Therefore, the sensor chip 200 of FIG. 10 is similar to the sensor chip 10 of FIG. 1 in that the sensor chip 200 includes the sensor die 11 and the logic die 12 and that the logic die 12 includes the logic unit 22. However, the sensor chip 200 is different from the sensor chip 10 in that the sensor die 11 includes the sensor unit 201 in place of the sensor unit 21.

<Configuration Example of Sensor Unit 201>

Figure 11:
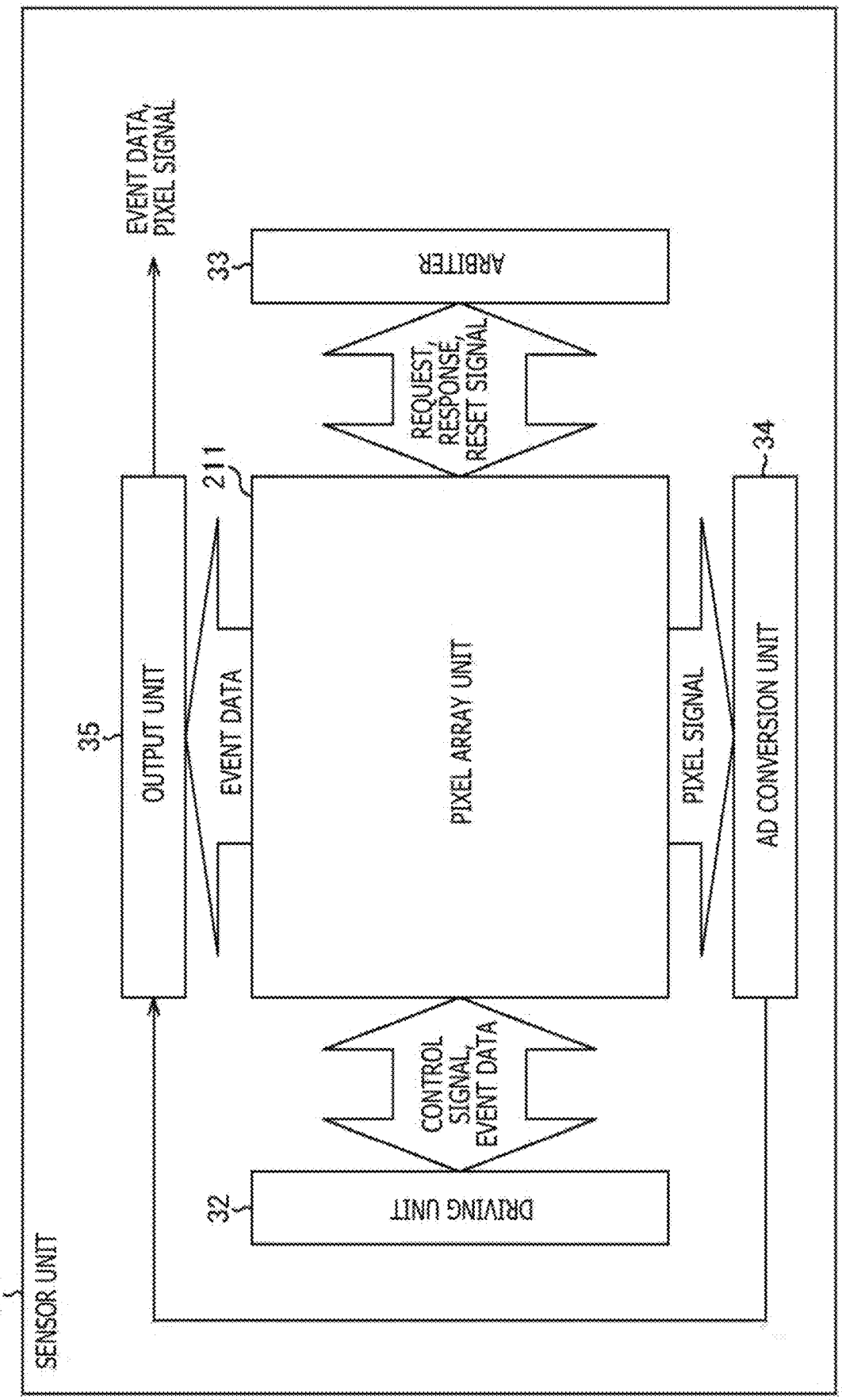
FIG. 11 is a block diagram depicting a configuration example of a sensor unit 201.

FIG. 11 is a block diagram depicting a configuration example of the sensor unit 201 in FIG. 10.

Incidentally, in FIG. 11, the same reference signs are provided to the parts corresponding to the sensor unit 21 of FIG. 2, and the description will be appropriately skipped.

In FIG. 11, the sensor unit 201 includes the driving unit 32, the arbiter 33, the AD conversion unit 34, the output unit 35, and a pixel array unit 211.

Assuming that, for example, the sensor unit 21 includes the pixel array unit 31, and the logic unit 22 includes the units from the driving unit 32 to the output unit 35 in FIG. 2, the sensor unit 201 and the sensor unit 21 are different in that the sensor unit 201 of FIG. 11 includes the units from the driving unit 32 to the output unit 35, and the sensor unit 21 of FIG. 2 does not include the units from the driving unit 32 to the output unit 35. Further, the sensor unit 201 and the sensor unit 21 are different in that the sensor unit 201 includes the pixel array unit 211 in place of the pixel array unit 31, and the sensor unit 21 includes the pixel array unit 31.

<Configuration Example of Pixel Array Unit 211>

Figure 12:
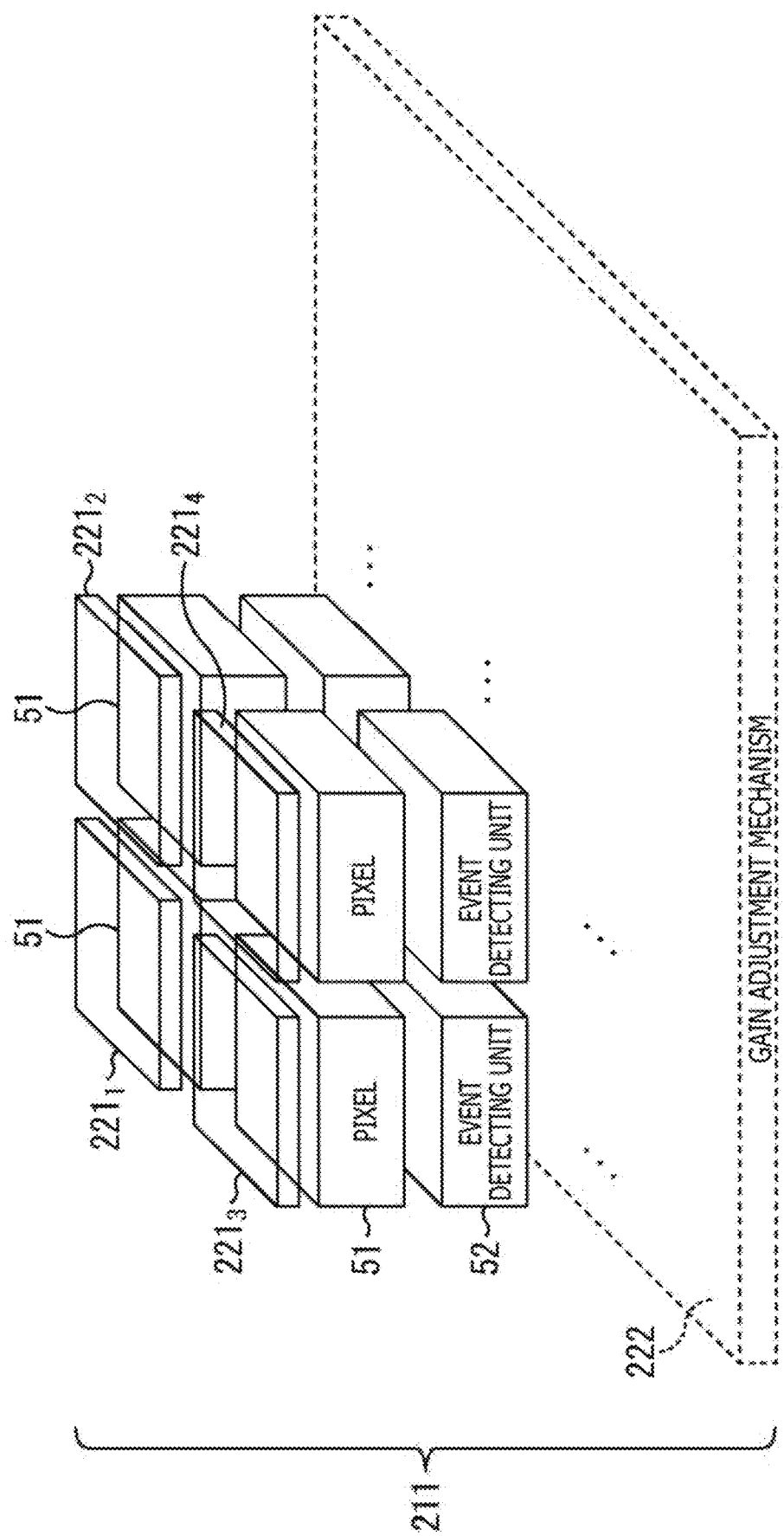
FIG. 12 is a perspective view depicting an overview of a configuration example of a pixel array unit 211.

FIG. 12 is a perspective view depicting an overview of a configuration example of the pixel array unit 211 in FIG. 11.

Similar to the pixel array unit 31, the pixel array unit 211 includes a plurality of pixels 51 arranged in a two-dimensional grid.

An optical filter $221_k$ as a transmission mechanism that passes predetermined light is disposed on the side of the pixel 51 from which the incident light enters.

The optical filter $221_k$ passes light at a predetermined wavelength (band) or light in a predetermined polarization direction (polarized light) of the incident light entering the optical filter $221_k$ and causes the light to enter the pixel 51 provided with the optical filter $221_k$.

Therefore, the pixel 51 in the pixel array unit 211 receives the light having passed through the optical filter $221_k$ disposed on the pixel 51 and performs photoelectric conversion to generate a photocurrent as an electric signal corresponding to the light.

Similar to the pixel array unit 31, the pixel array unit 211 includes the event detecting unit 52. However, although the event detecting unit 52 is disposed for each pixel block 41 (FIG. 3) in the pixel array unit 31, the event detecting unit 52 is disposed for each pixel 51 in the pixel array unit 211.

The event detecting unit 52 detects, as an event, a change in the photocurrent as an electric signal of the pixel 51 provided with the event detecting unit 52 when the change exceeds a predetermined threshold.

In FIG. 12, there are four types of optical filters $221_k$ including optical filters $221_1$, $221_2$, $221_3$, and $221_4$. The wavelengths (bands) and the polarization directions of the transmitted light are different in the optical filters $221_1$ to $221_4$. Therefore, the pixels 51 that receive light having passed through the optical filters $221_1$ to $221_4$ receive different types of light, that is, light at different wavelengths, polarization directions, and the like.

The optical filter $221_1$ is disposed at the position of the upper left pixel 51 of 2×2 pixels, and the optical filter $221_2$ is disposed at the position of the upper right pixel 51. The optical filter $221_3$ is disposed at the position of the lower left pixel 51, and the optical filter $221_4$ is disposed at the position of the lower right pixel 51.

The optical filters $221_1$ to $221_4$ are repeatedly (periodically) arranged on the pixels 51 arrayed in a two-dimensional grid in the pixel array unit 211, in units of optical filters $221_1$ to $221_4$ in the 2×2 arrangement as described above.

Hereinafter, the optical filters $221_1$ to $221_4$ will also be simply referred to as optical filters 221 in a case where the optical filters $221_1$ to $221_4$ do not have to be distinguished.

In addition, the repeated unit in the case where the optical filters 221 are repeatedly arranged in certain units as described above will also be referred to as a repeating unit. In FIG. 12, the optical filters $221_1$ to $221_4$ in the 2×2 arrangement is the repeating unit.

In FIG. 12, the optical filters $221_1$ to $221_4$ in the 2×2 arrangement (optical filters repeatedly arranged with the optical filters $221_1$ to $221_4$ as a repeating unit) that pass different types of light are adopted as a transmission mechanism that passes predetermined light, and therefore, each pixel 51 included in the pixel array unit 211 receives the light having passed through any one of the optical filters $221_1$ to $221_4$, that is, any one of the four types of light. Other than the mechanism that receives any one of the four types of light, a mechanism that receives any one of two or three types of light or a mechanism that receives any one of four or more types of light can be adopted as the transmission mechanism in the pixel 51.

Here, passing predetermined light is equivalent to blocking the light other than the predetermined light, and therefore, the transmission mechanism, such as the optical filter 221, that passes predetermined light is also a blocking mechanism that blocks predetermined light. In addition, it can also be stated that the transmission mechanism is a selection mechanism that selects light to be transmitted or light to be blocked.

The pixel array unit 211 further includes a gain adjustment mechanism 222. The gain adjustment mechanism 222 directly or indirectly (supposedly) adjusts the gain of the event detecting unit 52 for, for example, each light (type of light) transmitted by the optical filter $221_k$ as a transmission mechanism. The gain adjustment mechanism 222 can adjust the gain of the event detecting unit 52 for each light transmitted by the optical filter $221_k$ as a transmission mechanism according to the environment of the sensor chip 200 in imaging the subject, such as color temperature of fluorescent light, incandescent light, or other light sources for lighting the subject. For example, the gain of the event detecting unit 52 can be adjusted according to the color temperature of the light source in imaging the subject such that the sensitivity of detecting the event of each light becomes the same for each light transmitted by the optical filter $221_k$ as a transmission mechanism.

Incidentally, the gain adjustment mechanism 222 is depicted below the event detecting units 52 in FIG. 12. However, FIG. 12 is a diagram schematically depicting that the pixel array unit 211 includes the gain adjustment mechanism 222, and the gain adjustment mechanism 222 may not be disposed below the event detecting unit 52.

In addition, the gain adjustment mechanism 222 can adjust the gain after the gain of white balance or the like is set.

Figure 13:
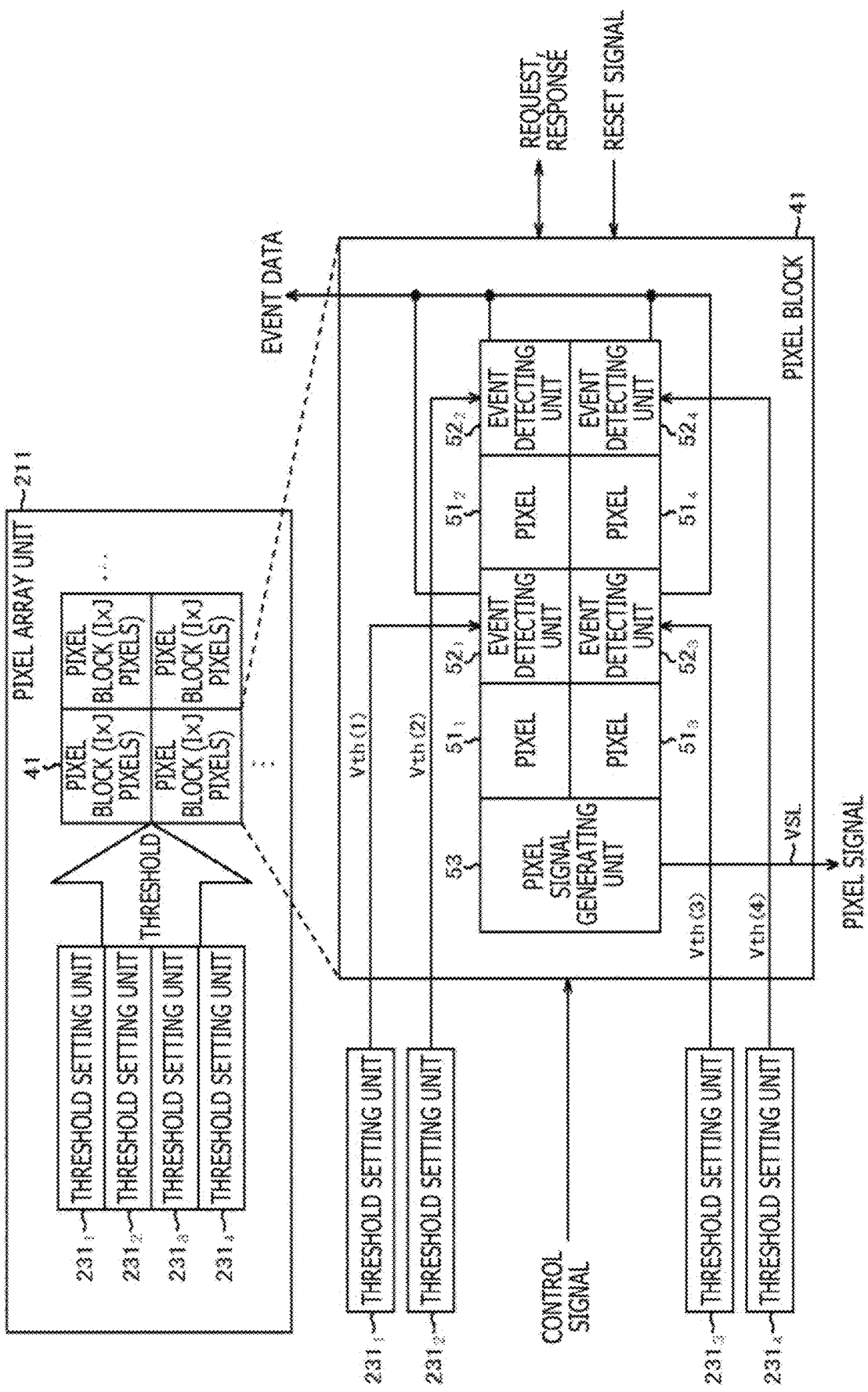
FIG. 13 is a block diagram depicting a configuration example of the pixel array unit 211.

FIG. 13 is a block diagram depicting a configuration example of the pixel array unit 211 in FIG. 12.

Incidentally, in FIG. 13, the same reference signs are provided to the parts corresponding to the pixel array unit 31 of FIG. 3, and the description will be appropriately skipped.

The pixel array unit 211 includes plural pixel blocks 41 and four threshold setting units $231_1$, $231_2$, $231_3$, and $231_4$ corresponding to the light (types of light) passing through the 2×2 optical filters 221 as a repeating unit. The pixel block 41 includes, for example, plural pixels $51_1$, $51_2$, $51_3$, and $51_4$ that are 2×2 pixels 51 corresponding to the repeating unit, event detecting units $52_1$, $52_2$, $52_3$, and $52_4$ that are event detecting units 52 disposed for the pixels $51_k$, respectively, and the pixel signal generating unit 53. In addition, the VSL for connecting the pixel block 41 and the ADC of the AD conversion unit 34 is wired on each column of the pixel blocks 41.

Therefore, the pixel array unit 211 is similar to the pixel array unit 31 of FIG. 3 in that the pixel array unit 211 includes plural pixel blocks 41, each pixel block 41 includes the pixels $51_k$, the event detecting units $52_k$, and the pixel signal generating unit 53 and that the VSL for connecting the pixel block 41 and the ADC of the AD conversion unit 34 is wired.

However, the pixel array unit 211 is different from the pixel array unit 31 of FIG. 3 in that the pixel block 41 additionally includes the 2×2 pixels $51_1$ to $51_4$ corresponding to the repeating unit, the event detecting unit $52_k$ is disposed for each pixel $51_k$, and the threshold setting units $231_1$ to $231_4$ are additionally disposed.

Therefore, while the change in the sum of the photocurrents of one or more pixels 51 included in the pixel block 41 is detected as an event in the pixel array unit 31 (FIGS. 3 and 4), the event detecting units $52_1$ to $52_4$ detect changes in the photocurrents of the 2×2 pixels $51_1$ to $51_4$ in the pixel block 41 as events, respectively, in the pixel array unit 211.

Incidentally, in a case where events occur in one or more pixels $51_1$ to $51_4$ of the pixel block 41, that is, in a case where one or more event detecting units $52_1$ to $52_4$ detect events, the pixel array unit 211 can integrate (all together) the event data output by one or more event detecting units $52_k$ with the detected events into one piece of event data and output the event data.

The threshold setting unit $231_k$ is an example of the gain adjustment mechanism 222 and sets a threshold used to detect an event (hereinafter, also referred to as an event threshold) for each light (type of light) transmitted by the optical filter 221 as a transmission mechanism. The threshold setting unit $231_k$ can set (adjust) the event threshold according to, for example, a command from the outside or according to a set value that is set in a built-in register not illustrated according to a command from the outside.

Here, the optical filter $221_k$ is disposed on the pixel $51_k$, and the pixel $51_k$ receives the light having passed through the optical filter $221_k$ disposed on the pixel $51_k$.

The threshold setting unit $231_k$ sets the event threshold Vth(k) used to detect an event of the pixel $51_k$ (change in the photocurrent of the pixel $51_k$) that receives the light having passed through the optical filter $221_k$ and supplies the event threshold Vth(k) to the event detecting unit $52_k$ that detects the event of the pixel $51_k$.

The event detecting unit $52_k$ detects, as an event, a change exceeding the event threshold Vth(k) (threshold corresponding to the event threshold Vth(k)) of the photocurrent of the pixel $51_k$. Therefore, the pixel array 211 can set a different event threshold Vth(k) for each light (type of light) received by the pixel $51_k$ and detect the event.

Hereinafter, the pixels $51_1$ to $51_4$ will also be simply referred to as pixels 51 in a case where the pixels $51_1$ to $51_4$ do not have to be distinguished. Similarly, the event detecting units $52_1$ to $52_4$ will also be referred to as event detecting units 52 in a case where the event detecting units $52_1$ to $52_4$ do not have to be distinguished, and the threshold setting units $231_1$ to $231_4$ will also be referred to as threshold setting units 231 in a case where the threshold setting units $231_1$ to $231_4$ do not have to be distinguished.

Incidentally, although the threshold setting unit 231 is disposed for the pixel array unit 211 in the present embodiment, the threshold setting unit 231 can be disposed outside of the pixel array unit 211. For example, the threshold setting unit 231 can be disposed on a part of the sensor unit 201 other than the pixel array unit 211 or on any part of the logic unit 22 or can be disposed outside of the sensor chip 200.

<Configuration Example of Pixel Block 41>

Figure 14:
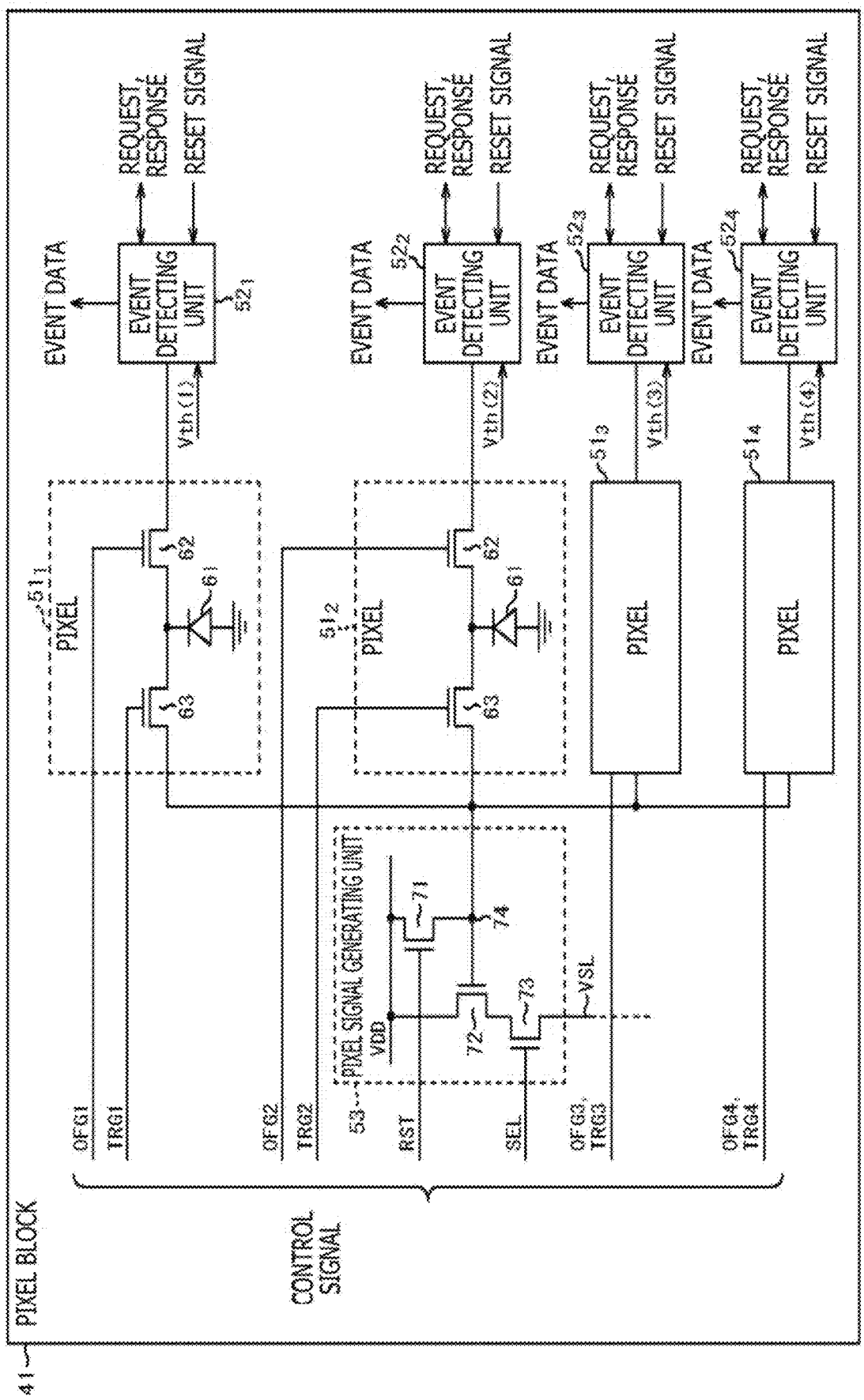
FIG. 14 is a circuit diagram depicting a configuration example of the pixel block 41.

FIG. 14 is a circuit diagram depicting a configuration example of the pixel block 41 in FIG. 13.

Incidentally, in FIG. 14, the same reference signs are provided to the parts corresponding to the case of FIG. 4, and the description will be appropriately skipped.

In FIG. 14, the pixel block 41 includes, as described in FIG. 13, a plurality of 2×2 pixels $51_1$ to $51_4$ corresponding to the repeating unit, the event detecting units $52_1$ to $52_4$ disposed for the pixels $51_k$, respectively, and the pixel signal generating unit 53.

Therefore, the pixel block 41 of FIG. 14 is similar to the case of FIG. 4 in that the pixel block 41 includes the pixels $51_k$, the event detecting units $52_k$, and the pixel signal generating unit 53.

However, the pixel block 41 of FIG. 14 is different from the case of FIG. 4 in that the event detecting units $52_k$ are disposed for the pixels $51_k$, respectively.

The pixel $51_k$ includes the photoelectric conversion element 61 and the transfer transistors 62 and 63 and is configured similarly to the case of FIG. 4. The pixel signal generating unit 53 includes the reset transistor 71, the amplification transistor 72, the selection transistor 73, and the FD 74 and is configured similarly to the case of FIG. 4.

Incidentally, along with the event detecting unit $52_k$, the pixel signal generating unit 53 can also be disposed for each pixel $51_k$ in the pixel block 41. The disposition of the event detecting unit $52_k$ and the pixel signal generating unit 53 for each pixel $51_k$ is equivalent to the fact that the pixel block 41 includes one pixel $51_k$.

<Configuration Example of Event Detecting Unit $52_k$>

Figure 15:
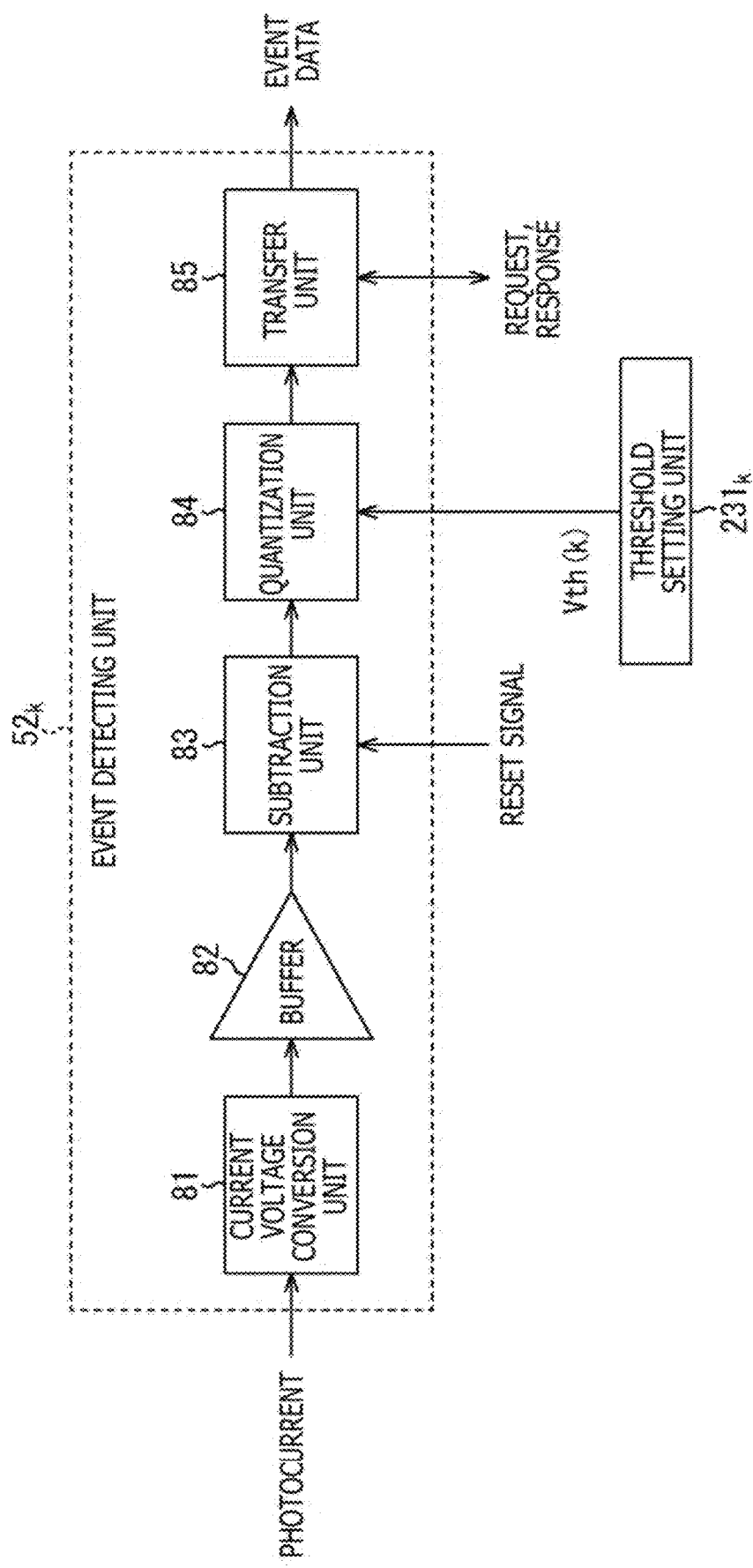
FIG. 15 is a block diagram depicting a configuration example of an event detecting unit $52k$.

FIG. 15 is a block diagram depicting a configuration example of the event detecting units $52_k$ in FIGS. 13 and 14.

Incidentally, in FIG. 15, the same reference signs are provided to the parts corresponding to the case of FIG. 5, and the description will be appropriately skipped.

In FIG. 15, the event detecting unit $52_k$ includes the current voltage conversion unit 81, the buffer 82, the subtraction unit 83, the quantization unit 84, and the transfer unit 85.

Therefore, the configuration of the event detecting unit $52_k$ of FIG. 15 is similar to the case of FIG. 5.

However, the event threshold Vth(k) is supplied from the threshold setting unit $231_k$ to the quantization unit 84 in the event detecting unit $52_k$ of FIG. 15, and this is different from the case of FIG. 5 in which the event threshold Vth(k) is not supplied from the threshold setting unit $231_k$ to the quantization unit 84.

FIG. 16 is a block diagram depicting a configuration example of the quantization unit 84 in FIG. 15.

Incidentally, in FIG. 16, the same reference signs are provided to the parts corresponding to the case of FIG. 7, and the description will be appropriately skipped.

In FIG. 16, the quantization unit 84 includes the comparator 111 and is configured similarly to the case of FIG. 7.

However, the event threshold Vth(k) from the threshold setting unit $231_k$ is supplied (applied) to the inverting input terminal (−) of the comparator 111 in the quantization unit 84 of FIG. 16.

Therefore, in the quantization unit 84 of FIG. 16, the comparator 111 compares the difference signal from the subtraction unit 83 and the event threshold Vth(k) from the threshold setting unit $231_k$ and outputs the quantized value indicating the comparison result to the transfer unit 85.

The transfer unit 85 outputs the event data (for example, H level or L level) indicating the occurrence of the event to the output unit 35 in a case where the difference signal Vout is larger (smaller) than the event threshold Vth(k), according to the quantized value of the quantization unit 84.

Therefore, even if the difference signal is small, that is, even if the change in the photocurrent of the pixel $51_k$ is small, the event detecting unit $52_k$ detects the small change in the photocurrent as an event in a case where the event threshold Vth(k) is set to a small value. On the other hand, in a case where the event threshold Vth(k) is set to a large value, the change in the photocurrent is not detected as an event unless the difference signal is large, that is, unless the change in the photocurrent of the pixel $51_k$ is large.

In this way, the gain of the event detecting unit $52_k$ can be indirectly (substantially) adjusted according to the value set for the event threshold Vth(k). For example, the event threshold Vth(k) can be set to ½ of a predetermined default value to adjust the gain of the event detecting unit $52_k$ that uses the event threshold Vth(k) to two times the case of using the default value. In this case, the sensitivity of detecting the change in the photocurrent of the pixel $51_k$ improves, and a small change in the photocurrent can be detected as an event.

In this way, the gain of the event detecting unit $52_k$ can be substantially adjusted based on the setting of the event threshold Vth(k) used by the event detecting unit $52_k$, and, as a result, the event can be flexibly detected. That is, for example, a slight change or a large change in the photocurrent of the pixel $51_k$ can be detected as an event.

<Configuration Example of Threshold Setting Unit $231_k$>

Figure 17A:
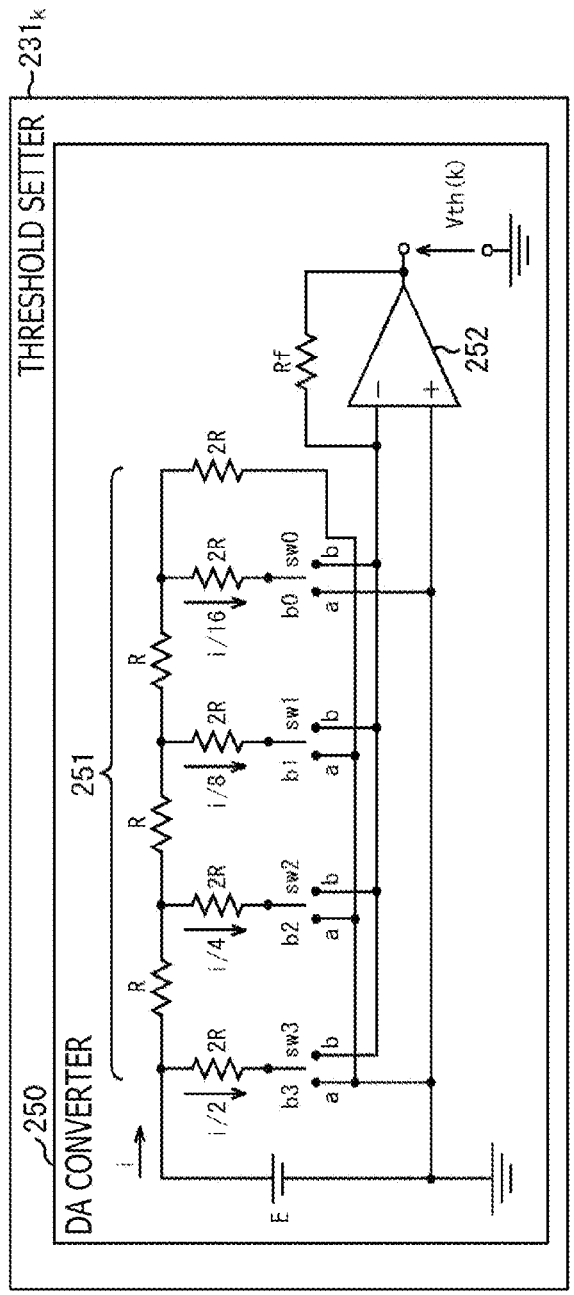
FIGS. 17A and 17B depict circuit diagrams each depicting a configuration example of a threshold setting unit $231k$.
Figure 17B:
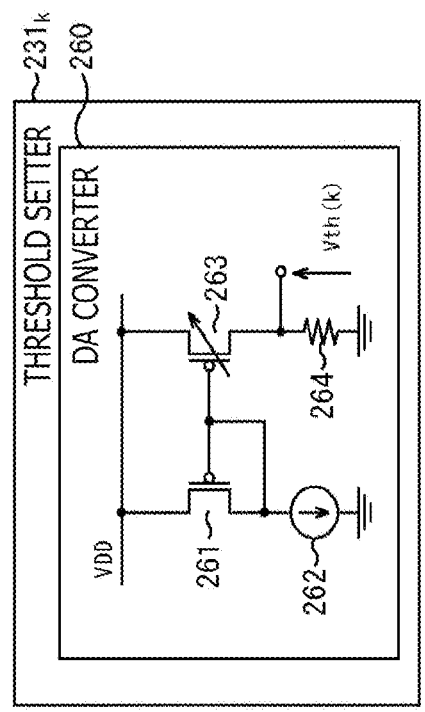

FIGS. 17A and 17B depict circuit diagrams each depicting a configuration example of the threshold setting unit $231k$.

FIG. 17A represents a first configuration example of the threshold setting unit $231k$.

FIG. 17A, the threshold setting unit $231k$ includes what is called a ladder-type DA (Digital to Analog) converter 250 including a ladder circuit 251, an operational amplifier 252, a power source with a voltage E, a resistor with a resistance value Rf, and switches sw0 to sw3.

The ladder circuit 251 includes a plurality of resistors with a resistance value R and a plurality of resistors with a resistance value 2R, and, in FIGS. 17A and 17B, the impedance is the resistance value R when the right side is viewed from any of the second and subsequent resistors from the right among the resistors with the resistance value 2R. For example, in a case where the right side is viewed from the resistor with the resistance value 2R second from the right, two resistors with the resistance value 2R form a parallel connection, and the resistance value is R. In addition, for example, in a case where the right side is viewed from the resistor with the resistance value 2R third from the right, the resistor with the resistance value 2R and two resistors with the resistance value R form a series connection, that is, the resistor with the resistance value 2R and a resistor with the resistance value 2R form a parallel connection, and the resistance value is R. Similarly, when the right side is viewed from any of the second and subsequent resistors from the right among the resistors with the resistance value 2R, two resistors with the resistance value 2R form a parallel connection, and the resistance value is R.

Now, the current flowing from the power source with the voltage E will be referred to as i.

As described above, two resistors with the resistance value 2R form a parallel connection in the ladder circuit 251, and the resistance value is R when the right side is viewed from any of the second and subsequent resistors from the right among the resistors with the resistance value 2R. Therefore, the currents flowing through the first, second, third, and fourth resistors from the left with the resistance value 2R are i/2, i/4, i/8, and i/16, respectively. Incidentally, the current i is represented by an equation i=E/R.

A switch sw #j is connected to a resistor (one end of the resistor) with the resistance value 2R, (4−j)th from the left and selects a terminal a or a terminal b according to a control bit b #j supplied to the switch sw #j. For example, the switch sw #j selects the terminal a in a case where the control bit b #j is 0 and selects the terminal b in a case where the control bit b #j is 1.

The terminal a is connected to the ground (earth), and the terminal b is connected to the inverting input terminal (−) of the operational amplifier 252.

Therefore, in the case where the switch sw #j selects the terminal a, the current flowing through the resistor with the resistance value 2R, (4−j)th from the left, flows to the ground via the switch sw #j. Further, in the case where the switch sw #j selects the terminal b, the current flowing through the resistor with the resistance value 2R, (4−j)th from the left, is supplied to the inverting input terminal of the operational amplifier 252 via the switch sw #j.

The non-inverting input terminal (+) of the operational amplifier 252 is connected to the ground, and the inverting input terminal of the operational amplifier 252 is connected to the terminal b of the switch sw #j and one end of the resistor of the resistance value Rf. The output terminal of the operational amplifier 252 is connected to the other end of the resistor of the resistance value Rf.

In the threshold setting unit $231_k$ configured in this way, the switch sw #j selects the terminal a or the terminal b according to, for example, the control bit b #j as a command from the outside, and the voltage appearing at the output terminal of the operational amplifier 252 (between the output terminal and the ground) as a result of the selection of the terminal a or the terminal b by the switch sw #j is set for the event threshold Vth(k).

For example, in a case where the switch sw0 selects the terminal b, and the other switches sw1 to sw3 select the terminals a, the current flowing on the inverting input terminal side of the operational amplifier 252 as a virtual ground is i/16. In this case, the event threshold Vth(k) is set to a voltage −i/16×Rf appearing at the output terminal of the operational amplifier 252.

Further, in a case where, for example, the switch sw3 selects the terminal b, and the other switches sw0 to sw2 select the terminals a, the current flowing on the inverting input terminal side of the operational amplifier 252 as a virtual ground is i/2. In this case, the event threshold Vth(k) is set to a voltage −i/2×Rf appearing at the output terminal of the operational amplifier 252.

In this way, the control bit b #j can be used to control the selection of the terminal a or the terminal b by the switch sw #j to variably set the event threshold Vth(k).

Further, the threshold setting unit $231_k$ includes the DA converter 250, and the event thresholds Vth(k) can be set with fine widths. Therefore, fine adjustment for finely adjusting the gain of the event detecting unit $52_k$ can be performed.

FIG. 17B represents a second configuration example of the threshold setting unit 231k.

FIG. 17B, the threshold setting unit 231k includes a PMOS FET 261, a current source 262, a PMOS FET 263, and a DA converter 260 including a resistor 264.

In the DA converter 260, the sources of the FETs 261 and 263 are connected to the power source VDD, and the drain of the FET 261 is connected to the current source 262.

Further, the gate of the FET 261 and the gate of the FET 263 are connected, and the drain of the FET 261 is connected to the connection point of the gate of the FET 261 and the gate of the FET 263.

Therefore, the FET 261 and the FET 263 form a current mirror. In the current mirror, the FET 261 is a mirror source, and the FET 263 is a mirror destination.

The current flowing through the FET 261 as a mirror source, that is, the current corresponding to the current applied by the current source 262 (current corresponding to the mirror ratio), flows through the FET 263 as a mirror destination.

One end of the resistor 264 is grounded, and the other end of the resistor 264 is connected to the drain of the FET 263 as a mirror destination.

Here, an arrow described on the FET 263 as a mirror destination in FIG. 17B represents that the FET 263 includes plural FETs, and the plural FETs are connected in parallel to the FET 261 as a mirror source, that is, each gate of the plural FETs is connected to the gate of the FET 261, the drain is connected to the power source VDD, and the source is connected to the resistor 264.

Further, the arrow described on the FET 263 as a mirror destination represents that an adjustment can be made regarding the number of FETs (hereinafter, also referred to as active FETs) that apply current corresponding to the current applied by the current source 262 among the plural FETs as the FETs 263.

By adjusting the number of active FETs among the plural FETs as the FETs 263, the current flowing through the resistor 264 is changed.

In the threshold setting unit $231_k$ configured in this way, for example, the number of active FETs is set according to a command from the outside, and a voltage drop caused by the current applied to the resistor 264 by the active FETs is set as the event threshold Vth(k).

For example, the event threshold Vth(k) is set to a voltage drop iRN caused by the current applied to the resistor 264 by the active FETs, where i represents the current applied to one active FET, N represents the number of active FETs, and R represents the resistance value of the resistor 264.

Therefore, the event threshold Vth(k) can be variably set based on the number N of active FETs. Further, according to the DA converter 260, the event thresholds Vth(k) can be set with fine widths as in the DA converter 250, and fine adjustment for finely adjusting the gains of the event detecting units $52_k$ can be performed.

Figure 18:
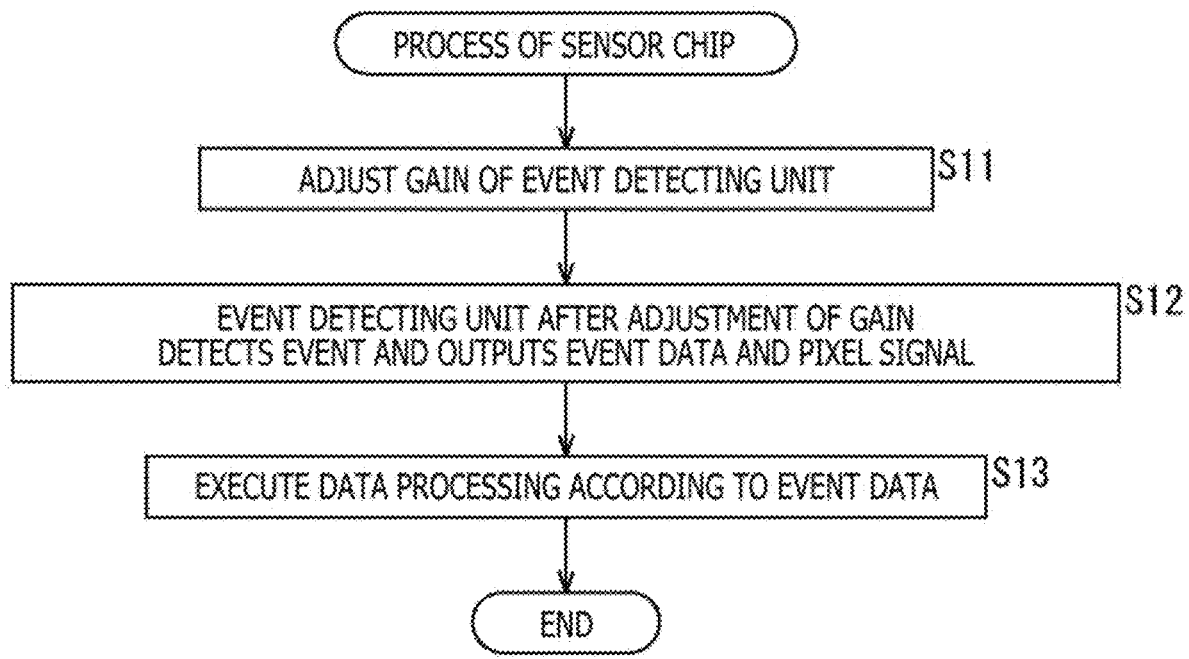
FIG. 18 is a flow chart describing an example of an operation of a sensor chip 200.

FIG. 18 is a flow chart describing an example of an operation of the sensor chip 200 in FIG. 10.

In step S11, the gain adjustment mechanism 222 (FIG. 12) adjusts the gain of the event detecting unit 52 for each predetermined light (type of light) transmitted by the optical filters 221 as a transmission mechanism, and the process proceeds to step S12.

That is, in step S11, the threshold setting units $231_k$ as the gain adjustment mechanism 222 set the event thresholds Vth(k) for each light (type of light) transmitted by the optical filters $221_k$ to adjust the gains of the event detecting units $52_k$ for each light transmitted by the optical filters $221_k$, for example.

In step S12, when an event occurs, the event detecting unit $52_k$ after the adjustment of the gain detects the event, and, as a result, the event data and the pixel signal of the pixel $51_k$ with the detected event are output from the sensor unit 21 to the logic unit 22.

Subsequently, the process proceeds from step S12 to step S13, and the logic unit 22 uses the pixel signal from the event data from the sensor unit 21 in the same way according to the event data form the sensor unit 21 to execute data processing, such as generating frame data, and outputs the data processing result.

<Configuration Example of Pixel Array Unit 211 in Case Where CFs $301_k$ Are Adopted as Optical Filters $221_k$>

Figure 19:
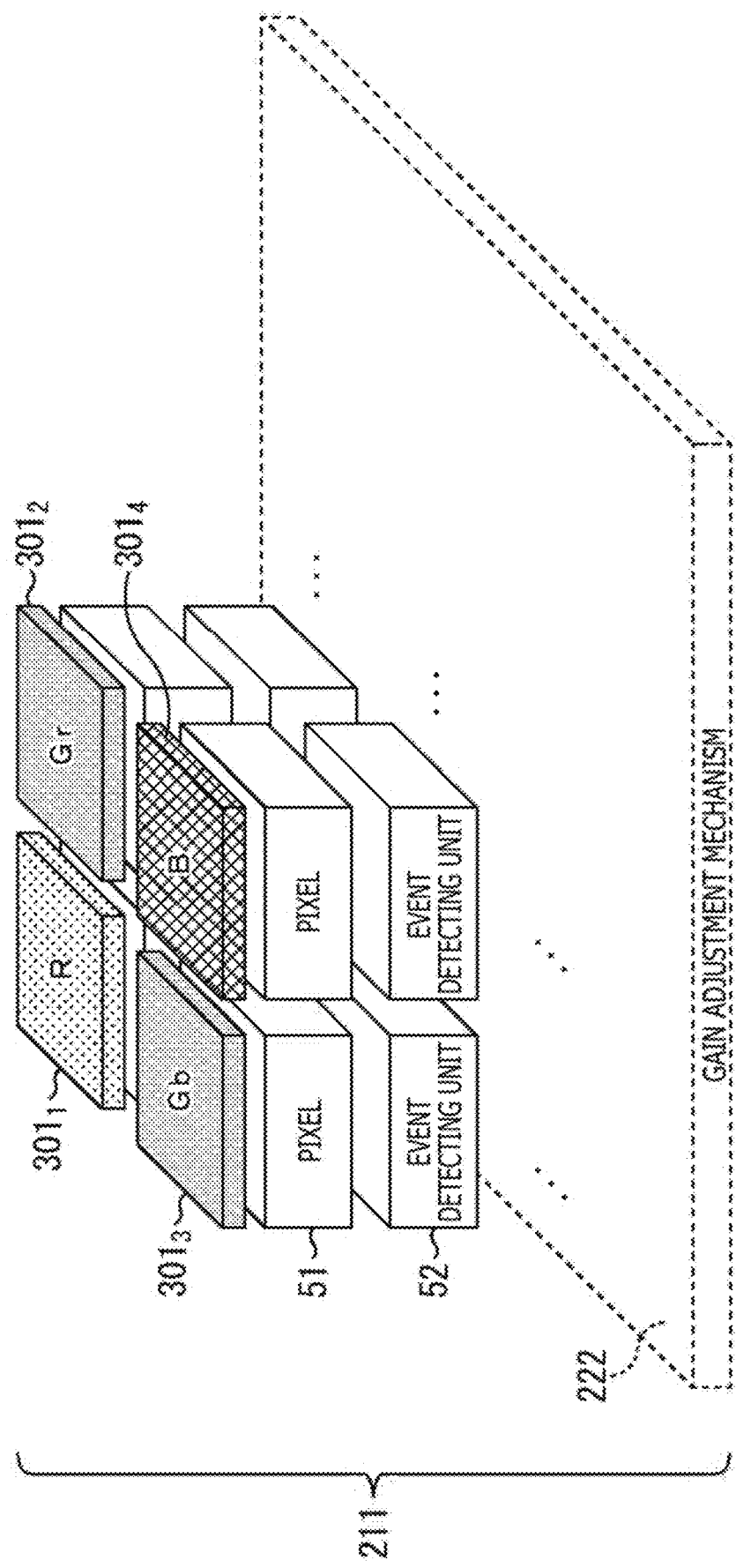
FIG. 19 is a perspective view depicting an overview of a configuration example of the pixel array unit 211 in a case where CFs $301k$ are adopted as optical filters $221k$.

FIG. 19 is a perspective view depicting an overview of a configuration example of the pixel array unit 211 in a case where CFs $301_k$ are adopted as the optical filters $221_k$.

Incidentally, in FIG. 19, the same reference signs are provided to the parts corresponding to the case of FIG. 12, and the description will be appropriately skipped.

In FIG. 19, CFs (Color Filters) $301_1$, $301_2$, $301_3$, and $301_4$ are adopted as the optical filters $221_1$, $221_2$, $221_3$, and $221_4$ of FIG. 12.

The CFs $301_k$ are OCCFs (On Chip Color Filters) in a Bayer array. The CF $301_1$ passes light of R (Red), the CFs $301_2$ and $301_3$ pass light of G (Green), and the CF $301_4$ passes light of B (Blue).

Hereinafter, the light of R passing through the CF $301_1$ will also be referred to as R light, and the light of G passing through the CF $301_2$ will also be referred to as G light or Gr light. Further, the light of G passing through the CF $301_3$ will also be referred to as G light or Gb light, and the light of B passing through the CF $301_4$ will also be referred to as B light. In addition, the CFs $301_1$ to $301_4$ will also be simply referred to as CFs 301 in a case where the CFs $301_1$ to $301_4$ do not have to be distinguished.

As for the CFs 301 of the Bayer array, the CFs $301_1$ to $301_4$ in a 2×2 arrangement are set as a repeating unit, and the repeating unit is repeatedly arranged.

Incidentally, in the CFs 301 of the Bayer array, both the Gr light and the Gb light passing through the CFs $301_2$ and $301_3$, respectively, included in the repeating unit are G light, and it can be stated that the Gr light and the Gb light are the same type of light. However, the Gr light and the Gb light are light passing through the separate CFs $301_2$ and $301_3$, respectively, included in the repeating unit, and the Gr light and the Gb light will be handled here as different types of light. The Gr light and the Gb light passing through the separate CFs $301_2$ and $301_3$, respectively, included in the repeating unit as described above may be handled as different types of light as described above or may be handled as the same type of light.

<Configuration Example of Pixel Array Unit 211>

Figure 20:
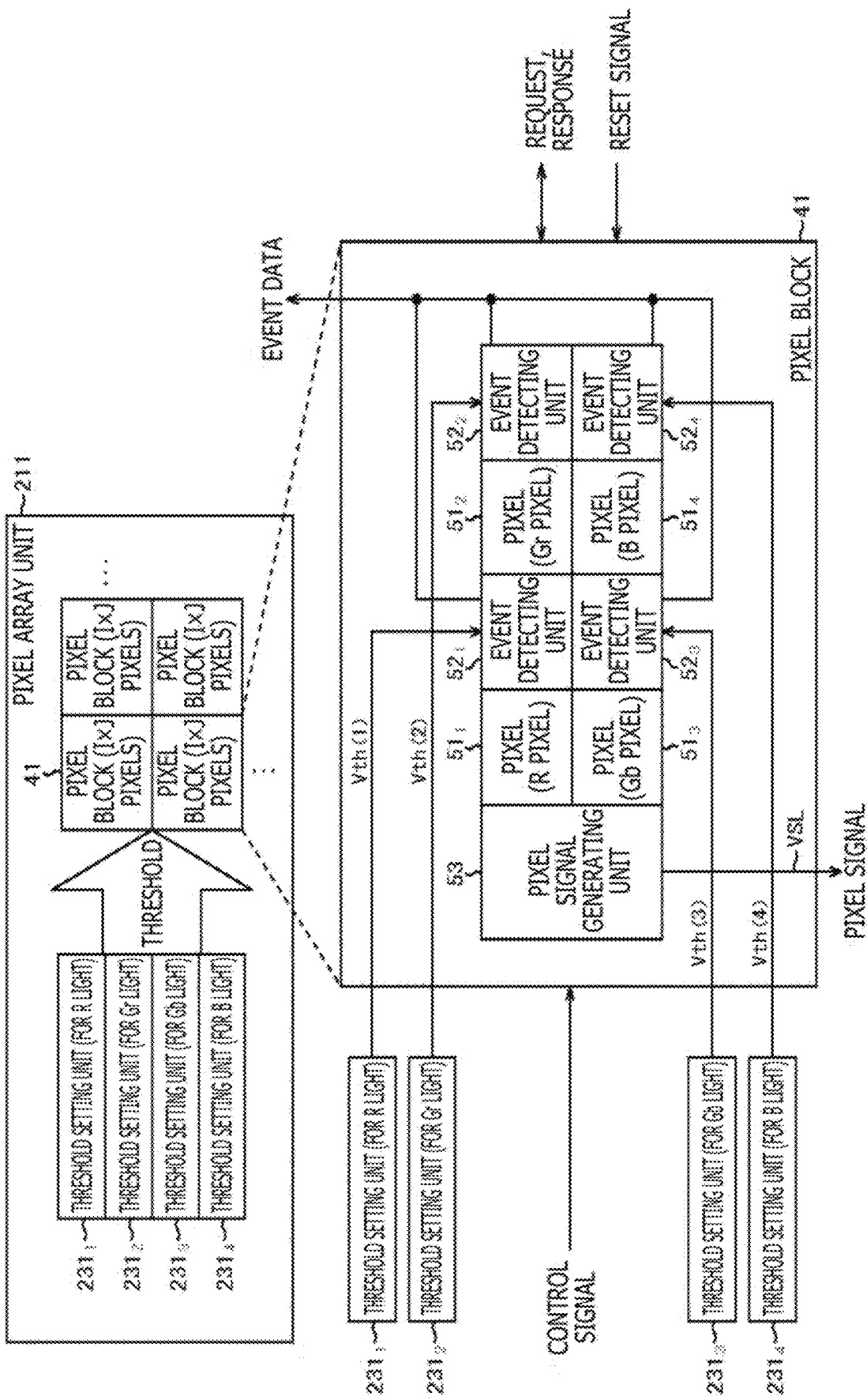
FIG. 20 is a block diagram depicting a configuration example of the pixel array unit 211 in a case where the CFs $301k$ in a Bayer array are adopted as the optical filters $221k$.

FIG. 20 is a block diagram depicting a configuration example of the pixel array unit 211 in a case where the CFs $301_k$ of the Bayer array are adopted as the optical filters $221_k$.

Incidentally, in FIG. 20, the same reference signs are provided to the parts corresponding to the case of FIG. 13, and the description will be appropriately skipped.

The pixel array unit 211 includes plural pixel blocks 41 and four threshold setting units $231_1$, $231_2$, $231_3$, and $231_4$ corresponding to the light (types of light) passing through the CFs 301 as the 2×2 optical filters 221 that are the repeating unit. The pixel block 41 includes, for example, plural pixels $51_1$, $51_2$, $51_3$, and $51_4$ that are 2×2 pixels 51 corresponding to the repeating unit, the event detecting units $52_k$ that are event detecting units 52 disposed for the pixels $51_k$, respectively, and the pixel signal generating unit 53. In addition, the VSL for connecting the pixel block 41 and the ADC of the AD conversion unit 34 is wired on each column of the pixel blocks 41.

Therefore, the configuration of the pixel array unit 211 in FIG. 20 is similar to the case of FIG. 13.

However, the threshold setting unit $231_1$ sets an event threshold Vth(1) used to detect the event of the pixel $51_1$ (hereinafter, also referred to as an R pixel $51_1$) that receives the R light having passed through the CF $301_1$, and the threshold setting unit $231_1$ supplies the event threshold Vth(1) to the event detecting unit $52_1$ that detects the event of the R pixel $51_1$. In addition, the threshold setting unit $231_2$ sets an event threshold Vth(2) used to detect the event of the pixel $51_2$ (hereinafter, also referred to as a Gr pixel $51_2$) that receives the Gr light having passed through the CF $301_2$, and the threshold setting unit $231_2$ supplies the event threshold Vth(2) to the event detecting unit $52_2$ that detects the event of the Gr pixel $51_2$. Further, the threshold setting unit $231_3$ sets an event threshold Vth(3) used to detect the event of the pixel $51_3$ (hereinafter, also referred to as a Gb pixel $51_3$) that receives the Gb light having passed through the CF $301_3$, and the threshold setting unit $231_3$ supplies the event threshold Vth(3) to the event detecting unit $52_3$ that detects the event of the Gb pixel $51_3$. In addition, the threshold setting unit $231_4$ sets an event threshold Vth(4) used to detect the event of the pixel $51_4$ (hereinafter, also referred to as a B pixel $51_4$) that receives the B light having passed through the CF $301_4$, and the threshold setting unit $231_4$ supplies the event threshold Vth(4) to the event detecting unit $52_4$ that detects the event of the B pixel $51_4$.

Figure 21:
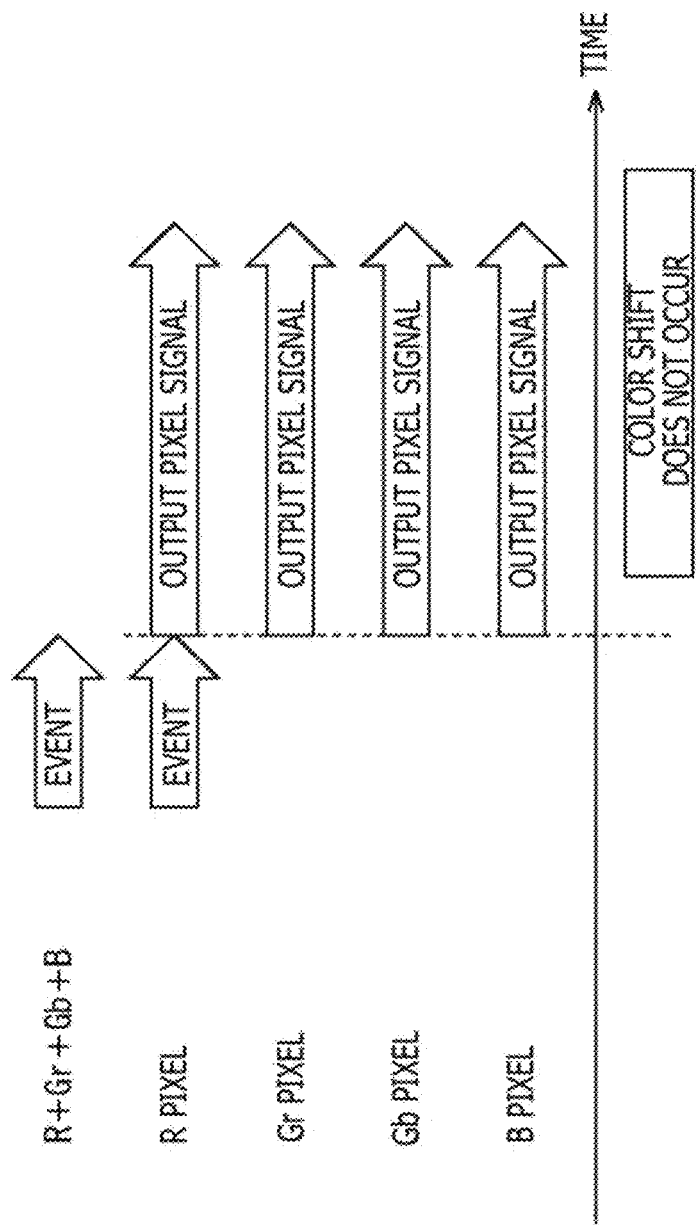
FIG. 21 is a diagram describing detection of an event and output of pixel signals in a case where the CFs $301k$ in the Bayer array are adopted as the optical filters $221k$.

FIG. 21 is a diagram describing detection of an event and output of pixel signals in the case where the CFs $301_k$ of the Bayer array are adopted as the optical filters $221_k$.

The pixel block 41 includes the R pixel $51_1$, the Gr pixel $51_2$, the Gb pixel $51_3$, and the B pixel $51_4$ corresponding to the repeating unit of the CFs $301_k$ of the Bayer array. Further, in a case where events of one or more pixels $51_k$ among the R pixel $51_1$, the Gr pixel $51_2$, the Gb pixel $51_3$, and the B pixel $51_4$ included in the pixel block 41 are detected in the pixel block 41, the pixel signals of all of the R pixel $51_1$, the Gr pixel $51_2$, the Gb pixel $51_3$, and the B pixel $51_4$ included in the pixel block 41 are output (to the VSL) after the exposure time.

In FIG. 21, an event of the R pixel $51_1$ is detected, and the pixel signals of all of the R pixel $51_1$, the Gr pixel $51_2$, the Gb pixel $51_3$, and the B pixel $51_4$ included in the pixel block 41 including the R pixel $51_1$ are output.

In this way, the pixel block 41 includes the R pixel $51_1$, the Gr pixel $51_2$, the Gb pixel $51_3$, and the B pixel $51_4$ corresponding to the repeating unit of the CFs $301_k$ of the Bayer array, and in the case where events of one or more pixels $51_k$ among the R pixel $51_1$, the Gr pixel $51_2$, the Gb pixel $51_3$, and the B pixel $51_4$ are detected, the pixel signals of all of the R pixel $51_1$, the Gr pixel $51_2$, the Gb pixel $51_3$, and the B pixel $51_4$ included in the pixel block 41 are output.

This can reproduce the coloring of the subject from which the pixels $51_k$ with the occurrence of events have received the light (subject light).

That is, to use the pixel signals to generate the frame data for reproducing the coloring of the subject in the case where the CFs $301_k$ of the Bayer array are adopted as the optical filters $221_k$, the pixel signals of all of the R pixel $51_1$, the Gr pixel $51_2$, the Gb pixel $51_3$, and the B pixel $51_4$ corresponding to the repeating unit of the CFs $301_k$ of the Bayer array are necessary.

Therefore, in a case where, for example, an event of the R pixel $51_1$ is detected and where only the pixel signal of the R pixel $51_1$ with the detected event is output, the coloring cannot be reproduced in the frame data, and color shift occurs.

By providing the pixel block 41 including the pixels $51_1$ to $51_4$ corresponding to the repeating unit and outputting the pixel signals of the pixels $51_1$ to $51_4$ corresponding to the repeating unit even in a case where an event occurs in any one of the pixels $51_1$ to $51_4$, the coloring of the subject can be reproduced in the frame data, and the occurrence of color shift can be suppressed.

Incidentally, in the case where the CFs $301_k$ of the Bayer array are adopted as the optical filters $221_k$, the detection of an event in which the sum of the changes in the photocurrent corresponding to the R light, the Gr light, the Gb light, and the B light received by the pixels $51_1$ to $51_4$, respectively, exceeds the event threshold as in FIG. 3 is equivalent to the detection of an event in which the photocurrent corresponding to white light exceeds the event threshold, that is, the detection of an event without the CFs 301.

<Adjustment of Gains by Setting Event Thresholds Vth(k)>

Figure 22:
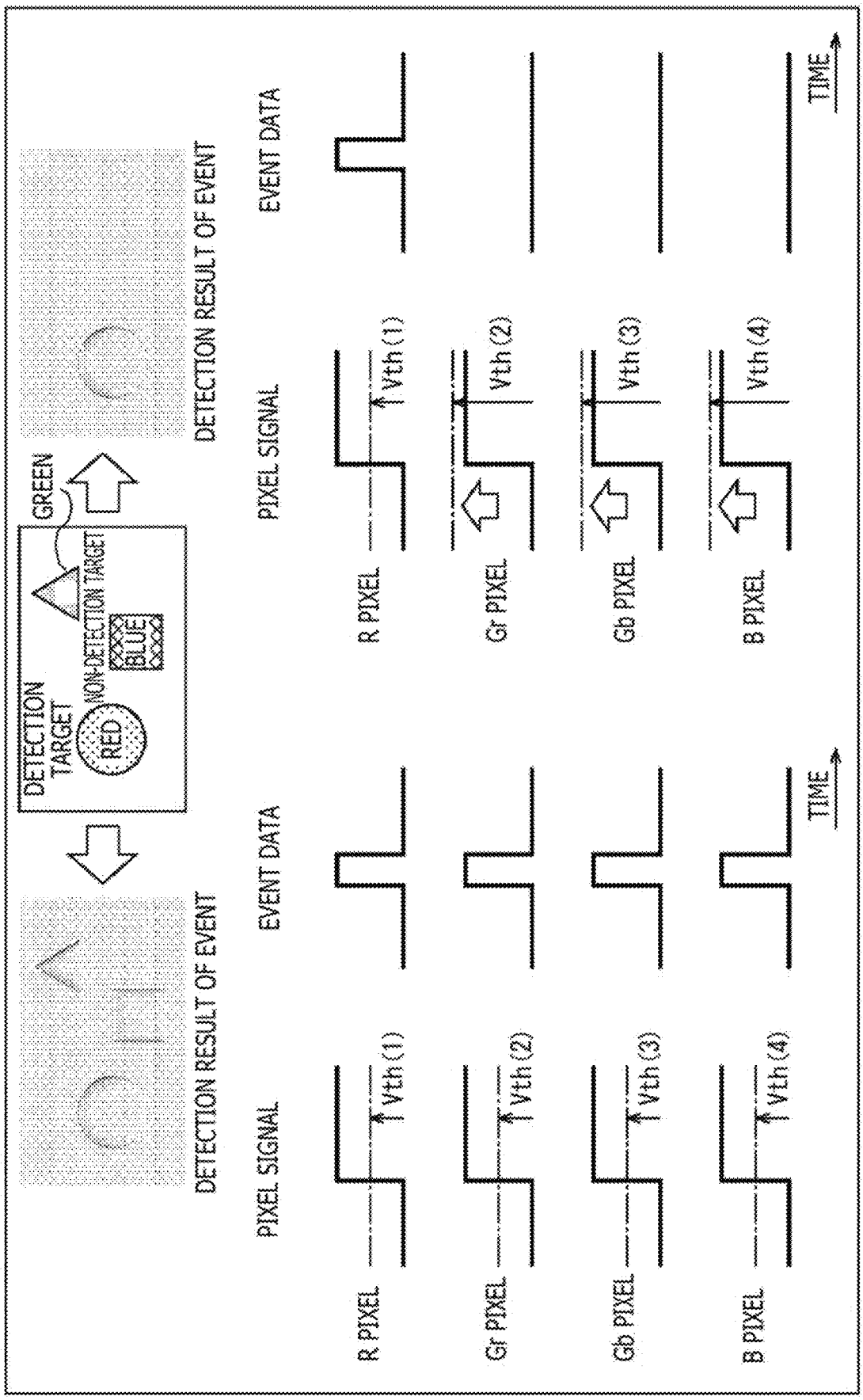
FIG. 22 is a diagram describing that gains of the event detecting units $52k$ are adjusted by setting event thresholds Vth(k).

FIG. 22 is a diagram describing that the gains of the event detecting units $52_k$ are adjusted (substantially adjusted) by setting the event thresholds Vth(k).

For example, it is assumed now that the R pixel $51_1$, the Gr pixel $51_2$, the Gb pixel $51_3$, and the B pixel $51_4$ have the same sensitivity for the R light, the Gr light, the Gb light, and the B light, respectively, and the same pixel signals (photovoltage corresponding to photocurrent) are generated in a case where the same amounts of R light, Gr light, Gb light, and B light are received.

In a case where the sensor chip 200 including the CFs $301_k$ of the Bayer array as the optical filters $221_k$ images a scene including a red moving body, a green moving body, and a blue moving body of the same luminance in a foreground, the pixel signals of the pixels 51 receiving the light of the contour parts of the moving bodies change by the same (substantially the same) amount.

That is, the pixel signal of the R pixel $51_1$ receiving the light of the contour part of the red moving body, the pixel signals of the Gb pixel $51_2$ and the Gr pixel $51_3$ receiving the light of the contour part of the green moving body, and the pixel signal of the B pixel $51_4$ receiving the light of the contour part of the blue moving body change by the same amount.

Therefore, in a case where the event thresholds Vth(1) to Vth(4) cannot be set for the R light, the Gr light, the Gb light, and the B light, respectively, so that the event thresholds Vth(1) to Vth(4) are fixed at predetermined certain values, events are detected for all of the R pixel $51_1$ receiving the light of the contour part of the red moving body, the Gb pixel $51_2$ and the Gr pixel $51_3$ receiving the light of the contour part of the green moving body, and the B pixel $51_4$ receiving the light of the contour part of the blue moving body as depicted on the left side of FIG. 22. Event data in the H level is output (or an event is not detected for any of the R pixel $51_1$ receiving the light of the contour part of the red moving body, the Gb pixel $51_2$ and the Gr pixel $51_3$ receiving the light of the contour part of the green moving body, and the B pixel $51_4$ receiving the light of the contour part of the blue moving body).

In this way, in the case where the R pixel $51_1$, the Gr pixel $51_2$, the Gb pixel $51_3$, and the B pixel $51_4$ have the same sensitivity for the R light, the Gr light, the Gb light, and the B light, respectively, and the event thresholds Vth(1) to Vth(4) are fixed at predetermined certain values, the events are detected for the moving bodies of all colors including the red moving body, the green moving body, and the blue moving body of the same luminance (or the event is not detected).

On the other hand, in a case where the event thresholds Vth(1) to Vth(4) can be set for the R light, the Gr light, the Gb light, and the B light, respectively, the event threshold Vth(1) is set to a predetermined default value, and the event thresholds Vth(2) to Vth(4) are set to values greater than the default value as depicted on the right side of FIG. 22, for example. As a result, the event is detected for the R pixel $51_1$ receiving the light of the contour part of the red moving body, and the event data in the H level is output. The events are not detected for the Gb pixel $51_2$ and the Gr pixel $51_3$ receiving the light of the contour part of the green moving body and the B pixel $51_4$ receiving the light of the contour part of the blue moving body.

Therefore, by setting the event thresholds Vth(1) to Vth(4) for the R light, the Gr light, the Gb light, and the B light, respectively, the sensitivity for the light of specific colors of the pixels 51 is substantially adjusted, and the gains of the event detecting units 52 that detect the events of the light of specific colors (changes in pixel signals corresponding to specific light) can be adjusted.

For example, as described above, the event threshold Vth(1) is set to the predetermined default value, and the event thresholds Vth(2) to Vth(4) are set to values greater than the default value. As a result, the event is detected for the R pixel $51_1$ receiving the light of the contour part of the red moving body, and the events are not detected for the Gb pixel $51_2$ and the Gr pixel $51_3$ receiving the light of the contour part of the green moving body and the B pixel $51_4$ receiving the light of the contour part of the blue moving body.

Therefore, in a case where the sensor chip 200 is applied to detect an object, the event thresholds used to detect the events of the light of the colors of non-detection targets that are objects other than the detection target of the detection are set to large values when the colors of the non-detection targets are recognized in advance, and this can suppress the detection of the events that are unnecessary noise when the non-detection targets are imaged.

On the other hand, the event threshold used to detect the event of the light of the color of the detection target is set to a small value when the color of the detection target is recognized in advanced, and this can easily detect the event when the detection target is imaged.

Figure 23:
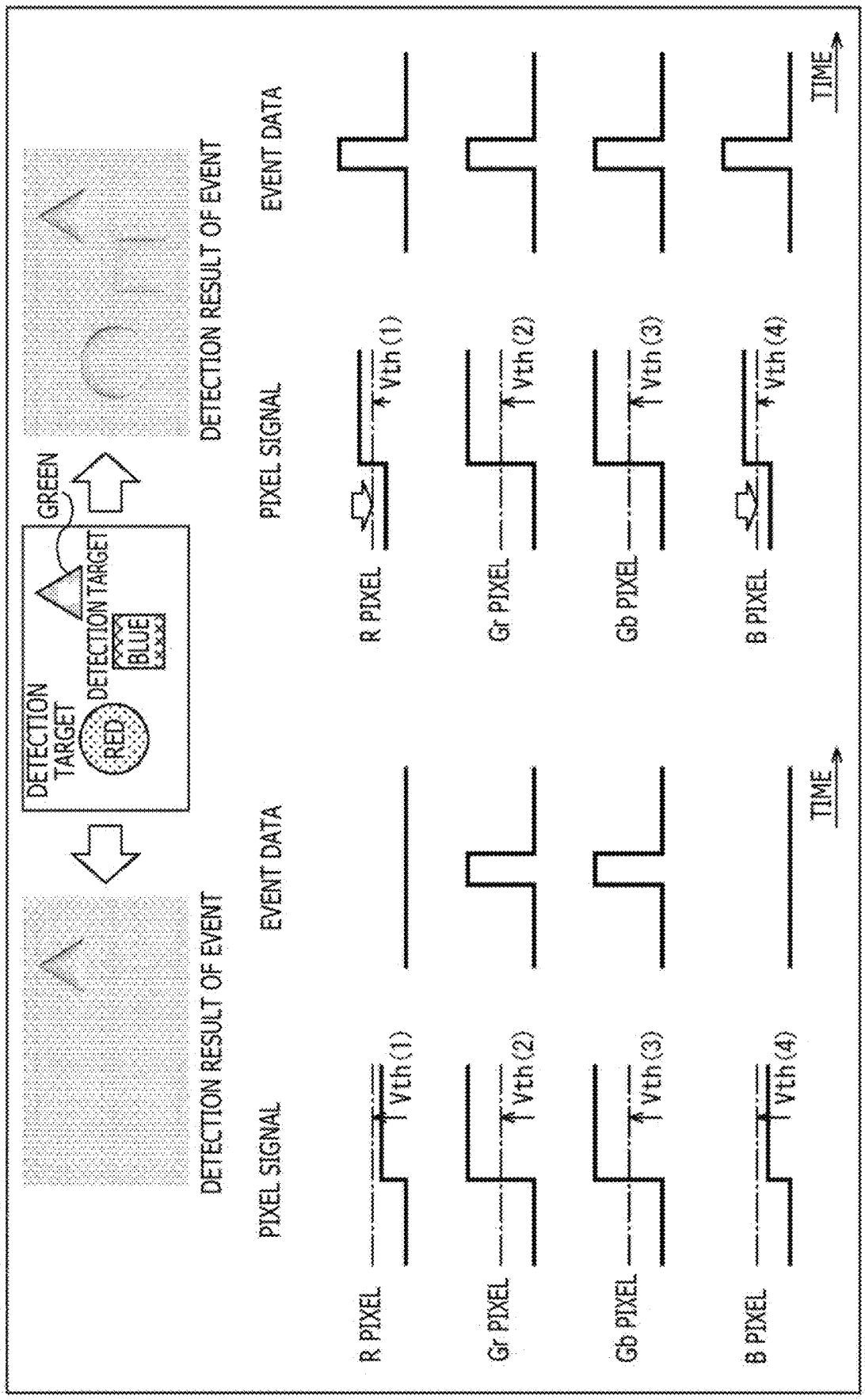
FIG. 23 is a diagram describing that the gains of the event detecting units $52k$ are adjusted by setting the event thresholds Vth(k).

FIG. 23 is a diagram describing that the gains of the event detecting units $52_k$ are adjusted by setting the event thresholds Vth(k).

For example, it is assumed now that the R pixel $51_1$, the Gr pixel $51_2$, the Gb pixel $51_3$, and the B pixel $51_4$ have different sensitivities for the R light, the Gr light, the Gb light, and the B light, respectively.

In this case, even if the red moving body, the green moving body, and the blue moving body have the same luminance when the sensor chip 200 including the CFs $301_k$ of the Bayer array as the optical filters $221_k$ images the scene including the red moving body, the green moving body, and the blue moving body in the foreground, the amount of change in the pixel signal of the pixel 51 receiving the light of the contour part of the respective moving bodies varies according to the sensitivity of the pixel 51 as depicted on the left side in FIG. 23.

That is, the amounts of change in the pixel signal of the R pixel $51_1$ receiving the light of the contour part of the red moving body, the pixel signals of the Gb pixel $51_2$ and the Gr pixel $51_3$ receiving the light of the contour part of the green moving body, and the pixel signal of the B pixel $51_4$ receiving the light of the contour part of the blue moving body are not the same.

For example, in a case where the sensitivity of the Gr pixel $51_2$ and the Gb pixel $51_3$ (with respect to the G light) is high, and the sensitivity of the R pixel $51_1$ (with respect to the R light) and the sensitivity of the B pixel $51_4$ (with respect to the B light) are low, the changes in the pixel signals of the Gr pixel $51_2$ and the Gb pixel $51_3$ are large, and the changes in the pixel signals of the R pixel $51_1$ and the B pixel $51_4$ are small.

Therefore, in the case where the event thresholds Vth(1) to Vth(4) cannot be set for the R light, the Gr light, the Gb light, and the B light, respectively, so that the event thresholds Vth(1) to Vth(4) are fixed at predetermined certain values, the events are detected for the Gb pixel $51_2$ and the Gr pixel $51_3$ receiving the light of the contour part of the green moving body, and the event data in the H level is output as depicted on the left side of FIG. 23. However, the events are not detected for the R pixel $51_1$ receiving the light of the contour part of the red moving body and the B pixel $51_4$ receiving the light of the contour part of the blue moving body.

In this way, in the case where the R pixel $51_1$, the Gr pixel $51_2$, the Gb pixel $51_3$, and the B pixel $51_4$ have different sensitivities for the R light, the Gr light, the Gb light, and the B light, respectively, and the event thresholds Vth(1) to Vth(4) are fixed at predetermined certain values, the events are detected in some cases and not detected in other cases depending on the color of the moving body even if the moving bodies have the same luminance.

On the other hand, in the case where the event thresholds Vth(1) to Vth(4) can be set for the R light, the Gr light, the Gb light, and the B light, respectively, the event thresholds Vth(2) and Vth(3) are set to predetermined default values, and the event thresholds Vth(1) and Vth(4) are set to values smaller than the default values as depicted on the right side of FIG. 23, for example. As a result, the events are detected for the Gb pixel $51_2$ and the Gr pixel $51_3$ with high sensitivity and for the R pixel $51_1$ and the B pixel $51_4$ with low sensitivity, and the event data in the H level is output.

Therefore, by setting the event thresholds Vth(1) to Vth(4) for the R light, the Gr light, the Gb light, and the B light, respectively, the sensitivity for the light of specific colors of the pixels 51 is substantially adjusted, and the gains of the event detecting units 52 that detect the events of the light of specific colors can be adjusted.

In this way, by setting the event thresholds Vth(1) to Vth(4) for the R light, the Gr light, the Gb light, and the B light, respectively, to adjust the gains of the event detecting units 52, the events can be flexibly detected.

For example, a change in the light of a predetermined color can be easily detected (enhanced) (boosted) as an event in the sensor chip 200. Further, this can improve the detection rate of the detection target by suppressing the detection of an unintended event (fake event) due to a slight movement of the background or the like or by facilitating the detection of the event caused by a movement of the detection target of a specific color.

Further, in the case where the sensitivity of the pixels 51 varies for each light at different wavelengths, such as light of R, G, and B, the event thresholds Vth(1) to Vth(4) can be set to detect the events in the same amount of light for the light at each wavelength, and the sensitivity of the pixels 51 receiving the light at each wavelength can be compensated in relation to the detection of the events.

Incidentally, although the pixel block 41 includes the 2×2 pixels 51 corresponding to the repeating unit in the present embodiment, the pixel block 41 can include a plurality of pixels 51 that receives the same type of light, such as light of the same color. In this case, the event detecting unit 52 does not have to be disposed for each pixel 51 in the pixel block 41 as depicted in FIG. 13 and the like, and a plurality of pixels 51 in the pixel block 41 can share one event detecting unit 52 as depicted in FIG. 3. This is because, in the case where the pixel block 41 includes a plurality of pixels 51 that receives the same type of light, the event thresholds used to detect the events of the plurality of pixels 51 are the same.

Further, in the pixel block 41, the transfer transistors 62 of the plural pixels $51_1$ to $51_4$ in the pixel block 41 can be turned on in time division, and the photocurrents of the plural pixels $51_1$ to $51_4$ can be supplied to the event detecting units 52 in time division to detect the events of the plural pixels $51_1$ to $51_4$ in time division. In this case, in the pixel block 41, the plural pixels $51_1$ to $51_4$ in the pixel block 41 can share one event detecting unit 52 as in the case of FIG. 3. Further, in this case, one threshold setting unit 231 can be disposed in the pixel array unit 211 (FIG. 20), and the one threshold setting unit 231 can set the event thresholds Vth(1) to Vth(4) in time division and supply the event thresholds Vth(1) to Vth(4) to one event detecting unit 52 shared by the plural pixels $1_1$ to $51_4$ in the pixel block 41 to thereby adjust the respective gains of the event detecting unit 52 for the R light, the Gr light, the Gb light, and the B light.

Further, in the present embodiment, the Gr light and the Gb light are handled as different types of light, and the event threshold Vth(2) for detecting the event of the Gr light and the event threshold Vth(3) for detecting the event of the Gb light are separately set. However, the Gr light and the Gb light can be handled as the same type of light (G light), and the event threshold Vth(2) and the event threshold Vth(3) can be set to the same value. In this case, the threshold setting unit $231_2$ that sets the event threshold Vth(2) and the threshold setting unit $231_3$ that sets the event threshold Vth(3) can be provided as one threshold setting unit.

<Array of CFs 301>

Figure 24C:
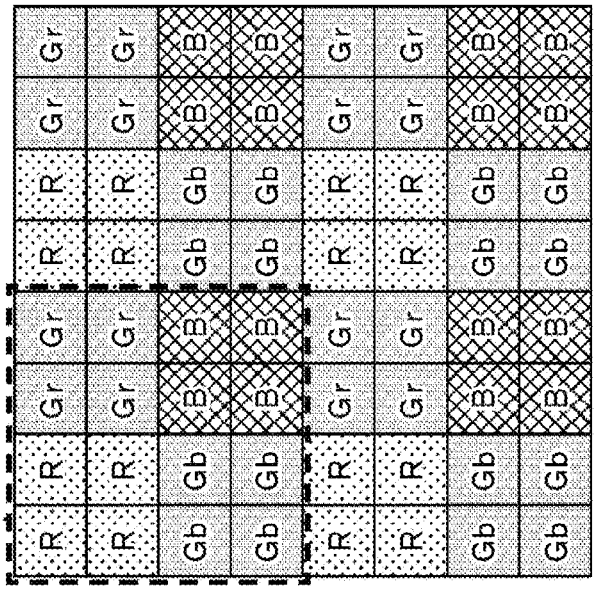
FIGS. 24A, 24B, and 24C depict diagrams each depicting an example of array of the CFs 301.
Figure 24B:
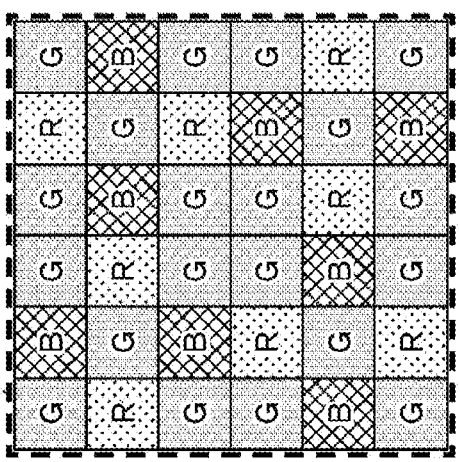
Figure 24A:
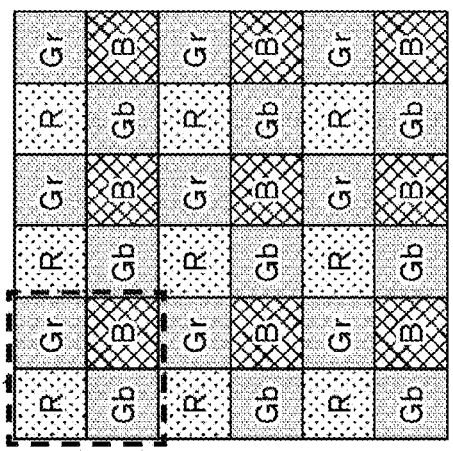

FIGS. 24A, 24B, and 24C depict diagrams each depicting an example of the array of the CFs 301.

Examples of the array of the CFs 301 include arrays depicted in FIGS. 24A, 24B, and 24C. Incidentally, in FIGS. 24A, 24B, and 24C, R represents the CFs 301 that pass the R light, G, Gr, and Gb represent the CFs 301 that pass the G light, and B represents the CFs 301 that pass the B light.

FIG. 24A represents a Bayer array with 2×2 repeating units.

FIG. 24B represents an array with 6×6 repeating units. The array of FIG. 23B is adopted in, for example, an image sensor X-Trans CMOS of Fujifilm Corporation.

FIG. 24C represents a quadra array with 4×4 repeating units.

The pixel block 41 can include the pixels 51 corresponding to the repeating units of the CFs 301 in these various types of arrays.

Figure 25:
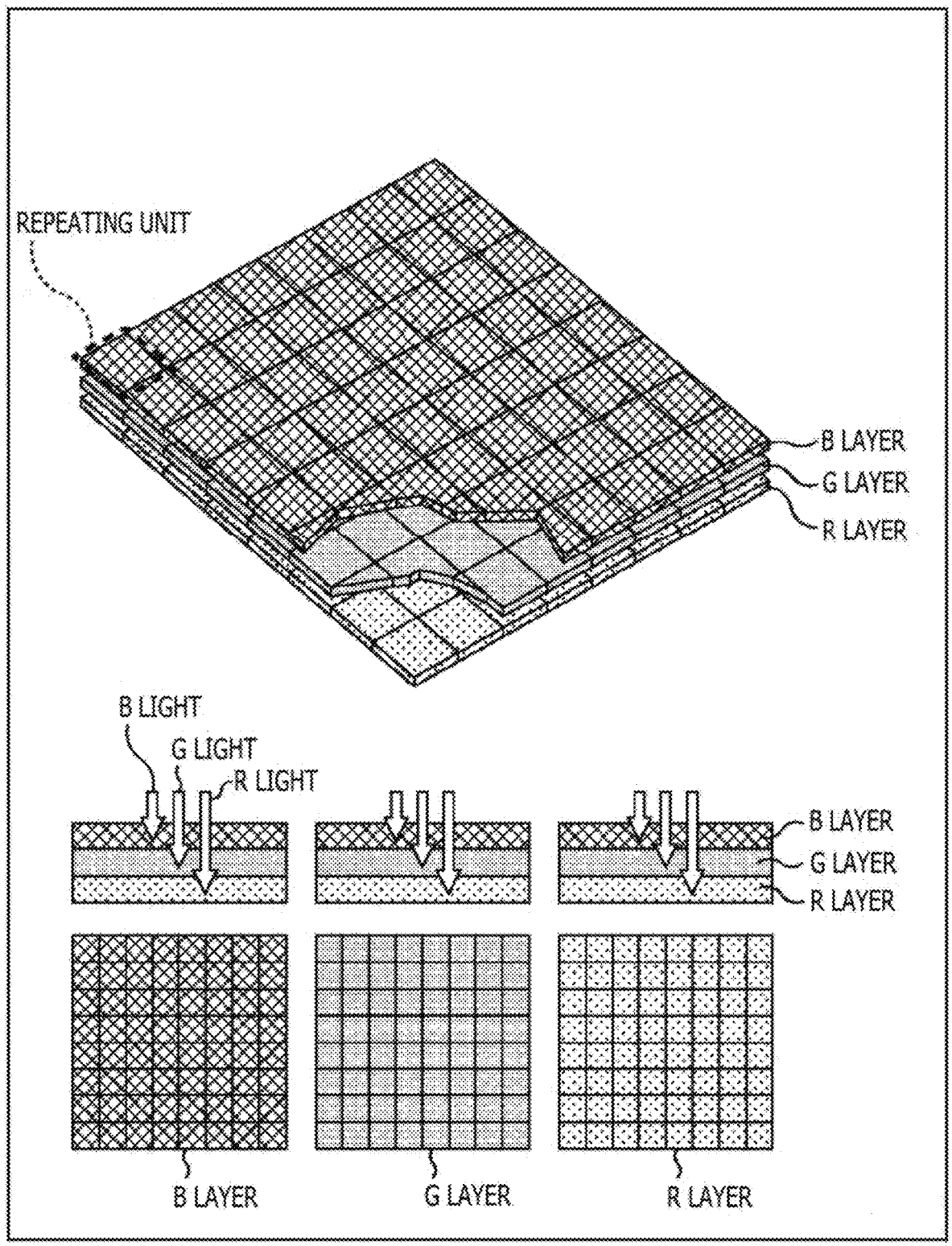
FIG. 25 is a diagram depicting an example of a transmission mechanism that passes light of predetermined colors.

FIG. 25 is a diagram depicting an example of the transmission mechanism that passes light of predetermined colors.

Other than the CFs 301, an example of the transmission mechanism that passes light of predetermined colors includes a layer structure in which the photoelectric conversion elements 61 are arranged in three layers including a B layer, a G layer, and an R layer, and the B layer, the G layer, and the R layer receive the B light, the G light, and the R light, respectively.

In the case where the layer structure is adopted as the transmission mechanism, one pixel can reproduce the colors of R, G, and B. The respective event thresholds can be set for the R light, the G light, and the B light.

The layer structure as a transmission mechanism is adopted in, for example, an image sensor Foveon X3 of Foveon, Inc. It can be perceived that the layer structure as a transmission mechanism includes CFs with 1×1 repeating unit.

<Configuration Example of Pixel Array Unit 211 in Case Where Polarizing Filters $331_k$ Are Adopted as Optical Filters $221_k$>

Figure 26:
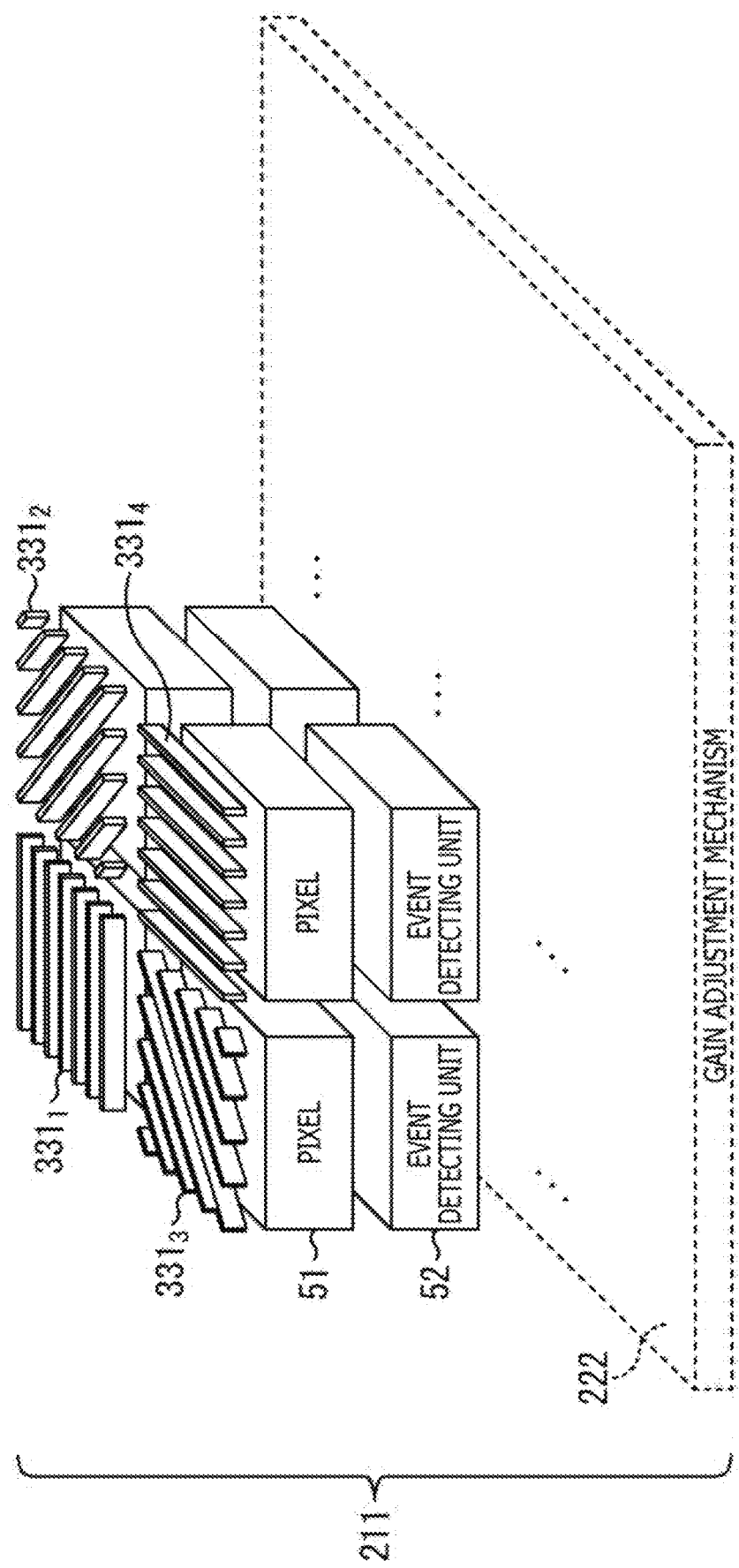
FIG. 26 is a perspective view depicting an overview of a configuration example of the pixel array unit 211 in a case where polarizing filters 331$k$ are adopted as the optical filters 221$k$.

FIG. 26 is a perspective view depicting an overview of a configuration example of the pixel array unit 211 in a case where polarizing filters $331_k$ are adopted as the optical filters $221_k$.

Incidentally, in FIG. 26, the same reference signs are provided to the parts corresponding to the case of FIG. 12, and the description will be appropriately skipped.

In FIG. 26, polarizing filters $331_1$, $331_2$, $331_3$, and $331_4$ are adopted as the optical filters $221_1$, $221_2$, $221_3$, and $221_4$ of FIG. 12.

The polarizing filters $331_k$ are filters that pass light (polarized light) in predetermined polarization directions. For example, the polarizing filter $331_1$ passes light with a polarization direction in a horizontal direction (hereinafter, also referred to as first polarized light), the polarizing filter $331_2$ passes light with a polarization direction in an upper left diagonal direction (hereinafter, also referred to as second polarized light), the polarizing filter $331_3$ passes light with a polarization direction in an upper right diagonal direction (hereinafter, also referred to as third polarized light), and the polarizing filter $331_4$ passes light with a polarization direction in a vertical direction (hereinafter, also referred to as fourth polarized light).

Hereinafter, the polarizing filters $331_1$ to $331_4$ will also be simply referred to as polarizing filters 331 in a case where the polarizing filters $331_1$ to $331_4$ do not have to be distinguished.

As for the polarizing filters 331, the polarizing filters $331_1$ to $331_4$ in a 2×2 arrangement are set as a repeating unit, and the repeating unit is repeatedly arranged.

<Configuration Example of Pixel Array Unit 211>

Figure 27:
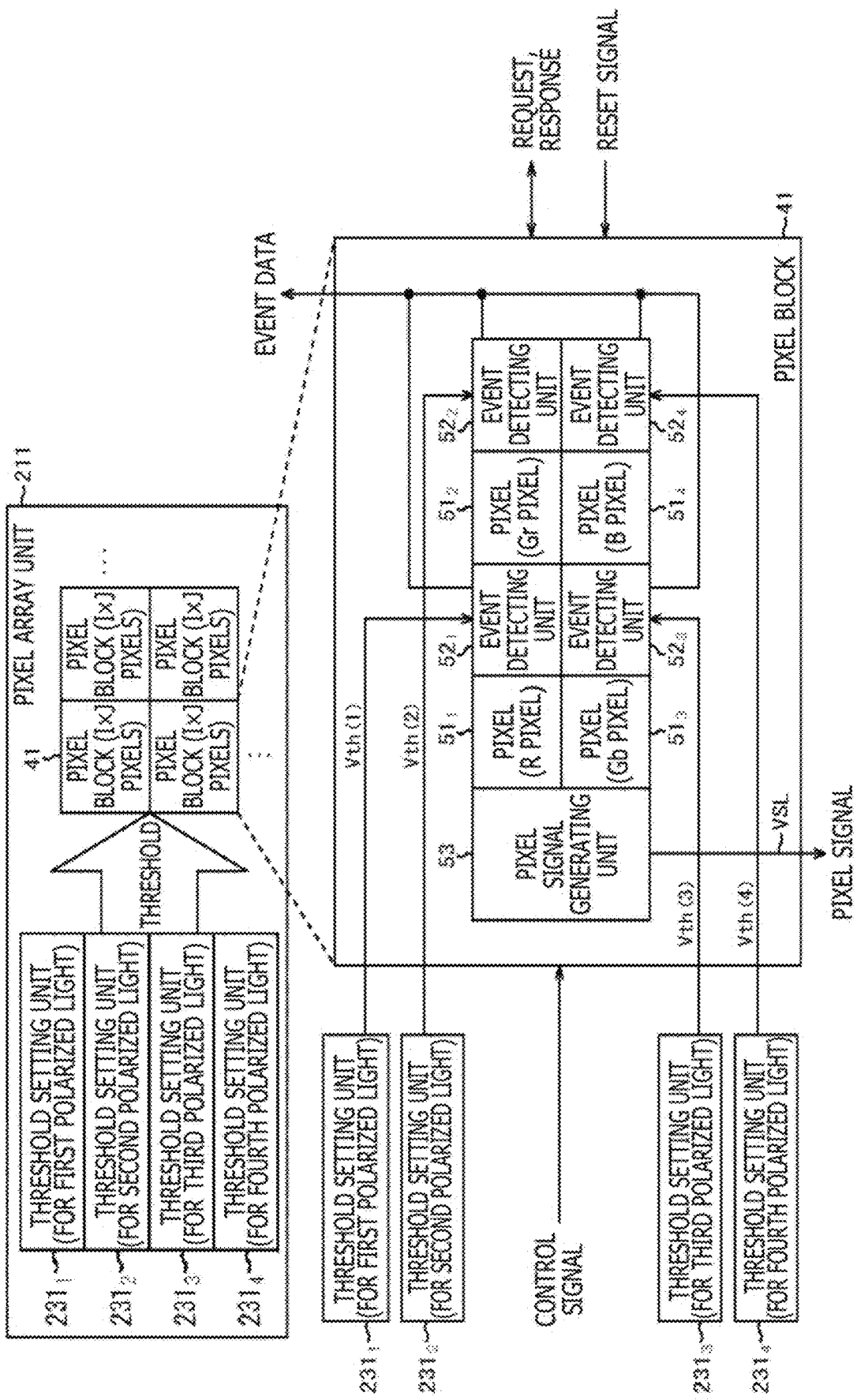
FIG. 27 is a block diagram depicting a configuration example of the pixel array unit 211 in a case where the polarizing filters 331$k$ in a Bayer array are adopted as the optical filters 221$k$.

FIG. 27 is a block diagram depicting a configuration example of the pixel array unit 211 in the case where the polarizing filters $331_k$ are adopted as the optical filters $221_k$.

Incidentally, in FIG. 27, the same reference signs are provided to the parts corresponding to the case of FIG. 13, and the description will be appropriately skipped.

The pixel array unit 211 includes plural pixel blocks 41 and four threshold setting units $231_1$, $231_2$, $231_3$, and $231_4$ corresponding to the light (types of light) passing through the polarizing filters 331 as 2×2 optical filters 221 that are a repeating unit. The pixel block 41 includes, for example, plural pixels $51_1$, $51_2$, $51_3$, and $51_4$ that are 2×2 pixels 51 corresponding to the repeating unit, the event detecting units $52_k$ disposed for the pixels $51_k$, respectively, and the pixel signal generating unit 53. In addition, the VSL for connecting the pixel block 41 and the ADC of the AD conversion unit 34 is wired on each column of the pixel blocks 41.

Therefore, the configuration of the pixel array unit 211 in FIG. 27 is similar to the case of FIG. 13.

However, the threshold setting unit $231_1$ sets the event threshold Vth(1) used to detect the event of the pixel $51_1$ that receives the first polarized light having passed through the polarizing filter $331_1$ and supplies the event threshold Vth(1) to the event detecting unit $52_1$ that detects the event of the pixel $51_1$. In addition, the threshold setting unit $231_2$ sets the event threshold Vth(2) used to detect the event of the pixel $51_2$ that receives the second polarized light having passed through the polarizing filter $331_2$ and supplies the event threshold Vth(2) to the event detecting unit $52_2$ that detects the event of the pixel $51_2$. Further, the threshold setting unit $231_3$ sets the event threshold Vth(3) used to detect the event of the pixel $51_3$ that receives the third polarized light having passed through the polarizing filter $331_3$ and supplies the event threshold Vth(3) to the event detecting unit $52_3$ that detects the event of the pixel $51_3$. In addition, the threshold setting unit $231_4$ sets the event threshold Vth(4) used to detect the event of the pixel $51_4$ that receives the fourth polarized light having passed through the polarizing filter $331_4$ and supplies the event threshold Vth(4) to the event detecting unit $52_4$ that detects the event of the pixel $51_4$.

In this way, even in the case where the event thresholds Vth(1) to Vth(4) are set for each polarized light (polarization direction of polarized light) received by the pixels 51, the gains of the event detecting units 52 can be adjusted to flexibly detect the events.

<Another Configuration Example of Quantization Unit 84>

Figure 28:
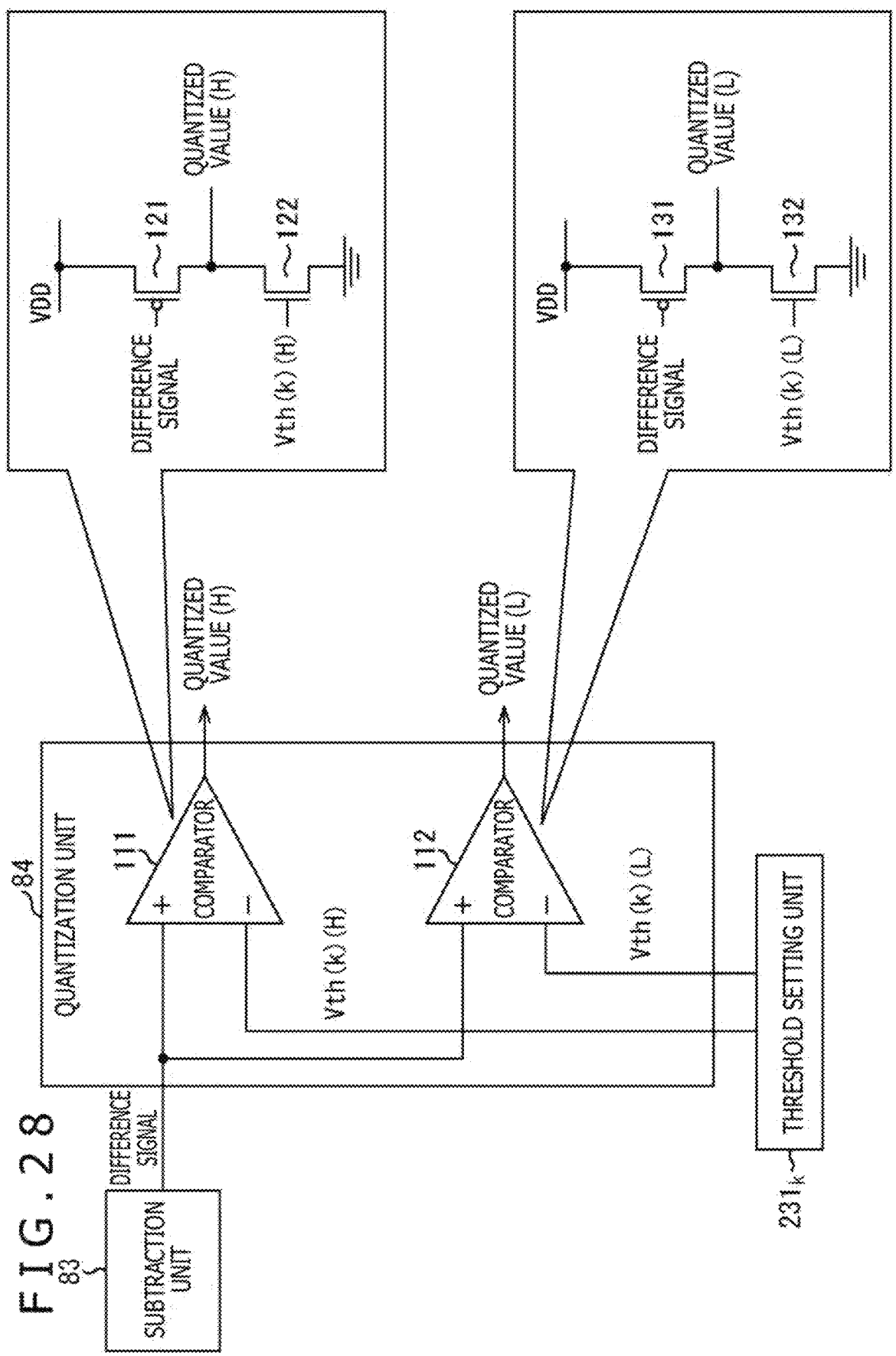
FIG. 28 is a block diagram depicting another configuration example of the quantization unit 84.

FIG. 28 is a block diagram depicting another configuration example of the quantization unit 84 in FIG. 15.

Incidentally, in FIG. 28, the same reference signs are provided to the parts corresponding to the case of FIG. 16, and the description will be appropriately skipped.

In FIG. 28, the quantization unit 84 includes comparators 111 and 112.

Therefore, the quantization unit 84 of FIG. 28 is similar to the case of FIG. 16 in that the quantization unit 84 includes the comparator 111. However, the quantization unit 84 of FIG. 28 is different from the case of FIG. 16 in that the quantization unit 84 additionally includes the comparator 112.

Other than the event, the event detecting unit $52_k$ (FIG. 15) including the quantization unit 84 of FIG. 28 also detects the polarity of the light amount change as an event.

That is, in the case where the quantization unit 84 is configured as depicted in FIG. 28, the threshold setting unit $231k$ includes two DA converters 250 or 260 of FIGS. 17A and 17B, and the two DA converters 250 or 260 set an event threshold Vth(k)(H) for detecting an event with positive polarity and an event threshold Vth(k)(L) (<Vth(k)(H)) for detecting an event with negative polarity. Further, the threshold setting unit $231k$ supplies the event threshold Vth(k)(H) to the comparator 111 and supplies the event threshold Vth(k)(L) to the comparator 112.

In the quantization unit 84 of FIG. 28, the comparator 111 compares the difference signal from the subtraction unit 83 and the event threshold Vth(k)(H) from the threshold setting unit $231_k$ and outputs a quantized value (H) indicating the comparison result to the transfer unit 85. In addition, the comparator 112 compares the difference signal from the subtraction unit 83 and the event threshold Vth(k)(L) from the threshold setting unit 231$_k$ and outputs a quantized value (L) indicating the comparison result to the transfer unit 85.

In a case where the difference signal Vout is greater than the event threshold Vth(k)(H), the transfer unit 85 (FIG. 5) outputs event data (for example, pulse in H level) indicating the occurrence of an event with positive polarity to the output unit 35 according to the quantized value (H) of the quantization unit 84.

Further, in a case where the difference signal Vout is smaller than the event threshold Vth(k) (L), the transfer unit 85 outputs event data (for example, pulse in L level) indicating the occurrence of an event with negative polarity to the output unit 35 according to the quantized value (L) of the quantization unit 84.

Incidentally, the comparator 111 can be provided by, for example, connecting the drain of a PMOS FET 121 including the source connected to the power source VDD and the drain of an NMOS FET 122 including the source connected to the ground as depicted in FIG. 28. In this case, the difference signal can be supplied to the gate of the FET 121, and the event threshold Vth(k)(H) can be supplied to the gate of the FET 122. The voltage at the connection point of the drain of the FET 121 and the drain of the FET 122 can be output as the quantized value (H).

Similarly, the comparator 112 can be provided by, for example, connecting the drain of a PMOS FET 131 including the source connected to the power source VDD and the drain of an NMOS FET 132 including the source connected to the ground as depicted in FIG. 28. In this case, the difference signal can be supplied to the gate of the FET 131, and the event threshold Vth(k)(L) can be supplied to the gate of the FET 132. The voltage at the connection point of the drain of the FET 131 and the drain of the FET 132 can be output as the quantized value (L).

Figure 29A:
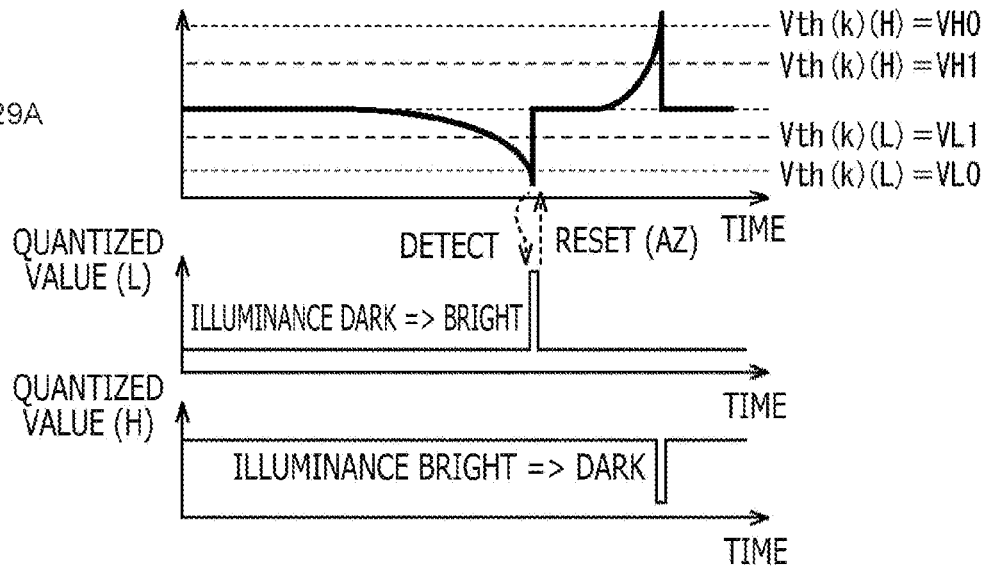
FIGS. 29A and 29B depict diagrams each depicting examples of event thresholds Vth(k)(H) and Vth(k)(L) set by the threshold setting unit 231$k$ and examples of a quantized value (H) and a quantized value (L) output by the quantization unit 84.
Figure 29B:
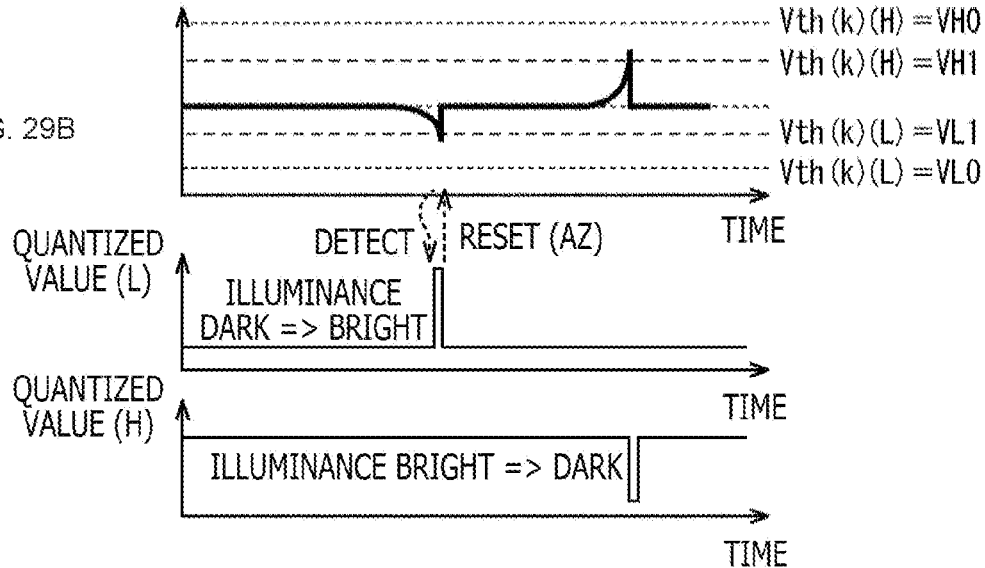

FIGS. 29A and 29B depict diagrams each depicting examples of the event thresholds Vth(k)(H) and Vth(k)(L) set by the threshold setting unit 231k and examples of the quantized value (H) and the quantized value (L) output by the quantization unit 84.

FIG. 29A represents a case in which the event threshold Vth(k)(H) is set to a threshold VH0, and the event threshold Vth(k)(L) is set to a threshold VL0.

FIG. 29B represents a case in which the event threshold Vth(k)(H) is set to a threshold VH1 (<VH0), and the event threshold Vth(k)(L) is set to a threshold VL1 (>VL0).

In a case where, for example, the threshold setting unit 231$_k$ sets the event threshold Vth(k) (H) for detecting the event with positive polarity to the threshold VH0 which is the larger one of the thresholds VH0 and VH1, the threshold setting unit 231$_k$ sets the event threshold Vth(k)(L) for detecting the event with negative polarity to the threshold VL0 which is the smaller one of the thresholds VL0 and VL1.

Further, in a case where, for example, the threshold setting unit 231$_k$ sets the event threshold Vth(k)(H) to the threshold VH1 which is the smaller one of the thresholds VH0 and VH1, the threshold setting unit 231$_k$ sets the event threshold Vth(k)(L) to the threshold VL1 which is the larger one of the thresholds VL0 and VL1.

As depicted in FIG. 29A, in the case where the event thresholds Vth(k)(H) and Vth(k)(L) are set to the thresholds VH0 and VL0, respectively, the quantized value (L) switches from the L level to the H level when the difference signal becomes smaller than the threshold VL0 (when the difference signal is changed such that the luminance becomes bright), and the quantized value (H) switches from the H level to the L level when the difference signal becomes larger than the threshold VH0 (when the difference signal is changed such that the luminance becomes dark). Further, after a predetermined period, the quantized value (L) and the quantized value (H) are reset to the original level.

As depicted in FIG. 29B, in the case where the event thresholds Vth(k)(H) and Vth(k)(L) are set to the thresholds VH1 and VL1, respectively, the quantized value (L) switches from the L level to the H level when the difference signal becomes smaller than the threshold VL1, and the quantized value (H) switches from the H level to the L level when the difference signal becomes larger than the threshold VH1. Further, after a predetermined period, the quantized value (L) and the quantized value (H) are reset to the original level.

For example, in a case of VH1=VH0/2 and VL0=VL1/2, the gain of the event detecting unit 52$_k$ when the event thresholds Vth(k)(H) and Vth(k)(L) are set to the thresholds VH1 and VL1, respectively, is substantially adjusted to two times the gain of the time when the event thresholds Vth(k)(H) and Vth(k)(L) are set to the thresholds VH0 and VL0, respectively.

<Another Configuration Example of Event Detecting Unit 52$_k$>

Figure 30:
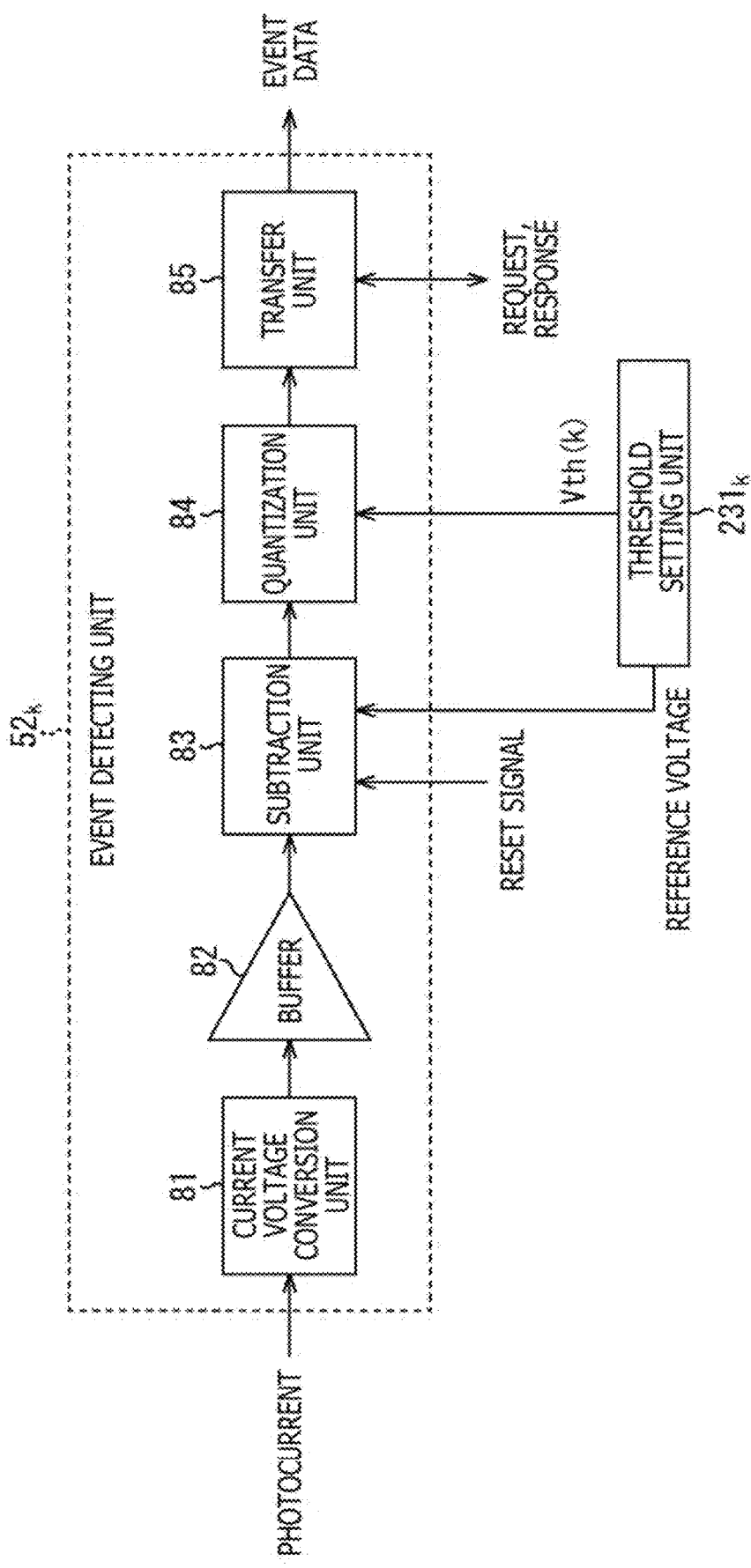
FIG. 30 is a block diagram depicting a configuration example of the event detecting unit 52$k$.

FIG. 30 is a block diagram depicting a configuration example of the event detecting unit 52$_k$ of FIGS. 13 and 14.

Incidentally, in FIG. 30, the same reference signs are provided to the parts corresponding to the case of FIG. 15, and the description will be appropriately skipped.

In FIG. 30, the event detecting unit 52$_k$ includes the current voltage conversion unit 81, the buffer 82, the subtraction unit 83, the quantization unit 84, and the transfer unit 85.

Therefore, the configuration of the event detecting unit 52$_k$ in FIG. 30 is similar to the case of FIG. 15.

However, in FIG. 30, the threshold setting unit 231$_k$ sets the event threshold Vth(k), or instead of setting the event threshold Vth(k), sets a reference voltage as a reference of the difference signal output by the subtraction unit 83 similarly to the case of setting the event threshold Vth(k), and supplies the event threshold Vth(k) or the reference voltage to the subtraction unit 83.

The subtraction unit 83 outputs the difference signal of the voltage based on the reference voltage from the threshold setting unit 231$_k$.

Figure 31:
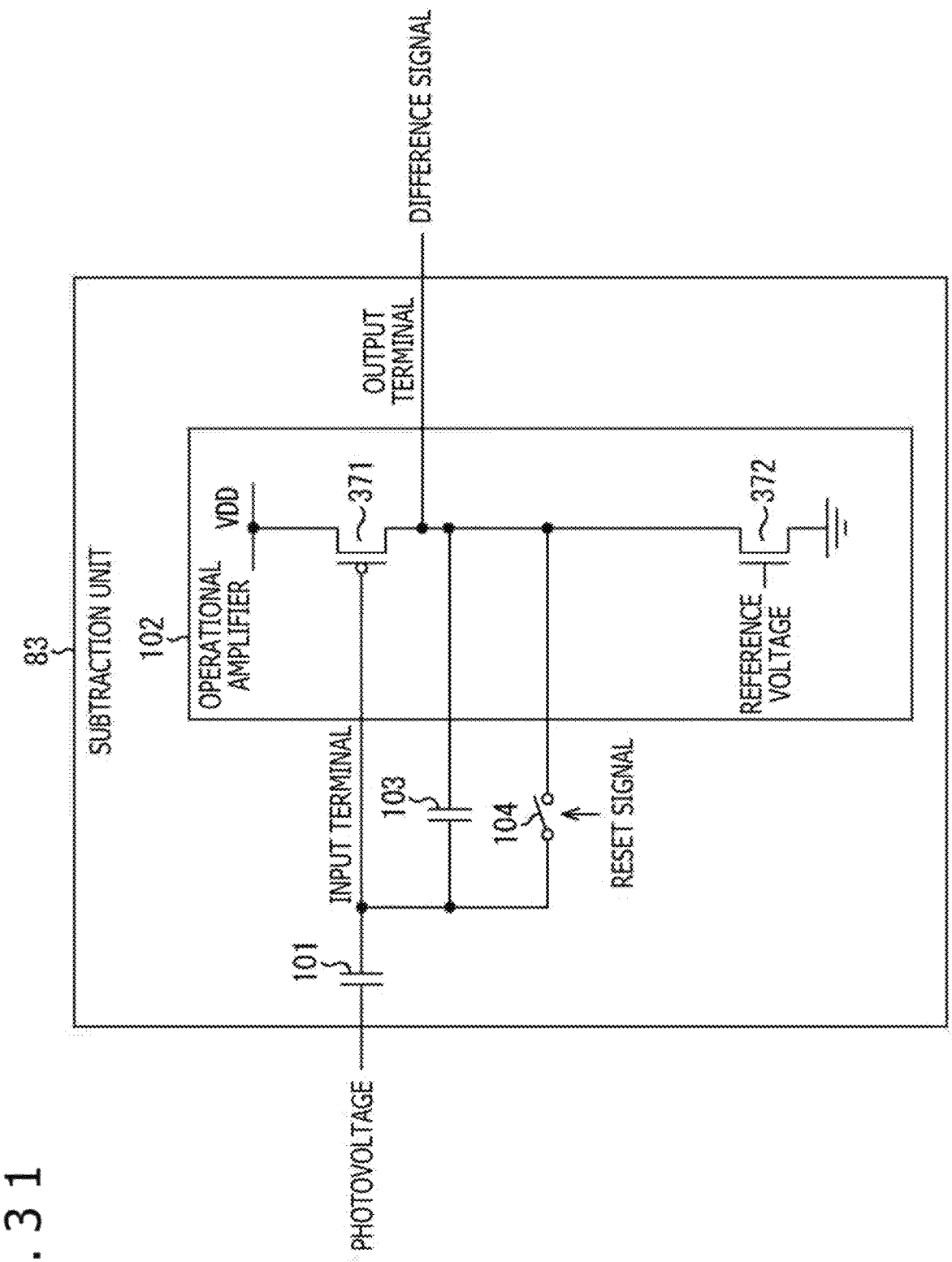
FIG. 31 is a circuit diagram depicting a configuration example of an operational amplifier 102 included in the subtraction unit 83.

FIG. 31 is a circuit diagram depicting a configuration example of the operational amplifier 102 included in the subtraction unit 83 of FIG. 30.

That is, the subtraction unit 83 includes the capacitor 101, the operational amplifier 102, the capacitor 103, and the switch 104 as depicted in FIG. 7. FIG. 31 depicts a configuration example of the operational amplifier 102 of the subtraction unit 83 configured in this way.

In FIG. 31, the operational amplifier 102 is provided by connecting the drain of a PMOS FET 371 including the source connected to the power source VDD and the drain of an NMOS FET 372 including the source connected to the ground. In this case, the gate of the FET 371 is the input terminal of the operational amplifier 102, and the connection point of the drain of the FET 371 and the drain of the FET 372 is the output terminal of the operational amplifier 102.

The reference voltage set by the threshold setting unit 231$_k$ (FIG. 30) is supplied to the gate of the FET 372. In this case, the difference signal based on the reference voltage supplied to the gate of the FET 372 is output from the output terminal of the operational amplifier 102.

Therefore, since the difference signal is offset by changing the reference voltage, an advantageous effect similar to the case of setting the event threshold Vth(k) can be attained based on the setting of the reference voltage. That is, the gain of the event detecting unit $52_k$ can be substantially adjusted.

Incidentally, although the operational amplifier 102 is provided by connecting the drain of the PMOS FET 371 and the drain of the NMOS FET 372 in FIG. 31, the operational amplifier 102 can be provided by a differential pair of transistors. In the case where the operational amplifier 102 is provided by the differential pair of transistors, the photovoltage can be supplied to the inverting input terminal of the operational amplifier 102 via the capacitor 101, and the reference voltage from the threshold setting unit $231_k$ can be supplied to the non-inverting input terminal of the operational amplifier 102.

The pixel array unit 211 including the threshold setting unit $231_k$ has been described above as an example of the gain adjustment mechanism 222. Hereinafter, the pixel array unit 211 including another example of the gain adjustment mechanism 222 will be described.

<Pixel Array Unit 211 Including Another Example of Gain Adjustment Mechanism 222>

Figure 32:
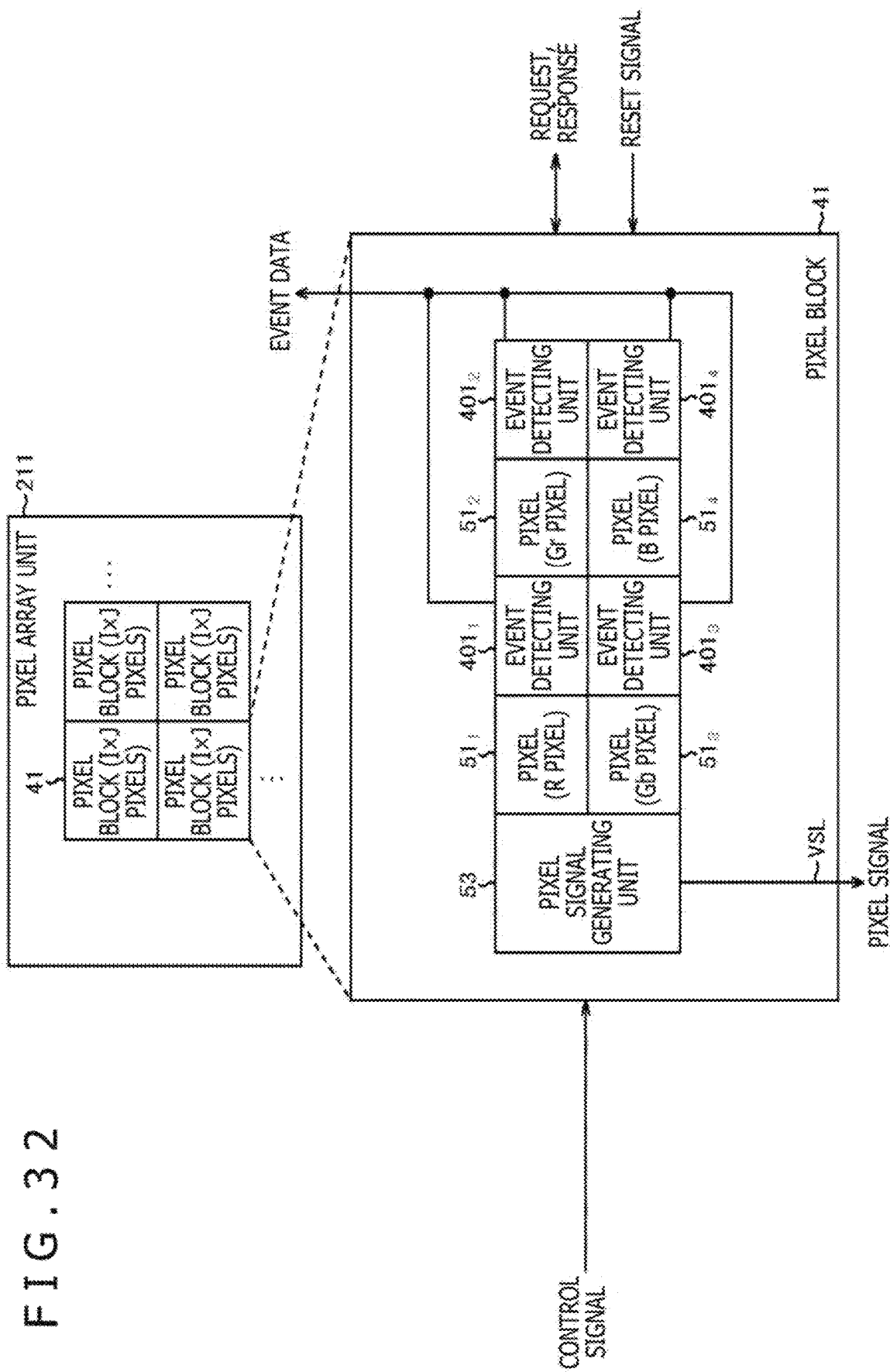
FIG. 32 is a block diagram depicting a configuration example of the pixel array unit 211 including another example of a gain adjustment mechanism 222.

FIG. 32 is a block diagram depicting a configuration example of the pixel array unit 211 including another example of the gain adjustment mechanism 222.

Incidentally, in FIG. 32, the same reference signs are provided to the parts corresponding to the case of FIG. 13, and the description will be appropriately skipped.

In FIG. 32, the pixel array unit 211 includes plural pixel blocks 41. The pixel block 41 includes, for example, plural pixels $51_1$, $51_2$, $51_3$, and $51_4$ that are 2×2 pixels 51 corresponding to the repeating unit of the optical filter 221, event detecting units $401_1$, $401_2$, $401_3$, and $401_4$ disposed for the pixels $51_k$, respectively, and the pixel signal generating unit 53. In addition, the VSL connecting the pixel block 41 and the ADC of the AD conversion unit 34 is wired on each column of the pixel blocks 41.

Therefore, the pixel array unit 211 of FIG. 32 is similar to the case of FIG. 13 in that the pixel array unit 211 includes the plural pixel blocks 41 and that the pixel block 41 includes the pixels $51_1$, $51_2$, $51_3$, and $51_4$ and the pixel signal generating unit 53.

However, the pixel array unit 211 of FIG. 32 is different from the case of FIG. 13 in that the pixel array unit 211 does not include the threshold setting units $231_1$ to $231_4$ and that the pixel block 41 includes the event detecting units $401_k$ in place of the event detecting units $52_k$.

The event detecting units $401_k$ detect the events of the pixels $51_k$ and also function as the gain adjustment mechanism 222, similarly to the event detecting units $52_k$.

<First Configuration Example of Event Detecting Unit $401_k$ That Functions as Gain Adjustment Mechanism 222>

Figure 33:
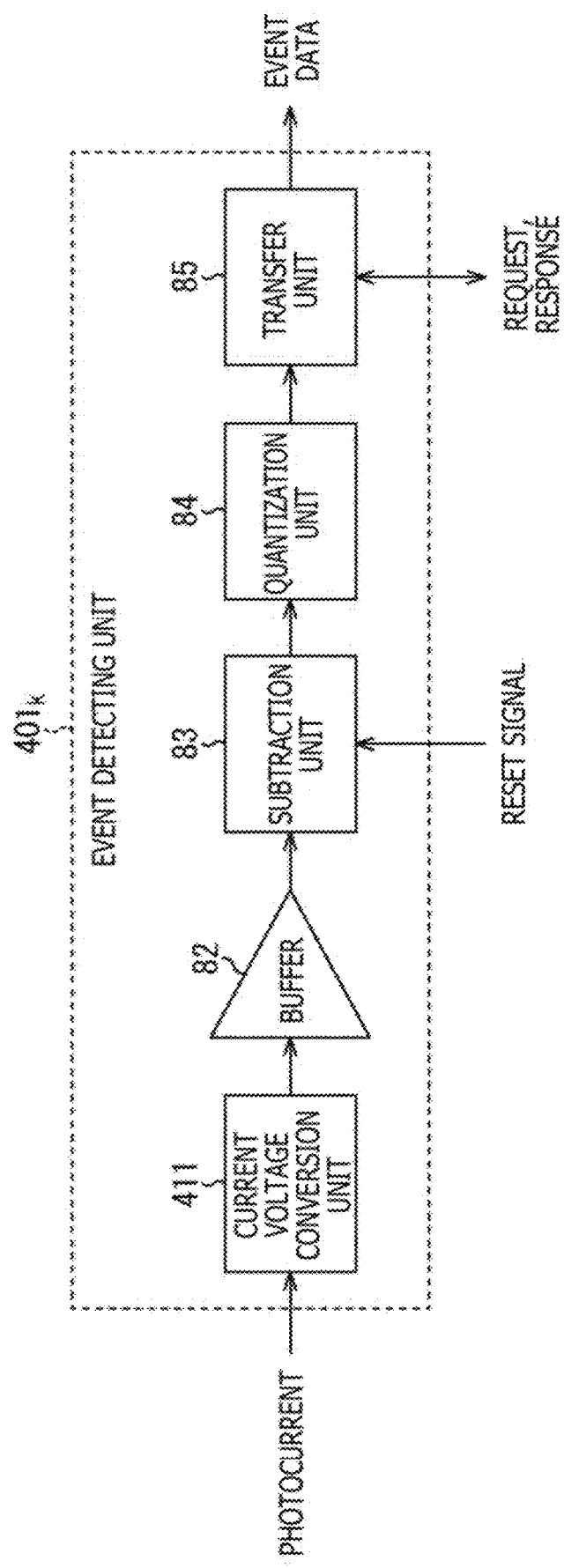
FIG. 33 is a block diagram depicting a first configuration example of an event detecting unit 401$k$ that functions as the gain adjustment mechanism 222.

FIG. 33 is a block diagram depicting a first configuration example of the event detecting unit $401_k$ that functions as the gain adjustment mechanism 222.

Incidentally, in FIG. 33, the same reference signs are provided to the parts corresponding to the event detecting unit 52 of FIG. 5, and the description will be appropriately skipped.

In FIG. 33, the event detecting unit $401_k$ includes the buffer 82, the subtraction unit 83, the quantization unit 84, the transfer unit 85, and a current voltage conversion unit 411.

Therefore, the configuration of the event detecting unit $401_k$ of FIG. 33 is similar to the event detecting unit 52 of FIG. 5 in that the event detecting unit $401_k$ includes the components from the buffer 82 to the transfer unit 85. However, the event detecting unit $401_k$ is different from the event detecting unit 52 in that the event detecting unit $401_k$ includes the current voltage conversion unit 411 in place of the current voltage conversion unit 81.

Figure 34:
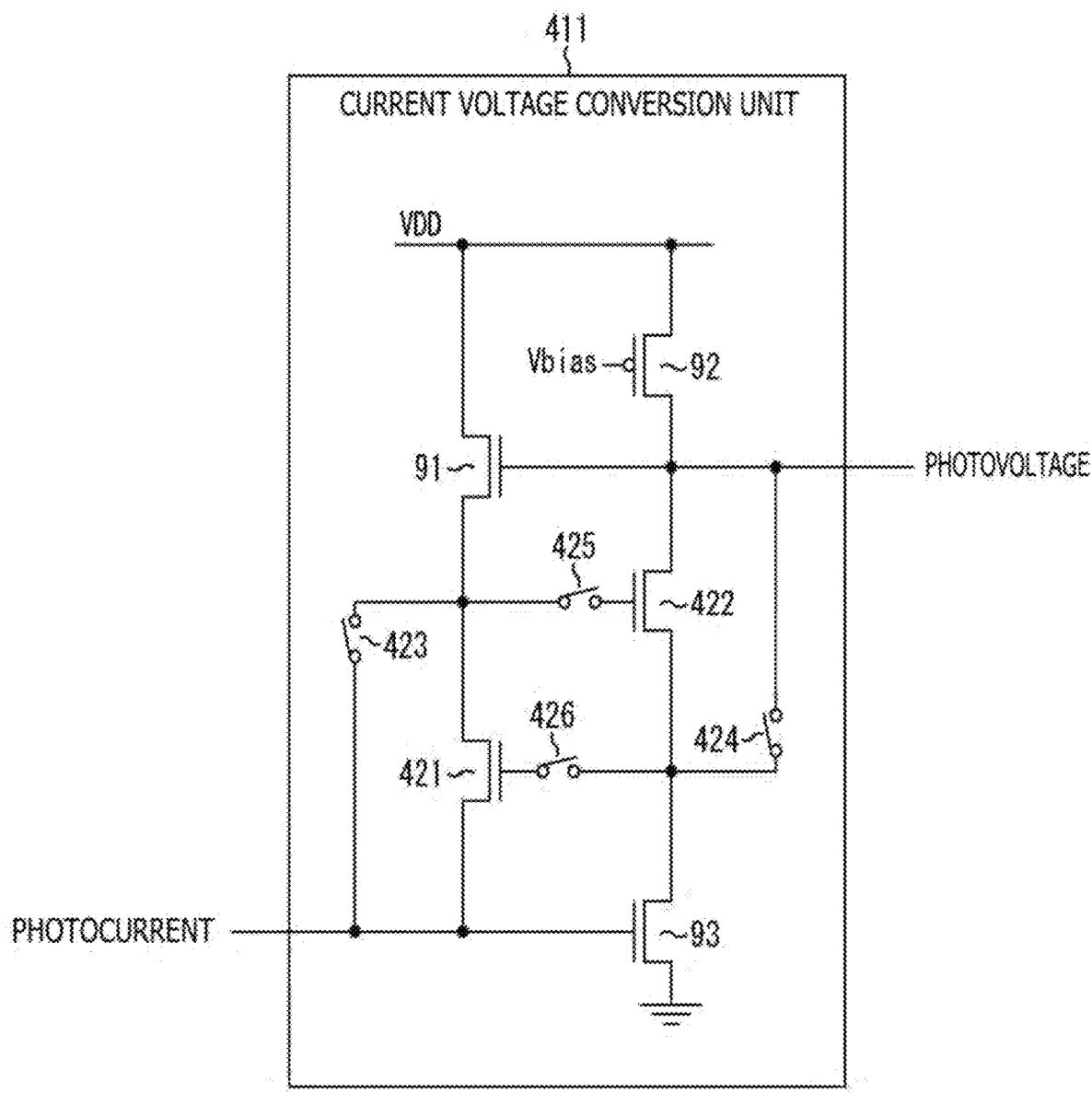
FIG. 34 is a circuit diagram depicting a configuration example of a current voltage conversion unit 411.

FIG. 34 is a circuit diagram depicting a configuration example of the current voltage conversion unit 411 in FIG. 33.

Incidentally, in FIG. 34, the same reference signs are provided to the parts corresponding to FIG. 6, and the description will be appropriately skipped.

The current voltage conversion unit 411 includes the transistors 91 to 93, transistors 421 and 422, and switches 423, 424, and 425.

Therefore, the current voltage conversion unit 411 of FIG. 34 is similar to the current voltage conversion unit 81 of FIG. 6 in that the current voltage conversion unit 411 includes the transistors 91 to 93. However, the current voltage conversion unit 411 is different from the current voltage conversion unit 81 in that the current voltage conversion unit 411 additionally includes the transistors 421 and 422 and the switches 423 to 425.

The transistors 421 and 422 can be, for example, N-type MOS FETs, similarly to the transistors 91 and 93.

The drain of the transistor 421 is connected to the source of the transistor 91, and the gate of the transistor 421 is connected to the drain of the transistor 93 via the switch 426. The source of the transistor 421 is connected to the gate of the transistor 93, and the photocurrent from the pixel 51 is supplied to the connection point of the source of the transistor 421 and the gate of the transistor 93.

The drain of the transistor 422 is connected to the connection point of the gate of the transistor 91 and the drain of the transistor 92, and the gate of the transistor 422 is connected to the connection point of the source of the transistor 91 and the drain of the transistor 421 via the switch 425. The source of the transistor 422 is connected to the drain of the transistor 93.

The switch 423 is connected to the drain and the source of the transistor 421 to turn on/off the connection between the drain and the source of the transistor 421.

The switch 424 is connected to the drain and the source of the transistor 422 to turn on/off the connection between the drain and the source of the transistor 422.

The switch 425 is connected to the connection point of the source of the transistor 91 and the drain of the transistor 421 and to the gate of the transistor 422 such as to turn on/off the connection between the connection point of the source of the transistor 91 and the drain of the transistor 421 and the gate of the transistor 422.

The switch 426 is connected to the gate of the transistor 421 and to the connection point of the drain of the transistor 93 and the source of the transistor 422 such as to turn on/off the connection between (a) the gate of the transistor 421 and (b) the connection point of the drain of the transistor 93 and the source of the transistor 422.

In the current voltage conversion unit 411 configured in this way, the photocurrent supplied to the connection point of the gate of the transistor 93 and the source of the transistor 421 is converted into photovoltage corresponding to the logarithm of the photocurrent. Further, the photovoltage is output from the connection point of the gate of the transistor 91 and the drain of the transistor 422.

Figure 35B:
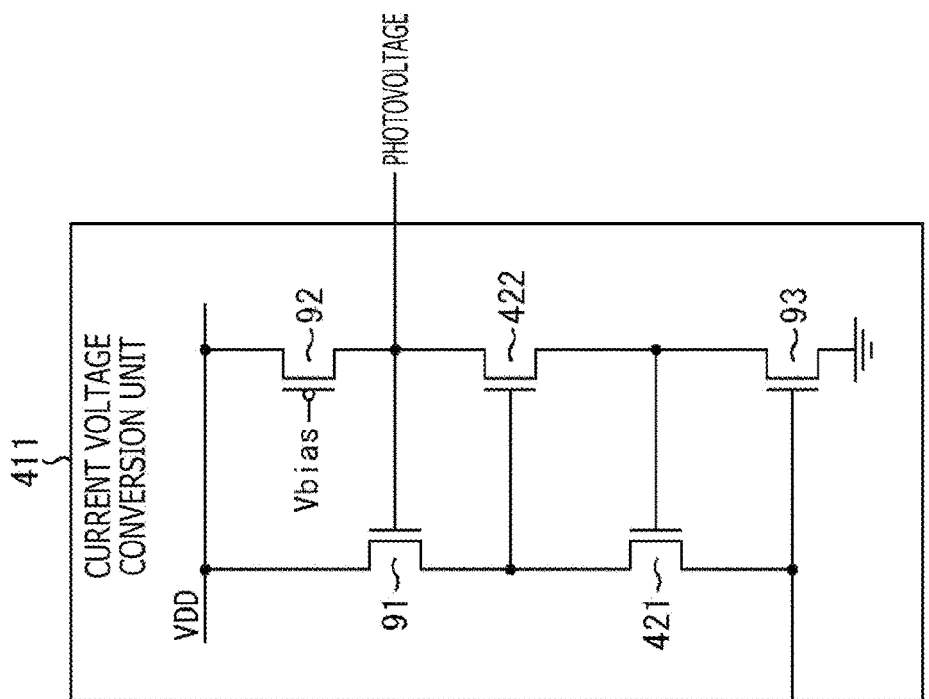
FIGS. 35A and 35B depict diagrams each describing an adjustment method of the gain of the event detecting unit 401$k$ performed by the current voltage conversion unit 411.
Figure 35A:
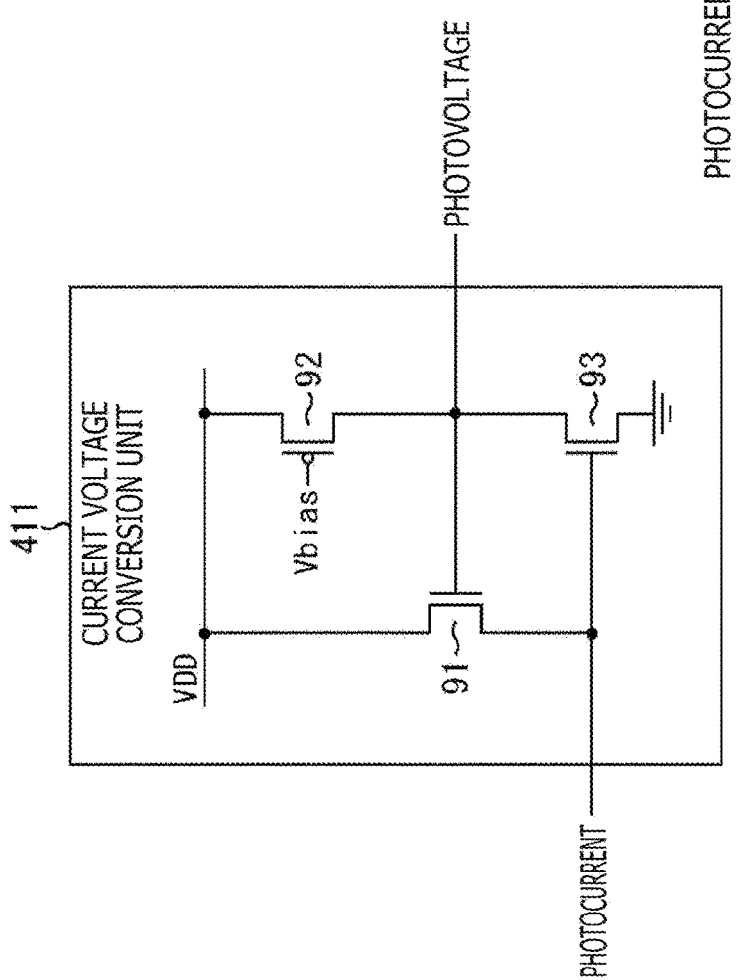

FIGS. 35A and 35B depict diagrams each describing an adjustment method of the gain of the event detecting unit $401k$ performed by the current voltage conversion unit 411 of FIG. 34.

In a case where the switches 423 and 424 are turned on or off in the current voltage conversion unit 411, the switches 425 and 426 are turned off or on, respectively, to adjust the gain of the event detecting unit $401_k$.

FIG. 35A depicts a substantial circuit configuration of the current voltage conversion unit 411 in a case where the switches 423 and 424 are turned on, and the switches 425 and 426 are turned off.

FIG. 35B depicts a substantial circuit configuration of the current voltage conversion unit 411 in a case where the switches 423 and 424 are turned off, and the switches 425 and 426 are turned on.

In the case where the switches 423 and 424 are turned on, and the switches 425 and 426 are turned off, the transistors 91 and 421 do not form a cascade connection, and the transistors 93 and 422 do not form a cascade connection in the current voltage conversion unit 411. As depicted in of FIG. 35A, the configuration is similar to the current voltage conversion unit 81 of FIG. 6.

In the case where the switches 423 and 424 are turned off, and the switches 425 and 426 are turned on, the transistors 91 and 421 form a cascade connection, and the transistors 93 and 422 form a cascade connection in the current voltage conversion unit 411 as depicted in FIG. 35B.

For example, if the transistors 91 and 93 and the transistors 421 and 422 are FETs with the same specifications, the gain of the event detecting unit 401k in the case where the switches 423 and 424 are turned off and the switches 425 and 426 are turned on (FIG. 35B) is adjusted to approximately two times the gain in the case where the switches 423 and 424 are turned on and the switches 425 and 426 are turned off (FIG. 35A).

In this way, the circuit configuration of the current voltage conversion unit 411 is switched between the configuration in which the transistors form a cascade connection (FIG. 35B) and the configuration in which the transistors do not form a cascade connection (configuration of non-cascade connection) (FIG. 35A). The optical filter 221k as a transmission mechanism switches the circuit configuration for each transmitted light, and the gain of the event detecting unit 401k can be adjusted.

Incidentally, although the transistors form a cascade connection with two stages here, the cascade connection of the transistors may include three or more stages.

<Second Configuration Example of Event Detecting Unit $401_k$ That Functions as Gain Adjustment Mechanism 222>

Figure 36:
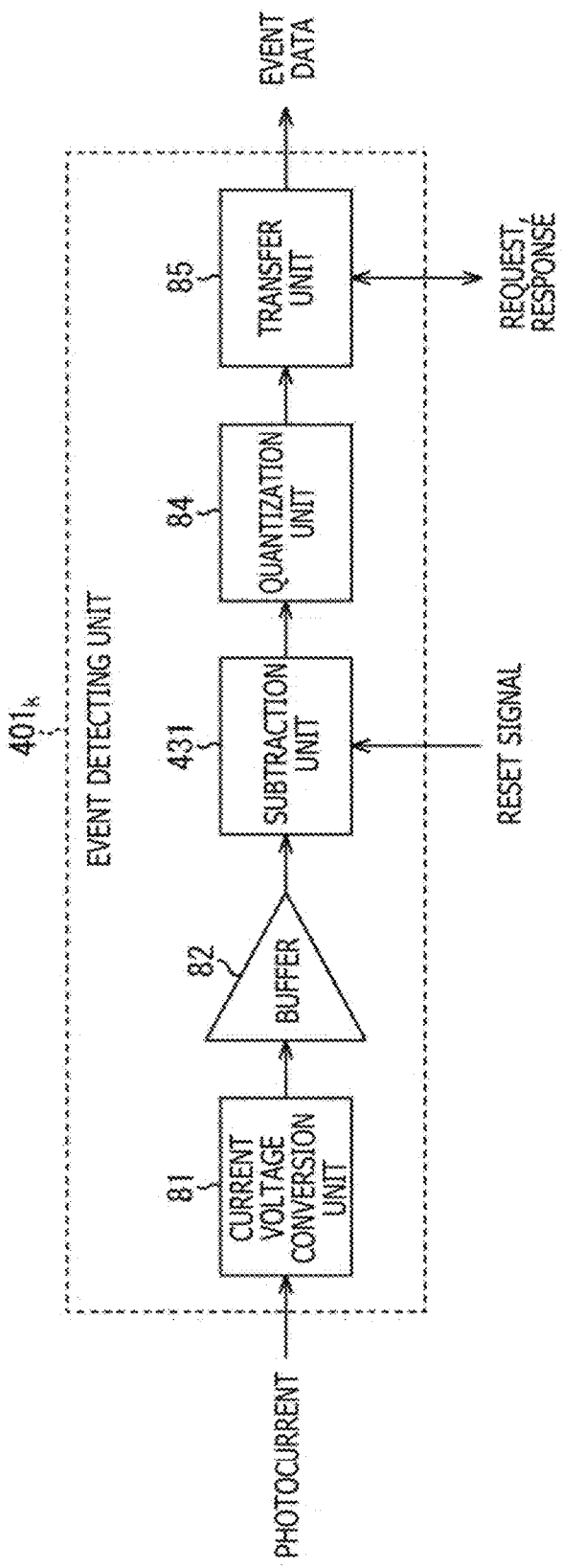
FIG. 36 is a block diagram depicting a second configuration example of the event detecting unit 401$k$ that functions as the gain adjustment mechanism 222.

FIG. 36 is a block diagram depicting a second configuration example of the event detecting unit $401_k$ that functions as the gain adjustment mechanism 222.

Incidentally, in FIG. 36, the same reference signs are provided to the parts corresponding to the event detecting unit 52 of FIG. 5, and the description will be appropriately skipped.

In FIG. 36, the event detecting unit $401_k$ includes the current voltage conversion unit 81, the buffer 82, the quantization unit 84, the transfer unit 85, and a subtraction unit 431.

Therefore, the configuration of the event detecting unit $401_k$ in FIG. 36 is similar to the event detecting unit 52 of FIG. 5 in that the event detecting unit $401_k$ includes the current voltage conversion unit 81, the buffer 82, the quantization unit 84, and the transfer unit 85. However, the event detecting unit $401_k$ is different from the event detecting unit 52 in that the event detecting unit $401_k$ includes the subtraction unit 431 in place of the subtraction unit 83.

Figure 37:
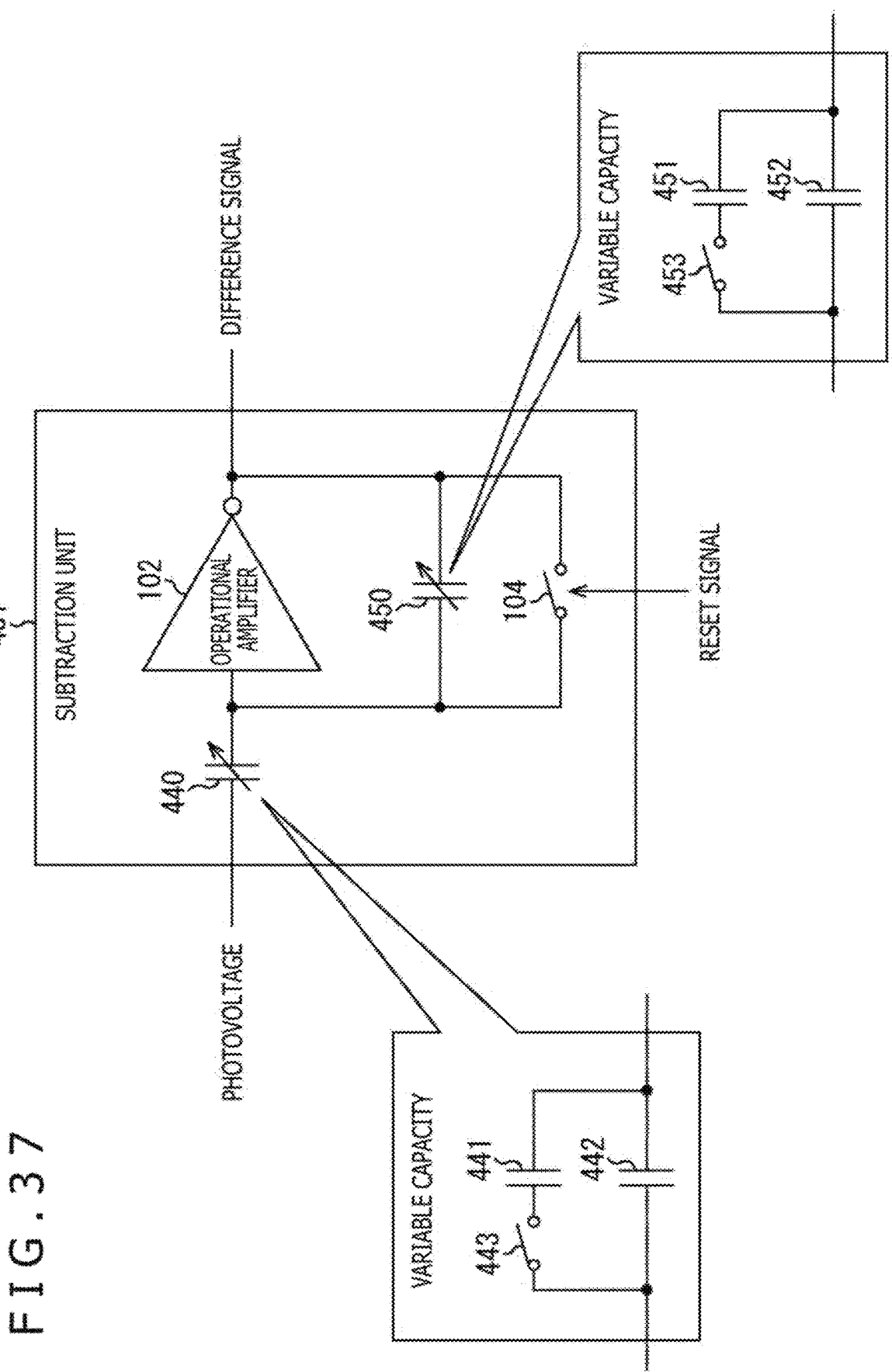
FIG. 37 is a circuit diagram depicting a configuration example of a subtraction unit 431.

FIG. 37 is a circuit diagram depicting a configuration example of the subtraction unit 431 in FIG. 36.

Incidentally, in FIG. 37, the same reference signs are provided to the parts corresponding to FIG. 7, and the description will be appropriately skipped.

The subtraction unit 431 includes the operational amplifier 102, the switch 104, and variable capacities 440 and 450.

Therefore, the subtraction unit 431 is similar to the subtraction unit 83 of FIG. 7 in that the subtraction unit 431 includes the operational amplifier 102 and the switch 104. However, the subtraction unit 431 is different from the subtraction unit 83 in that the subtraction unit 431 includes the variable capacity 440 in place of the capacitor 101 and includes the variable capacity 450 in place of the capacitor 103.

The variable capacity 440 has variable capacitance, and, for example, can include capacitors 441 and 442 and a switch 443.

Assuming that C1 represents the capacitance of the capacitors 441 and 442, the capacitance of the variable capacity 440 is C1 in a case where the switch 443 is turned off, and the capacitance of the variable capacity 440 is 2×C1 in a case where the switch 443 is turned on.

The gain of the event detecting unit $401_k$ in the case where the switch 443 is turned on is adjusted to two times the gain in the case where the switch 443 is turned off.

The variable capacity 450 has variable capacitance, and, for example, can include capacitors 451 and 452 and a switch 453.

Assuming that C2 represents the capacitance of the capacitors 451 and 452, the capacitance of the variable capacity 450 is C2 in a case where the switch 453 is turned off, and the capacitance of the variable capacity 450 is 2×C2 in a case where the switch 453 is turned on.

The gain of the event detecting unit $401_k$ in the case where the switch 453 is turned on is adjusted to ½ times the gain in the case where the switch 453 is turned off.

In the subtraction unit 431, the gain of the event detecting unit $401_k$ can be adjusted based on the capacity ratio of the variable capacity 440 (first capacity) and the variable capacity 450 (second capacity). Therefore, the capacitance of one or both of the variable capacities 440 and 450 can be changed for each light transmitted by the optical filter $221_k$ as a transmission mechanism to thereby adjust the gain of the event detecting unit $401_k$ for each light transmitted by the optical filter $221_k$ as a transmission mechanism.

In this way, the gain of the event detecting unit $401_k$ can be adjusted for each light transmitted by the optical filter $221_k$ (FIG. 12) as a transmission mechanism to thereby flexibly detect the event. That is, for example, the sensor chip 200 can easily detect, as an event, a change in the light or the polarized light of a predetermined color. Further, this can improve the detection rate of the detection target by suppressing the detection of an unintended event (fake event) due to a slight movement of the background or the like or by facilitating the detection of the event caused by a movement of the detection target of a specific color.

Further, in the case where the sensitivity of the pixels 51 varies for each light at different wavelengths, such as light of R, G, and B, the gain of the event detecting unit $401_k$ can be adjusted to detect the events in the same amount of light for the light at each wavelength. As a result, the sensitivity of the pixels 51 receiving the light at each wavelength can be compensated in relation to the detection of the events.

<Pixel Array Unit 211 Capable of Fine Adjustment and Coarse Adjustment of Gain>

Figure 38:
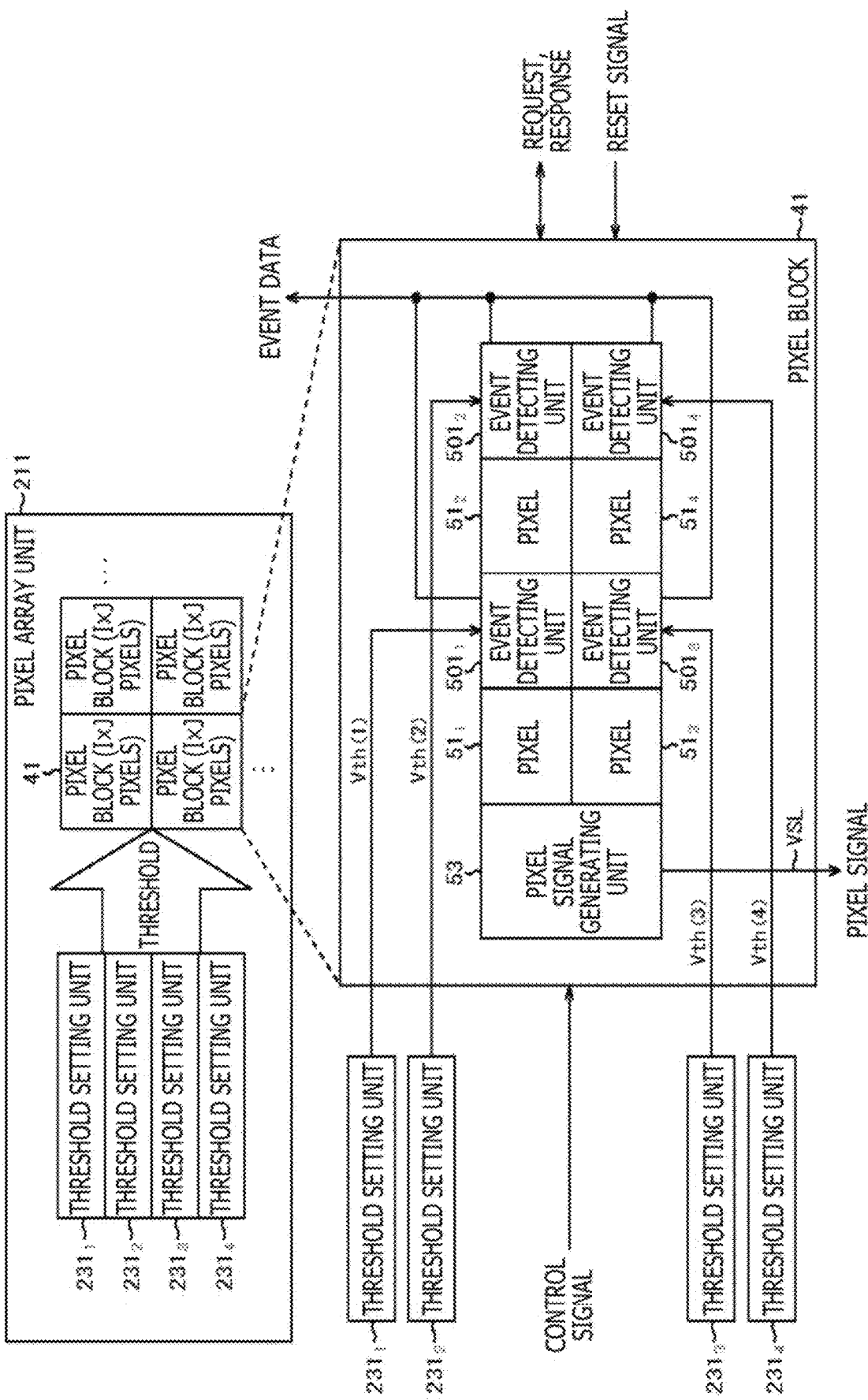
FIG. 38 is a block diagram depicting a configuration example of the pixel array unit 211 capable of fine adjustment and coarse adjustment of the gain.

FIG. 38 is a block diagram depicting a configuration example of the pixel array unit 211 capable of fine adjustment and coarse adjustment of the gain.

Incidentally, in FIG. 38, the same reference signs are provided to the parts corresponding to the case of FIG. 13, and the description will be appropriately skipped.

In FIG. 38, the pixel array unit 211 includes plural pixel blocks 41 and the threshold setting units $231_1$ to $231_4$. The pixel block 41 includes 2×2 pixels $51_1$ to $51_4$, event detecting units $501_1$, $501_2$, $501_3$, and $501_4$ disposed for the pixels $51_k$, respectively, and the pixel signal generating unit 53. In addition, the VSL for connecting the pixel block 41 and the ADC of the AD conversion unit 34 is wired on each column of the pixel blocks 41.

Therefore, the pixel array unit 211 of FIG. 38 is similar to the case of FIG. 13 in that the pixel array unit 211 includes the plural pixel blocks 41 and that the pixel block 41 includes the pixels $51_1$ to $51_4$ and the pixel signal generating unit 53.

However, the pixel array unit 211 of FIG. 38 is different from the case of FIG. 13 in that the pixel block 41 includes the event detecting units $501_k$ in place of the event detecting units $52_k$.

The event detecting units $501_k$ detect the events of the pixels $51_k$ and also function as the gain adjustment mechanism 222, similarly to the event detecting units $52_k$.

In the pixel array unit 211 of FIG. 38, the threshold setting units $231_k$ and the event detecting units $501_k$ function as the gain adjustment mechanism 222. The threshold setting units $231_k$ and the event detecting units $501_k$ as the gain adjustment mechanism 222 can perform a coarse adjustment for coarsely adjusting the gains of the event detecting units $501_k$ and a fine adjustment for finely adjusting the gains of the event detecting units $501_k$. That is, the threshold setting units $231_k$ and the event detecting units $501_k$ as the gain adjustment mechanism 222 can perform a coarse adjustment for adjusting the gains of the event detecting units $501_k$ at a predetermined coarse granularity (granularity coarser than the fine adjustment) and a fine adjustment for adjusting the gains of the event detecting units $501_k$ at a granularity finer than the coarse adjustment.

Figure 39:
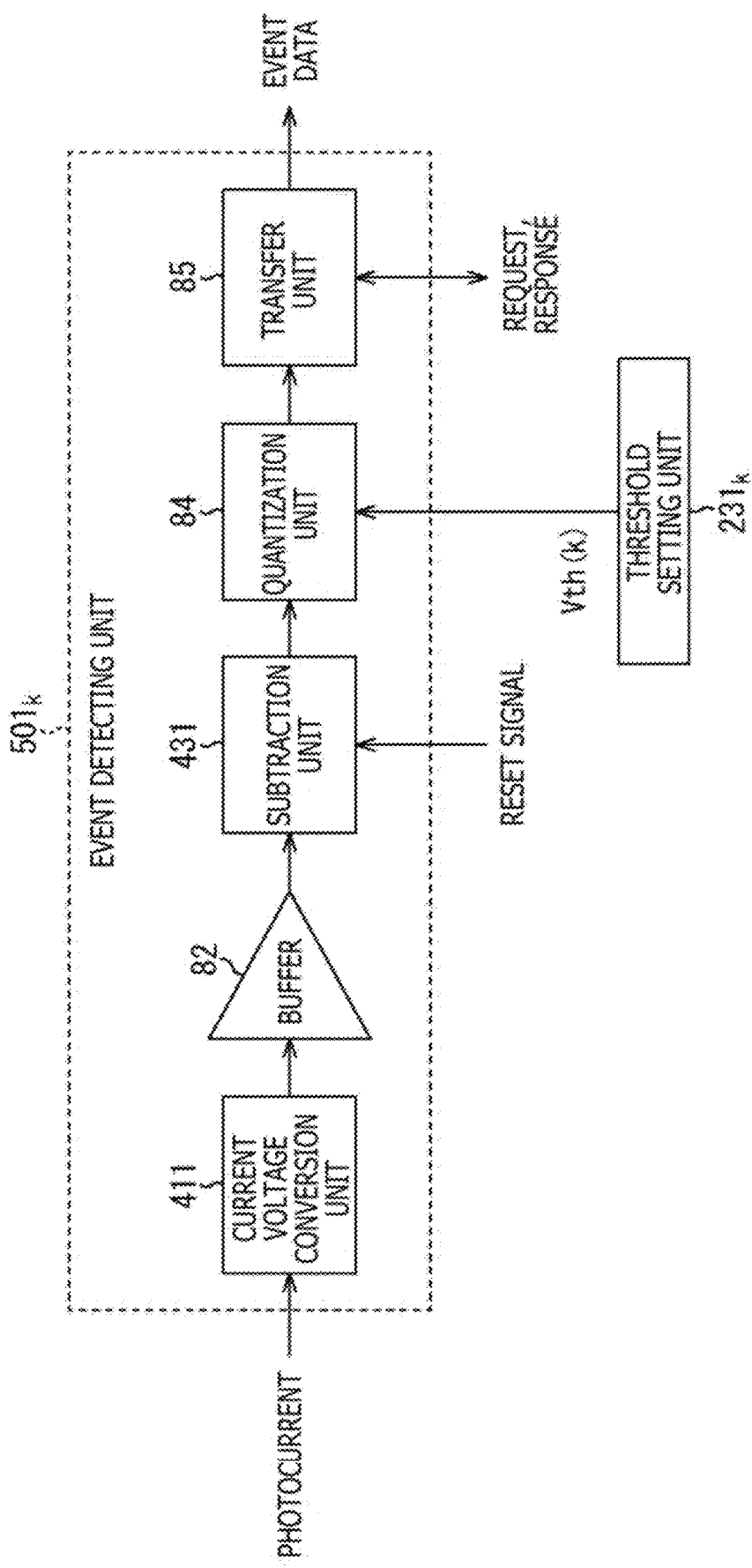
FIG. 39 is a block diagram depicting a configuration example of an event detecting unit 501$_k$.

FIG. 39 is a block diagram depicting a configuration example of the event detecting unit $501_k$ of FIG. 38.

Incidentally, in FIG. 39, the same reference signs are provided to the parts corresponding to the cases of FIGS. 15, 33, and 36, and the description will be appropriately skipped.

In FIG. 39, the event detecting unit $501_k$ includes the buffer 82, the quantization unit 84, the transfer unit 85, the current voltage conversion unit 411, and the subtraction unit 431.

Therefore, the event detecting unit $501_k$ is similar to the case of FIG. 15 in that the event detecting unit $501_k$ includes the buffer 82, the quantization unit 84, and the transfer unit 85. However, the event detecting unit $501_k$ is different from the case of FIG. 15 in that the event detecting unit $501_k$ includes the current voltage conversion unit 411 of FIG. 33 in place of the current voltage conversion unit 81 and includes the subtraction unit 431 of FIG. 36 in place of the subtraction unit 83.

The gain of the event detecting unit $501_k$ for each light transmitted by the optical filter $221_k$ as a transmission mechanism can be adjusted based on one or more of the setting of the event threshold Vth(k) performed by the threshold setting unit $231_k$, the switch of the circuit configuration of the current voltage conversion unit 411, and the change in the capacity ratio of the variable capacity 440 and the capacitor 103 in the subtraction unit 431.

Figure 40:
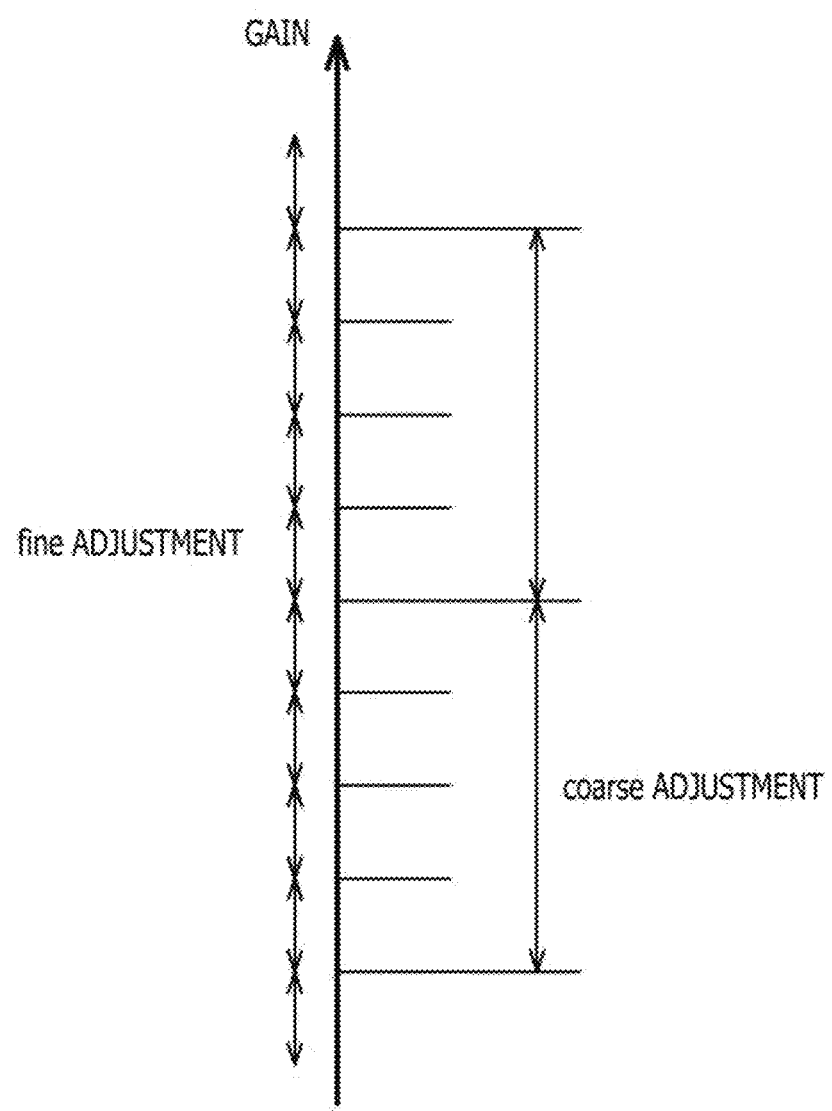
FIG. 40 is a diagram describing fine adjustment and coarse adjustment of the gain of the event detecting unit 501$_k$.

FIG. 40 is a diagram describing the fine adjustment and the coarse adjustment of the gain of the event detecting unit $501_k$.

According to the adjustment of the gain of the current voltage conversion unit 411 performed by switching the circuit configuration of the current voltage conversion unit 411 and according to the adjustment of the gain of the subtraction unit 431 performed by changing the capacity ratio of the variable capacity 440 and the capacitor 103 in the subtraction unit 431, the coarse adjustment for coarsely adjusting the gain of the event detecting unit $501_k$ can be performed.

According to the adjustment of the gain in the quantization unit 84 performed by the threshold setting unit $231_k$ setting the event threshold Vth(k), the fine adjustment for finely adjusting the gain of the event detecting unit $501_k$ can be performed.

One or both the adjustment of the gain of the current voltage conversion unit 411 and the adjustment of the gain of the subtraction unit 431 can be combined with the adjustment of the gain of the quantization unit 84 to adjust the gain of the event detecting unit $501_k$ to thereby finely adjust the gain of the event detecting unit $501_k$ in a wide range.

Figure 41:
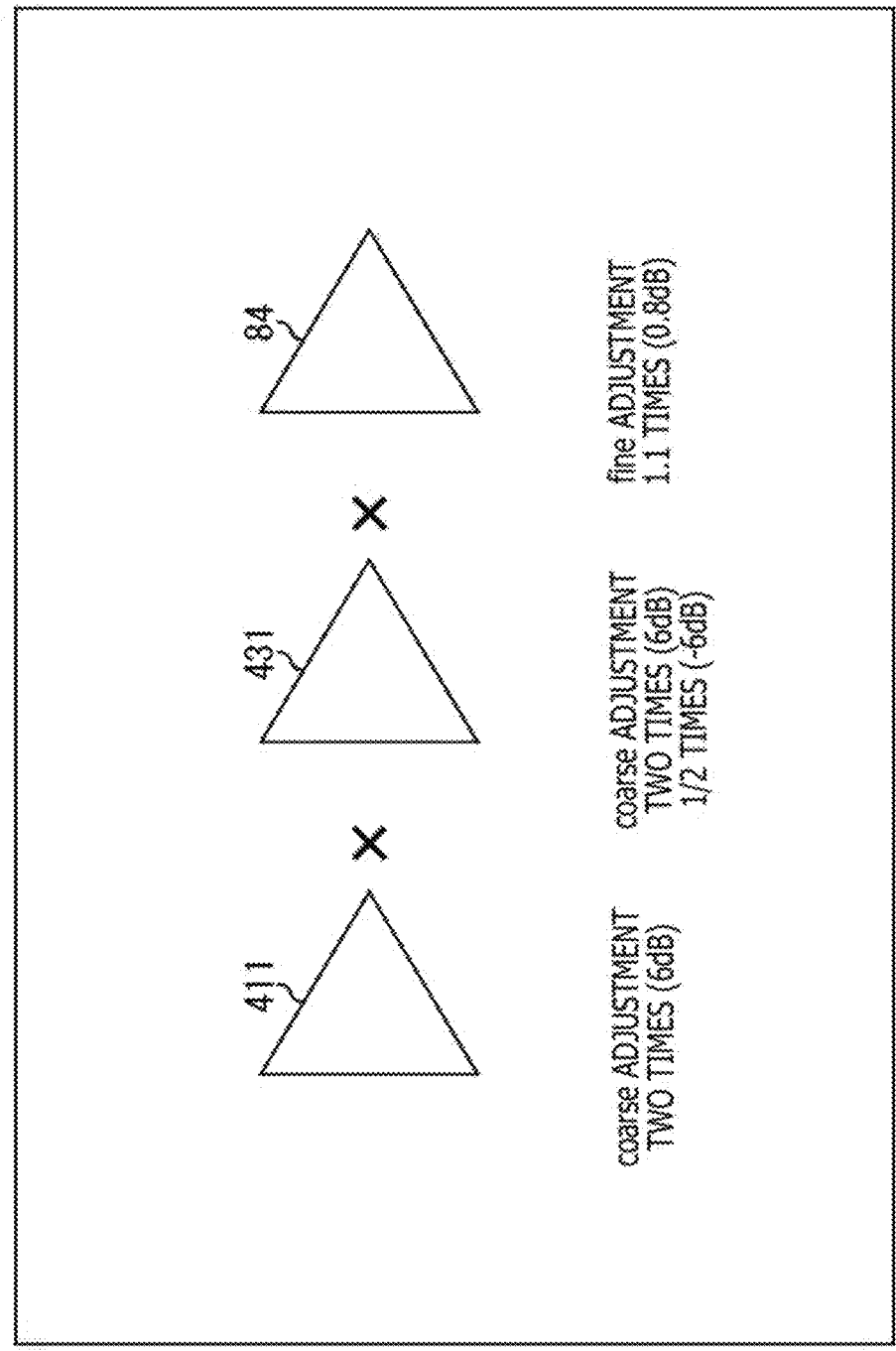
FIG. 41 is a diagram describing an example of the fine adjustment and the coarse adjustment of the gain of the event detecting unit 501$_k$.

FIG. 41 is a diagram describing an example of the fine adjustment and the coarse adjustment of the gain of the event detecting unit $501_k$.

The gain of the event detecting unit $501_k$ can be adjusted by adjusting the gains of one or more blocks of the current voltage conversion unit 411, the subtraction unit 431, and the quantization unit 84.

For example, the gain of the current voltage conversion unit 411 can be adjusted to two times, the gain of the subtraction unit 431 can be adjusted to two times, and the gain of the quantization unit 84 can be adjusted to 1.1 times to thereby adjust the gain of the event detecting unit $501_k$ to 4.4 (=2×2×1.1) times. In addition, for example, the gain of the current voltage conversion unit 411 can be adjusted to two times, the gain of the subtraction unit 431 can be adjusted to ½ times, and the gain of the quantization unit 84 can be adjusted to 1.1 times to thereby adjust the gain of the event detecting unit $501_k$ to 1.1 (=2×1/2×1.1) times.

According to the adjustment of the gains of the current voltage conversion unit 411 and the subtraction unit 431, the coarse adjustment for coarsely adjusting the gain of the event detecting unit $501_k$ can be performed as described in FIG. 40.

The gain of the current voltage conversion unit 411 is determined by the characteristics of the transistors 91 to 93, 421, and 422 (FIG. 34) included in the current voltage conversion unit 411, and therefore, there are process variations. In addition, it is difficult to adjust the gain of the current voltage conversion unit 411 at a high accuracy.

The gain of the subtraction unit 431 is determined by the capacity ratio of the variable capacities 440 and 450 (FIG. 37) and can be adjusted to, for example, two times or ½ times the default gain. The variable capacities 440 and 450 are disposed for each pixel $51_k$, and therefore, the disposition of the variable capacities 440 and 450 to adjust the gain of the subtraction unit 431 at a high accuracy is restricted by the size (area) of the pixel 51.

In the case where, for example, the threshold setting unit 231k includes the DA converter 260 including the current mirror as depicted in FIG. 17B, the gain of the quantization unit 84 can be adjusted at a high precision by adjusting the number of active FETs that apply the current corresponding to the current applied by the current source 262 among the plurality of FETs of the FET 263 as a mirror destination included in the current mirror.

Further, in the case where the gain of the event detecting unit 501$_k$ is adjusted for each light, such as R light, G light, and B light, transmitted by the optical filter 221$_k$ as a transmission mechanism, the threshold setting unit 231$_k$ can be disposed, for example, outside of the pixel 51$_k$. In the case where the threshold setting unit 231$_k$ is disposed outside of the pixel 51$_k$, the restriction on the area is small compared to the case of adjusting the gains of the current voltage conversion unit 411 and the subtraction unit 431.

In a case where the gain of the event detecting unit 501$_k$ is adjusted in a range of, for example, 0.5 to 2.5 times, only the fine adjustment of the gain of the quantization unit 84 may be performed to adjust the gain of the event detecting unit 501$_k$ in the range of 0.5 to 2.5 times, or the fine adjustment of the gain of the quantization unit 84 and the coarse adjustment of the gains of the current voltage conversion unit 411 and the subtraction unit 431 may be combined to adjust the gain of the event detecting unit 501$_k$ in the range of 0.5 to 2.5 times.

However, in the case where the gain of the event detecting unit 501$_k$ is adjusted by the combination of the fine adjustment of the gain of the quantization unit 84 and the coarse adjustment of the gains of the current voltage conversion unit 411 and the subtraction unit 431 instead of only the fine adjustment of the gain of the quantization unit 84, the number of the plurality of FETs in the FET 263 as a mirror destination of the current mirror included in the DA converter 260 in the threshold setting unit 231$_k$ can be smaller compared to the case of adjusting the gain of the event detecting unit 501$_k$ by performing only the fine adjustment of the gain of the quantization unit 84. As a result, the area of the threshold setting unit 231$_k$ (the DA converter 260 included in the threshold setting unit 231$_k$) can be reduced.

Incidentally, the fine adjustment of the gain of the quantization unit 84 can be used to calibrate variations caused by process variations of the gains of the current voltage conversion unit 411 and the subtraction unit 431. For example, if the actual gain of the current voltage conversion unit 411 is 1.8 times due to the process variations in a case where the gain of the current voltage conversion unit 411 is designed to be two times, the gain of the quantization unit 84 can be set to 1.1 times to calibrate the gain to 2 ($\approx$1.8×1.1) times as a whole.

Figure 42:
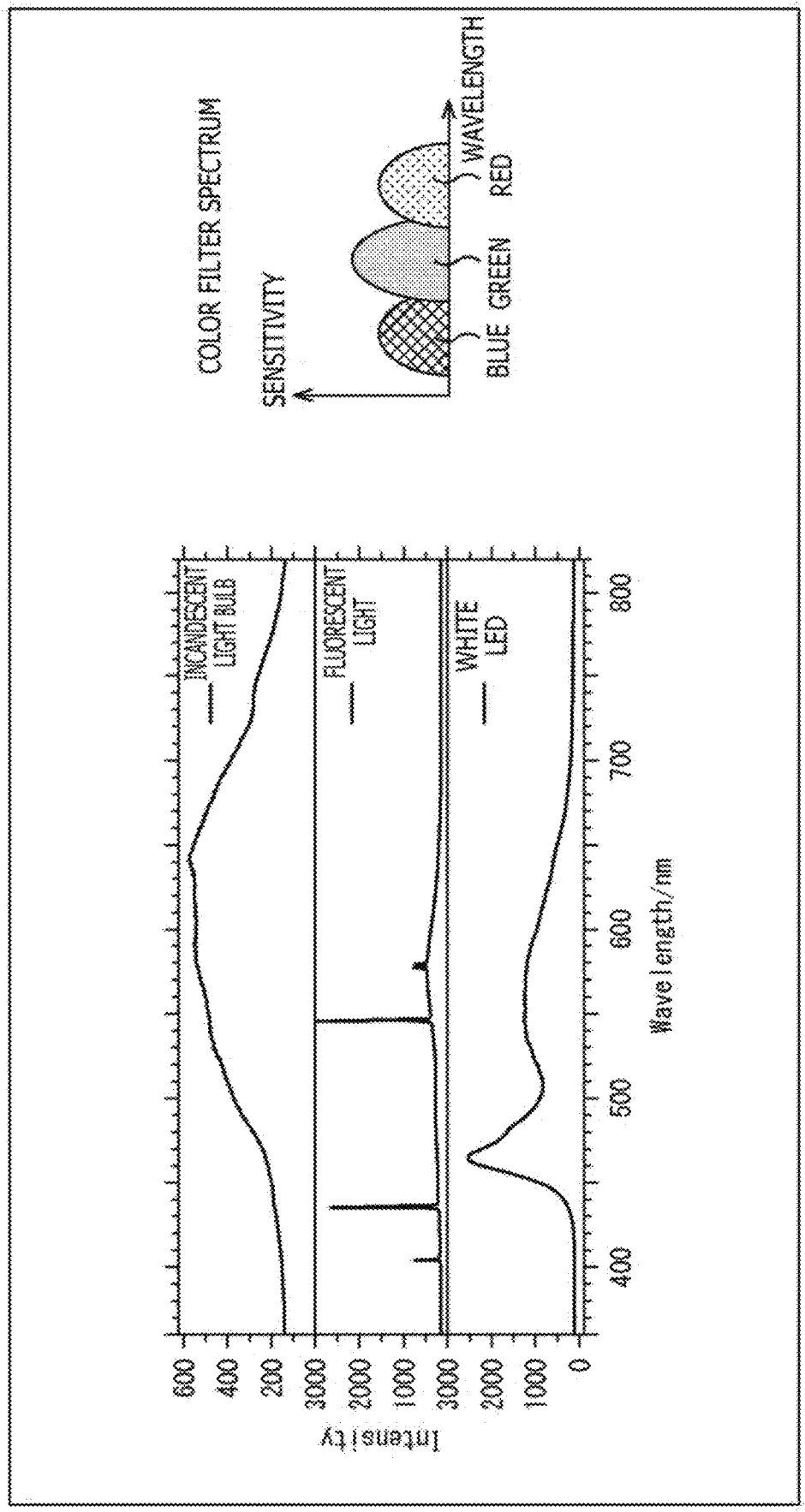
FIG. 42 is a diagram depicting an example of spectra of lighting and spectral characteristics of CFs.

FIG. 42 is a diagram depicting an example of spectra of lighting and spectral characteristics of the CFs 301$_k$.

The spectrum of lighting varies depending on the type of lighting, and the intensity of each wavelength of light emitted by the lighting varies. In addition, assuming that the CFs 301$_k$ (FIG. 19) are adopted as the optical filters 221$_k$, the sensitivity of the pixels 51$_k$ for the R light, the G light, and the B light varies depending on, for example, the spectral characteristics of the CFs 301$_k$.

In a synchronous image sensor, the variations in the intensity of each wavelength of the light emitted by the lighting and the variations in the sensitivity of the pixels 51$_k$ for the R light, the G light, and the B light are adjusted by white balance.

In the sensor chip 200 (FIG. 10) that is an asynchronous sensor, the event detecting units 501$_k$ detect the events of the pixels 51$_k$, respectively, and therefore, the sensitivity of the detection of event varies depending on the sensitivity of the pixel 51$_k$ for the light received by the pixel 51$_k$.

The sensitivity of the pixel 51$_k$ for the light received by the pixel 51$_k$ is represented by the product of the spectrum of the lighting and the spectral characteristics of the CF 301$_k$.

According to the spectra of the lighting and the spectral characteristics of the CFs 301$_k$ in FIG. 42, the sensitivity of the pixel 51$_k$ that receives the R light is higher than the sensitivity of the pixels 51$_k$ that receive the B light and the G light in a case where, for example, an incandescent light bulb illuminates the subject.

Therefore, the adjustment of the white balance in the synchronous image sensor can be applied to the pixels 51$_k$ that receive the R light, the G light, and the B light to adjust the gains of the event detecting units 501$_k$ that detect the events of the pixels 51$_k$ receiving the R light, the G light, and the B light. In this way, even in a case where the lighting is changed, the sensitivity of the pixels 51$_k$ that receive the R light, the G light, and the B light can be adjusted to the same sensitivity.

Figure 43:
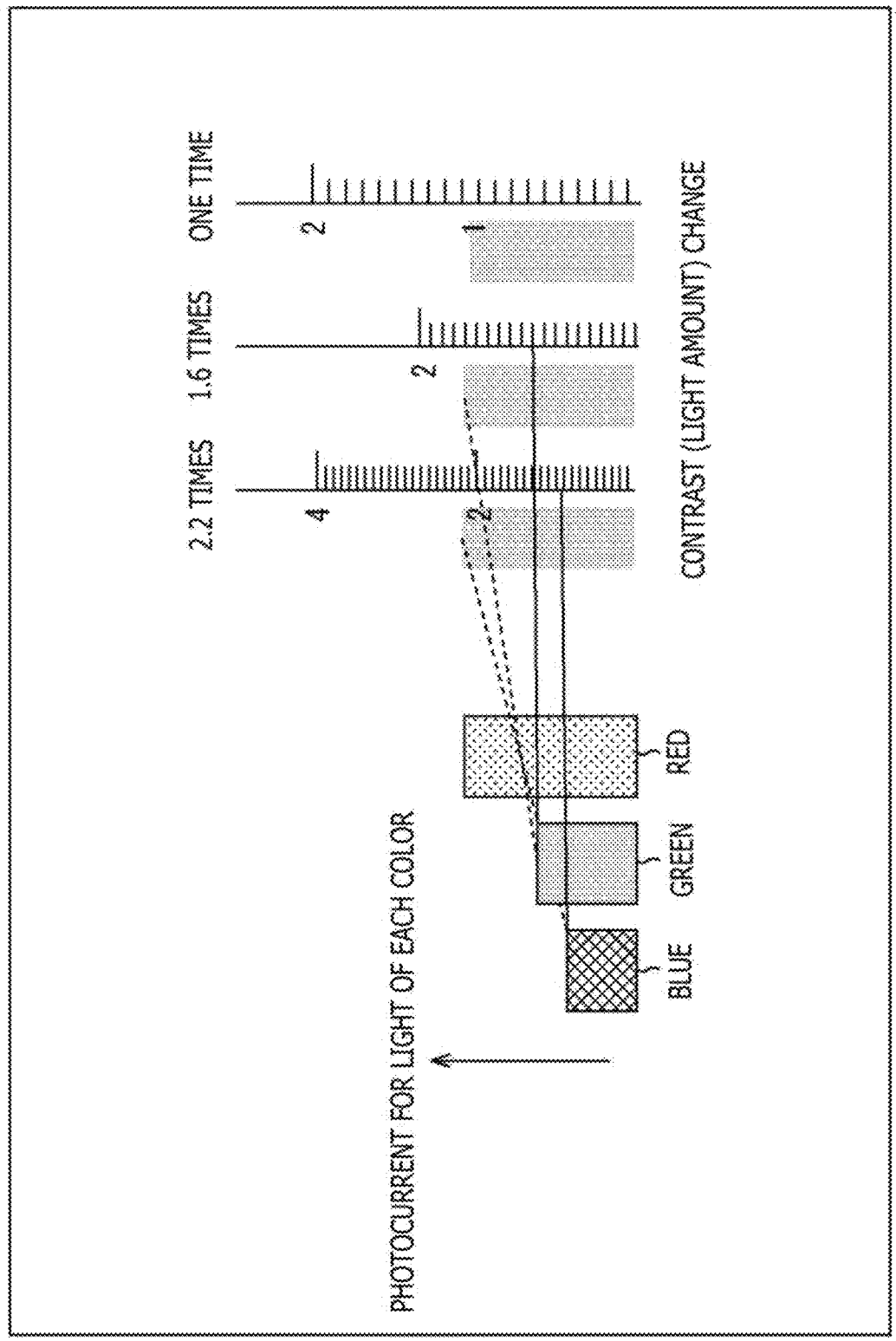
FIG. 43 is a diagram depicting an example of adjustment of sensitivities for R light, G light, and B light.

FIG. 43 is a diagram depicting an example of the adjustment of the sensitivities of the pixels 51$_k$ that receive the R light, the G light, and the B light.

In FIG. 43, assuming that the sensitivity of the pixel 51$_k$ that receives the R light is 1, the sensitivity of the pixel 51$_k$ that receives the B light is 1/2.2, and the sensitivity of the pixel 51$_k$ that receives the G light is 1/1.6.

In this case, for example, while the gain of the event detecting unit 501$_k$ that detects the event of the pixel 51$_k$ receiving the R light is adjusted to one time, the gain of the event detecting unit 501$_k$ that detects the event of the pixel 51$_k$ receiving the B light is adjusted to 2.2 times, and the gain of the event detecting unit 501$_k$ that detects the event of the pixel 51$_k$ receiving the G light is adjusted to 1.6 times. In this way, the sensitivity of the pixels 51$_k$ that receives the R light, the G light, and the B light can be adjusted to the same sensitivity.

Incidentally, the sensor chip 200 may not include the optical filters 221$_k$ (FIG. 12). In this case, the gains of the event detecting units 52$_k$, 401$_k$, and 501$_k$ can be adjusted for each of the pixels 51, instead of each light received by the pixels 51$_k$ and transmitted by the optical filters 221$_k$.

For example, in a case of detecting a predetermined subject, the gains of the event detecting units 52$_k$, 401$_k$, and 501$_k$ can be adjusted to increase the sensitivity of the pixels 51 that receive the light from the position of the subject when the position can be predicted.

In addition, the adjustment of the gains of the event detecting units 52$_k$, 401$_k$, and 501$_k$ can be used to compensate the sensitivity variations of the on-chip lenses disposed on the pixels 51.

<Application to Mobile Body>

The technology according to the present disclosure (present technology) can be applied to various products. For example, the technology according to the present disclosure may be realized as an apparatus mounted on any type of mobile body, such as a car, an electric car, a hybrid electric car, a motorcycle, a bicycle, a personal mobility, an airplane, a drone, a ship, and a robot.

Figure 44:
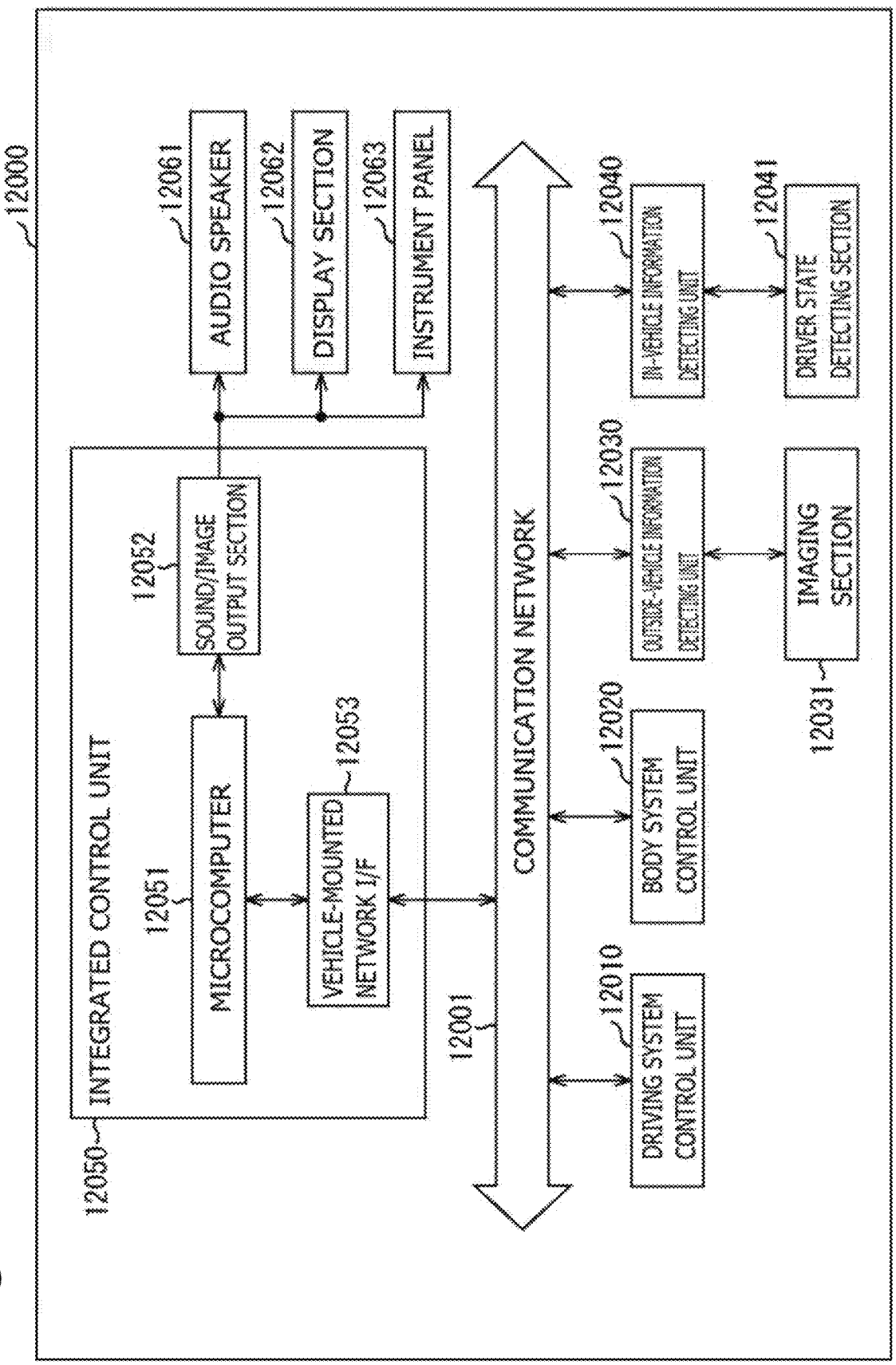
FIG. 44 is a block diagram depicting an example of schematic configuration of a vehicle control system.

FIG. 44 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 44, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 44, an audio speaker 12061, a display section 12062, and an instrument panel 12063 are illustrated as the output device. The display section 12062 may, for example, include at least one of an on-board display and a head-up display.

Figure 45:
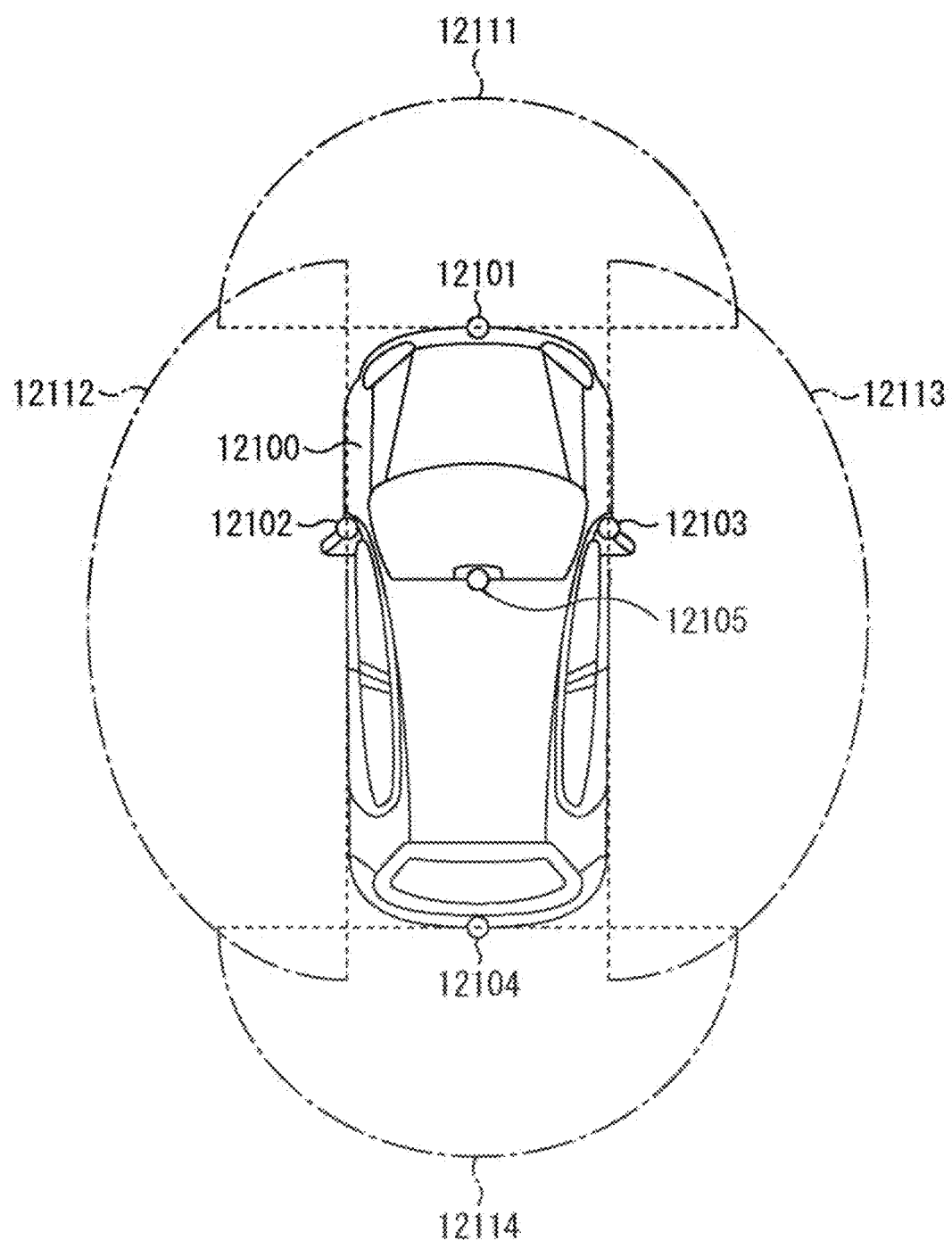
FIG. 45 is a diagram of assistance in explaining an example of installation positions of an outside-vehicle information detecting section and an imaging section.

FIG. 45 is a diagram depicting an example of the installation position of the imaging section 12031.

In FIG. 45, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 45 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described. The technology according to the present disclosure can be applied to, for example, the imaging section 12031 among the components described above. Specifically, the sensor chip 200 of FIG. 10 can be applied to the imaging section 12031. By applying the technology according to the present disclosure to the imaging section 12031, the events can be flexibly detected, and the data processing of the event data obtained by detecting the events can assist driving appropriately.

Incidentally, the embodiment of the present technology is not limited to the embodiment described above, and various changes can be made without departing from the scope of the present technology.

In addition, the advantageous effects described in the present specification are illustrative only, and the advantageous effects are not limited. There may also be other advantageous effects.

Incidentally, the present technology can be configured as follows.

<1>

A sensor including:
pixels that receive light and that perform photoelectric conversion to generate electric signals;
an event detecting unit that detects an event that is a change in the electric signals of the pixels; and
a gain adjustment mechanism that adjusts, for each of the pixels, a gain of the event detecting unit.

<2>

The sensor according to <1>, further including:
a transmission mechanism that passes predetermined light, in which
the pixels receive the predetermined light passing through the transmission mechanism, and
the gain adjustment mechanism adjusts, for each type of the predetermined light transmitted by the transmission mechanism, the gain of the event detecting unit.

<3>

The sensor according to <2>, in which
the gain adjustment mechanism includes a threshold setting unit that sets, for each type of the predetermined light received by the pixels, a threshold used to detect the event.

<4>

The sensor according to <3>, in which
the transmission mechanism includes color filters.

<5>

The sensor according to <4>, in which
the threshold setting unit sets the threshold for each color of the light received by the pixels and transmitted by the color filters.

<6>

The sensor according to <3>, in which
the transmission mechanism includes polarizing filters.

<7>

The sensor according to <6>, in which the threshold setting unit sets the threshold for each polarization direction of the light received by the pixels and transmitted by the polarizing filters.

<8>
The sensor according to <1> or <2>, in which
the event detecting unit
includes a current voltage conversion unit that converts a photocurrent of the pixels into a voltage corresponding to the photocurrent and
detects, as the event, a change in the voltage exceeding a predetermined threshold, and
the gain adjustment mechanism includes the current voltage conversion unit that is capable of switching a circuit configuration between a configuration in which transistors form a cascade connection and a configuration in which the transistors do not form the cascade connection.

<9>
The sensor according to <1> or <2>, in which
the event detecting unit includes a subtraction unit that includes a first capacity and a second capacity and that determines a difference signal corresponding to a difference between voltages at different timings of a voltage corresponding to a photocurrent of the pixels, and
the gain adjustment mechanism includes the subtraction unit that is capable of changing a capacity ratio of the first capacity and the second capacity.

<10>
The sensor according to <1> or <2>, in which
the gain adjustment mechanism performs a coarse adjustment for coarsely adjusting the gain of the event detecting unit and a fine adjustment for finely adjusting the gain of the event detecting unit.

<11>
The sensor according to <10>, in which
the event detecting unit includes
a current voltage conversion unit that converts a photocurrent of the pixels into a voltage corresponding to the photocurrent, and
a subtraction unit that includes a first capacity and a second capacity and that determines a difference signal corresponding to a difference between voltages at different timings, and
the event detecting unit compares the difference signal and a threshold to detect the event, and
the gain adjustment mechanism includes
one or both the current voltage conversion unit that is capable of switching a circuit configuration between a configuration in which transistors form a cascade connection and a configuration in which the transistors do not form the cascade connection and the subtraction unit that is capable of changing a capacity ratio of the first capacity and the second capacity, and
a threshold setting unit that sets the threshold, the gain adjustment mechanism performs the coarse adjustment based on one or both the switch of the circuit configuration of the current voltage conversion unit and the change in the capacity ratio in the subtraction unit, and
the gain adjustment mechanism performs the fine adjustment based on the setting of the threshold performed by the threshold setting unit.

<12>
The sensor according to any one of <2> to <11>, in which
the transmission mechanism includes color filters, and
the gain adjustment mechanism adjusts, for each color of light received by the pixels and transmitted by the color filters, the gain of the event detecting unit according to an environment for imaging a subject.

<13>
The sensor according to any one of <1> to <12>, further including:
a pixel signal generating unit that generates, as a pixel signal, a signal of a voltage corresponding to a photocurrent of the pixels in which the event is detected.

<14>
A control method including:
a step of adjusting, for each of pixels, a gain of an event detecting unit of a sensor, the sensor including
the pixels that receive light and that perform photoelectric conversion to generate electric signals, and
the event detecting unit that detects an event that is a change in the electric signals of the pixels.

REFERENCE SIGNS LIST

10: Sensor chip
11: Sensor die
12: Logic die
21: Sensor unit
22: Logic unit
31: Pixel array unit
32: Driving unit
33: Arbiter
34: AD conversion unit
35: Output unit
41: Pixel block
51, $51_1$ to $51_4$: Pixel
52, $52_1$ to $52_4$: Event detecting unit
53: Pixel signal generating unit
60: Node
61: Photoelectric conversion element
62, 63: Transfer transistor
71: Reset transistor
72: Amplification transistor
73: Selection transistor
74: FD
81: Current voltage conversion unit
82: Buffer
83: Subtraction unit
84: Quantization unit
85: Transfer unit
91 to 93: Transistor
101: Capacitor
102: Operational amplifier
103: Capacitor
104: Switch
111, 112: Comparator
200: Sensor chip
201: Sensor unit
211: Pixel array unit
$221_1$ to $221_4$: Optical filter
222: Gain adjustment mechanism
$231_1$ to $231_4$: Threshold setting unit
250: DA converter
251: Ladder circuit
252: Operational amplifier
260: D/A converter
261: FET 262: Current source
263: FET
264: Resistor
$301_1$ to $301_4$: CF
$331_1$ to $331_4$: Polarizing filter
371, 372: FET
$401_1$ to $401_4$: Event detecting unit
411: Current voltage conversion unit
421, 422: Transistor
423 to 426: Switch
431: Subtraction unit
441, 442: Capacitor
443: Switch
$501_1$ to $501_4$: Event detecting unit

The invention claimed is:

1. A sensor, comprising:
pixels configured to:
  receive light; and
  perform photoelectric conversion based on the received light to generate electric signals; and
circuitry configured to:
  detect an event that is a change in the electric signals of the pixels, wherein the electric signals correspond to a photocurrent of the pixels;
  convert the photocurrent of the pixels into a voltage corresponding to the photocurrent;
  detect, as the event, a change in the voltage that exceeds a specific threshold;
  adjust, for each of the pixels, a gain of the event; and
  switch, based on the adjustment of the gain of the event, a circuit configuration between a first configuration in which transistors form a cascade connection and a second configuration in which the transistors do not form the cascade connection.

2. The sensor according to claim 1, further comprising:
optical filters configured to pass specific light, wherein
  the pixels are further configured to receive the specific light that passes through the optical filters, and
  the circuitry is further configured to adjust, for each type of the specific light transmitted by the optical filters, the gain of the event.

3. The sensor according to claim 2, wherein the circuitry is further configured to set, for each type of the specific light received by the pixels, the specific threshold for the detection of the event.

4. The sensor according to claim 3, wherein the optical filters include color filters.

5. The sensor according to claim 4, wherein the circuitry is further configured to set the specific threshold for each color of the specific light received by the pixels and transmitted by the color filters.

6. The sensor according to claim 3, wherein the optical filters include polarizing filters.

7. The sensor according to claim 6, wherein the circuitry is further configured to set the specific threshold for each polarization direction of the specific light received by the pixels and transmitted by the polarizing filters.

8. The sensor according to claim 1, wherein the circuitry is further configured to:
include a first capacity and a second capacity;
determine a difference signal corresponding to a difference between voltages at different timings of the voltage corresponding to the photocurrent of the pixels; and
change a capacity ratio of the first capacity and the second capacity based on the determined difference signal.

9. The sensor according to claim 1, wherein the circuitry is further configured to perform a coarse adjustment to coarsely adjust the gain of the event and a fine adjustment to finely adjust the gain of the event.

10. The sensor according to claim 9, wherein the circuitry is further configured to:
include a first capacity and a second capacity;
determine a difference signal corresponding to a difference between voltages at different timings of the voltage corresponding to the photocurrent of the pixels;
compare the difference signal and the specific threshold to detect the event;
change a capacity ratio of the first capacity and the second capacity;
set the specific threshold;
perform the coarse adjustment based on one or both the switch of the circuit configuration and the change in the capacity ratio; and
perform the fine adjustment based on the set specific threshold.

11. The sensor according to claim 2, wherein
the optical filters include color filters, and
the circuitry is further configured to
adjust, for each color of the specific light received by the pixels and transmitted by the color filters, the gain of the event based on an environment for imaging a subject.

12. The sensor according to claim 1, wherein the circuitry is further configured to generate, as a pixel signal, a signal of the voltage corresponding to the photocurrent of the pixels in which the event is detected.

13. A control method, comprising:
adjusting, for each of pixels, a gain of an event of a sensor, the sensor including:
  the pixels that:
    receive light, and
    perform photoelectric conversion based on the received light to generate electric signals;
detecting the event that is a change in the electric signals of the pixels, wherein the electric signals correspond to a photocurrent of the pixels;
converting the photocurrent of the pixels into a voltage corresponding to the photocurrent;
detecting, as the event, a change in the voltage that exceeds a specific threshold; and
switching, based on the adjustment of the gain of the event, a circuit configuration between a first configuration in which transistors form a cascade connection and a second configuration in which the transistors do not form the cascade connection.

* * * * *